United States Patent
Eastty

(10) Patent No.: US 9,203,366 B2
(45) Date of Patent: Dec. 1, 2015

(54) AUDIO PROCESSING

(75) Inventor: Peter Charles Eastty, Stonesfield (GB)

(73) Assignee: OXFORD DIGITAL LIMITED, Oxfordshire (GB)

( * ) Notice: Subject to any disclaimer, the term of this patent is extended or adjusted under 35 U.S.C. 154(b) by 914 days.

(21) Appl. No.: 12/921,869

(22) PCT Filed: Mar. 10, 2009

(86) PCT No.: PCT/GB2009/000652
§ 371 (c)(1),
(2), (4) Date: Oct. 13, 2010

(87) PCT Pub. No.: WO2009/112825
PCT Pub. Date: Sep. 17, 2009

(65) Prior Publication Data
US 2011/0096933 A1 Apr. 28, 2011

(30) Foreign Application Priority Data
Mar. 11, 2008 (GB) .................................. 0804557.7

(51) Int. Cl.
*H03G 5/00* (2006.01)
*H03G 3/00* (2006.01)
*H03H 17/02* (2006.01)

(52) U.S. Cl.
CPC ................. *H03G 3/00* (2013.01); *H03G 5/005* (2013.01); *H03H 17/0294* (2013.01)

(58) Field of Classification Search
CPC ......... H03M 7/00; H03G 5/165; H03G 5/005; H03G 5/025; H03G 7/001; H03G 9/005; H03G 9/025; H03G 9/18; H03G 3/20; H03G 3/00; H03G 3/3005; H04R 3/04; H04R 1/005; H04R 2460/05; H04R 25/505; H04R 29/001; H04R 2410/05; H04R 2430/03; H04R 5/04; G10K 2210/1081; G10K 2210/3028; G10K 2210/3027; G10K 11/178; G10K 2210/108; G10K 2210/3013; G10K 11/175; G10K 11/1788; G10L 21/0208; G10L 21/0232; G10L 2021/02082; G10L 21/02; G10L 21/0205; H03H 17/0201; H03H 17/0294; H03H 17/04; H03H 21/0012; H03H 17/0671; H03H 17/0685
USPC ........... 381/61, 62, 317, 320, 321, 71.1, 71.9, 381/71.11, 71.12, 71.13, 71.14, 93, 94.1, 381/94.3, 94.4, 94.8, 98, 99, 100, 101, 102, 381/103, 120; 84/661, 699, 736; 341/50; 708/303, 305, 308, 309, 311, 313, 314, 708/317, 320, 322, 323, 172, 300, 318; 700/94
See application file for complete search history.

(56) References Cited

U.S. PATENT DOCUMENTS

| | | | |
|---|---|---|---|
| 5,357,208 A | 10/1994 | Nelson | |
| 5,739,691 A * | 4/1998 | Hoenninger, III | 324/322 |
| 7,390,960 B1 | 6/2008 | Arnold | |
| 2003/0063763 A1 | 4/2003 | Allred et al. | |
| 2005/0248474 A1 * | 11/2005 | Wiser et al. | 341/50 |
| 2007/0025559 A1 | 2/2007 | Mihelich et al. | |
| 2007/0253577 A1 * | 11/2007 | Yen et al. | 381/103 |
| 2008/0240448 A1 * | 10/2008 | Gustafsson et al. | 381/17 |

FOREIGN PATENT DOCUMENTS

| | | |
|---|---|---|
| EP | 0196413 | 10/1986 |
| GB | 1212671 | 11/1970 |
| GB | 2364189 | 1/2002 |
| JP | 9130207 | 5/1997 |
| JP | 10321221 | 4/1998 |
| WO | 2004054099 | 6/2004 |

OTHER PUBLICATIONS

Martin Holters, etc., "Parametric Higher-Order Shelving Filters", 14th European Signal Processing Conference, Florence, Italy, Sep. 4-8, 2006.*
Martin Holters, etc., "Graphic Equalizer Design Using Higher-Order Recursive Filters", Proc. of the 9th International Conference on Digital Audio Effects, Montreal, Canada, Sep. 18-20, 2006.*
Keiler et al, "Parametric Second- and Fourth-Order Shelving Filters for Audio Applications", 2004 IEEE 6th Workshop on Multimedia Signal Processing, p. 231-234.*

Fernandez-Vazquez, et al. "A New Method for Designing Flat Shelving and Peaking Filters Based on Alpass Filters", IEEE, 17th International Conference on Electronics, Communications and Computers, 2007, 7 pages.

Fernandez-Vazquez, et al. "On the Design of High Order Digital Audio Equalizers", Proceeding of 2007 International on Intelligent Signal Processing and Communication System, 2007, pp. 28-31.

Holters et al. "Parametric Recursive Higher-Order Shelving Filters", Audio Engineering Society, Convention Paper 6722, May 20-23, 2006, Paris France, 6 pages.

McGrath, et al. "Raised Cosine Equalization Utilizing Log Scale Filter Synthesis", Audio Engineering Society, Convention Paper 6257, Oct. 28-31, 2004, San Francisco, 16 pages; and.

Holters et al. "Parametric Recursive Higher-Order Shelving Filters", 2 pages.

Examination Report issued in co-pending Application No. GB0804557.7 dated Feb. 17, 2012.

\* cited by examiner

*Primary Examiner* — Leshui Zhang
(74) *Attorney, Agent, or Firm* — Antonio Papageorgiou, Esq.; Meister Seeing & Fein LLP

(57) ABSTRACT

A method of generating a desired shelving filter for audio data, the desired shelving filter having a low-corner frequency U and a high-corner frequency $f_2$, wherein the difference between the gain of the frequency response of the desired shelving filter at $f_2$ and the gain of the frequency response of the desired shelving filter at U is substantially equal to a non-zero desired amount, the method comprising: determining an order for a first shelving filter of a first predetermined type, wherein the low-corner frequency of the first shelving filter is U and the high-corner frequency of the first shelving filter is f$\Sigma$, determining, for a second shelving filter of a second predetermined type and of a predetermined order m, a frequency fz for the low-corner frequency of the second shelving filter and a frequency $Z_4$ for the high-corner frequency of the second shelving filter, where h is at least fi, $f_4$ is greater than $f_3$, and $f_4$ is at most fi, and forming the desired shelving filter as a filter combination of the first shelving filter and the second shelving filter; wherein fz, $f_4$ and the order of the first shelving filter are determined such that difference between the gain of the frequency response of the filter combination at fe and the gain of the frequency response of the filter combination at fi is substantially equal to the desired amount.

11 Claims, 19 Drawing Sheets

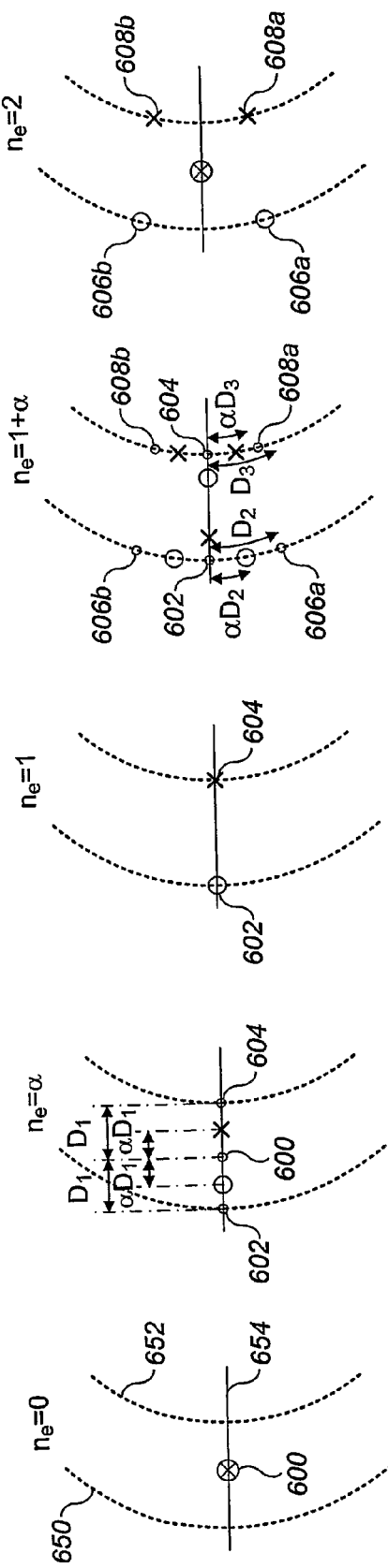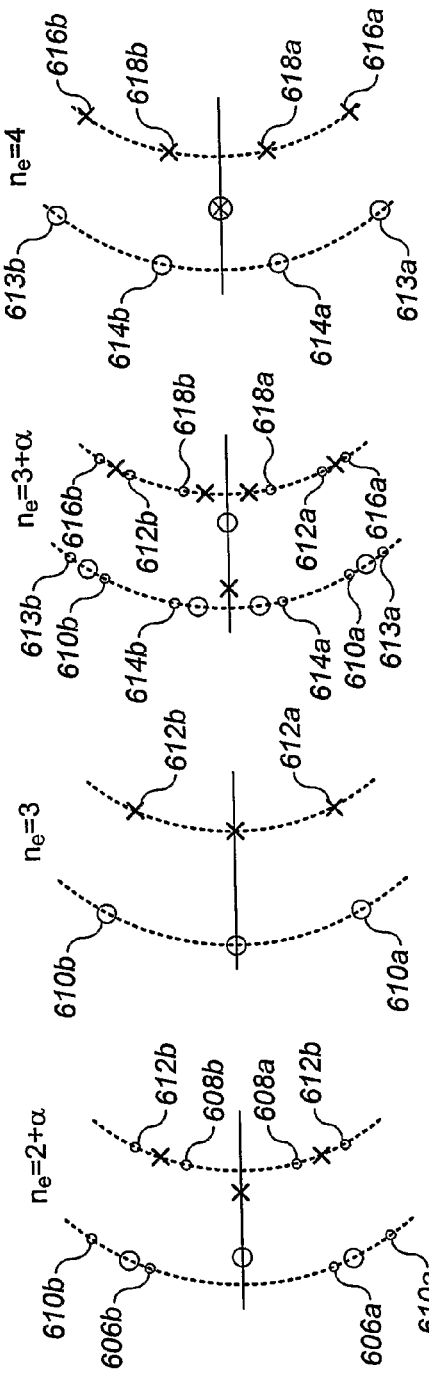

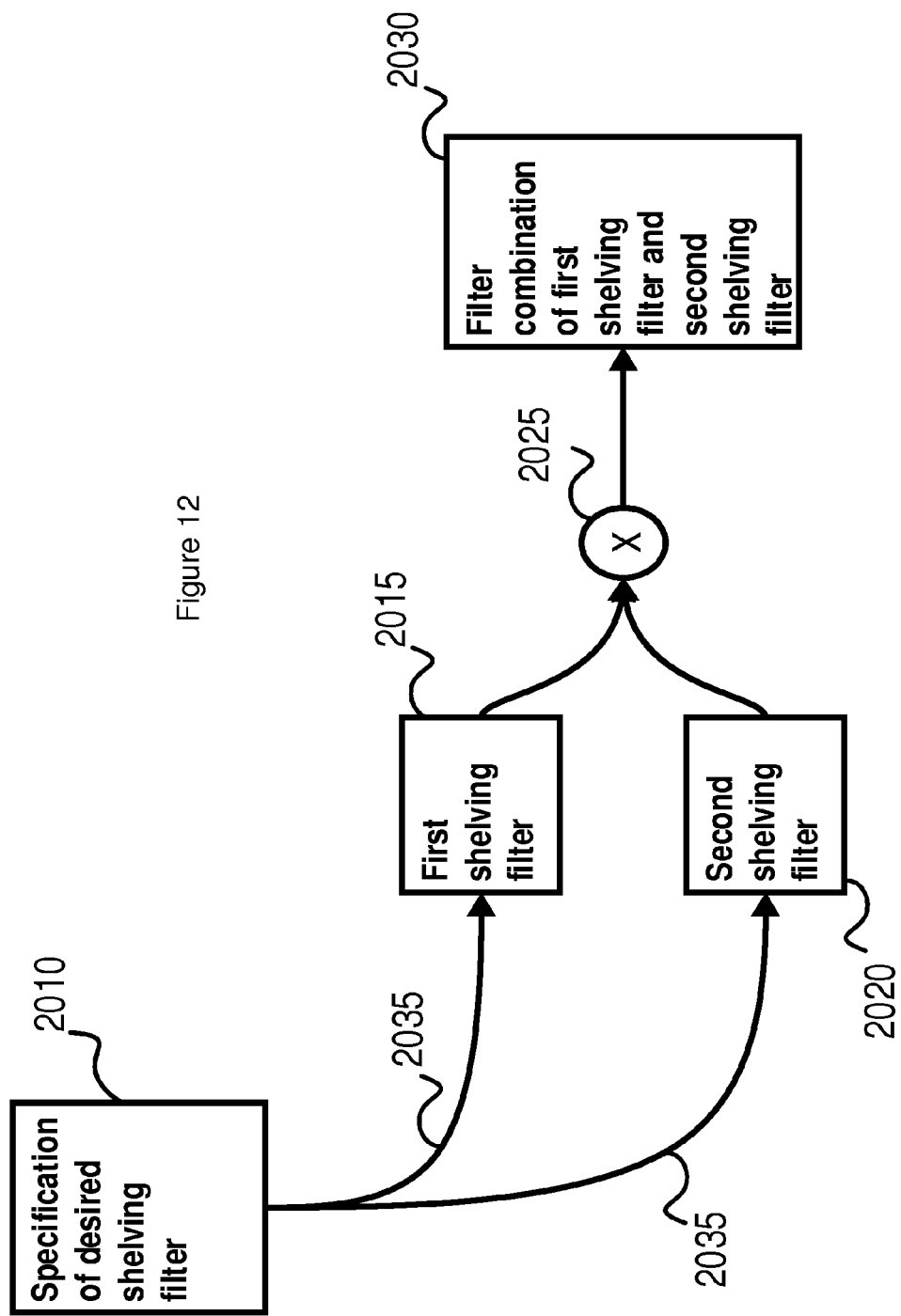

AUDIO PROCESSING

FIELD OF THE INVENTION

The present invention relates to audio processing and methods and apparatus for audio processing.

BACKGROUND OF THE INVENTION

Equalization of audio data is well known. Audio equalizers generally fall into one of three categories: (a) tone controls; (b) parametric equalizers; and (c) graphic equalizers. These categories are well-known and are therefore discussed only briefly below.

Tone controls use very small amounts of processing to raise or lower the audio frequency response that results from processing by a device. The increase or decrease of the frequency response is usually limited to two, or sometimes three, very broad bands of frequencies that are typically referred to as "Bass", "Mid" and "Treble". Tone controls are generally provided to allow an individual listener to control, with basic adjustments, the frequency response of the device to match their personal preference.

Parametric equalizers use a small amount of processing to generate effects such as simple bumps, dips, shelves, and high and low cut filters to modify sounds, often during audio recording and mixing. These individual audio effects (or modifications to the frequency response of the audio processing) are generally controllable by a number of continuously variable "parameters" (hence the name, "parametric equalizer"). For example, a bump effect is likely to be controllable by the following parameters: (i) gain, i.e. the amount of increase or decrease in frequency response; (ii) centre frequency, i.e. the frequency at which the magnitude of the increase or decrease in frequency response due to the bump is to be largest; and (iii) bandwidth (also known as 'Q', which is inversely proportional to bandwidth), i.e. the range of frequencies to be affected by the bump. Due to their low number of parameters, parametric equalizers can generally be quickly operated to achieve a desired effect on a particular audio source. However, parametric equalizers are generally not effective at achieving gentle audio effects across the whole audio band (or spectrum), nor are they effective at achieving a detailed but essentially arbitrary audio effect for room- or loudspeaker-correction.

Graphic (or graphical) equalizers use more processing than the above-mentioned tone controls and parametric equalizers. Graphic equalizers effectively divide the audio spectrum into a plurality (normally 31 or 61) of nominally independent, exponentially spaced, predetermined frequency bands. A gain control is then provided for each of these frequency bands. When the gains for these bands are controlled by vertical faders and these faders are arranged left to right in an increasing order of the frequencies they control, then the visual impression given is that the positions of the faders plot the frequency response produced by the graphic equalizer. Graphic equalizers are most frequently used to correct for problems in the final acoustic delivery of sound, such as problems in the loudspeaker, the room or both.

Graphic equalizers suffer from a number of problems that are mainly caused by the inevitable interaction between adjacent frequency bands. For example, if several adjacent faders are used to raise or lower the frequency response over a range of frequencies, then the resulting frequency response change is much greater than that actually indicated by the fader positions. This leads to excess effect over and above that intended by the user operating the faders. Furthermore, when several adjacent faders are used together in this way, the individual frequency bands do not combine smoothly to create a flat (either raised or lowered) frequency response. Instead, an unintended and subjectively annoying frequency response ripple is produced across these frequency bands. This makes it difficult to use a graphic equalizer to correct a room that presents problems over a broad range of frequencies.

Additionally (and at the opposite extreme to the above problems) it is difficult to correct or adjust the frequency response for a narrow band of frequencies using a graphic equalizer, since the individual filters which make up the graphic equalizer are at predetermined frequencies. These fixed frequencies cannot therefore be changed to the specific frequencies that the user wishes to correct.

Furthermore, due to the significantly increased amount of processing inherent to graphic equalizers when compared to tone controls and parametric equalizers (due to the combination of the outputs of a large number of filters), the phase response of a graphic equalizer is normally much more disruptive than is actually desirable.

It would therefore be desirable to provide improved audio equalization and filtering that addresses these problems.

SUMMARY OF THE INVENTION

According to a first aspect of the invention, there is provided a method of generating a desired shelving filter for audio data, the desired shelving filter having a low-corner frequency $f_1$ and a high-corner frequency $f_2$, wherein the difference between the gain of the frequency response of the desired shelving filter at $f_2$ and the gain of the frequency response of the desired shelving filter at $f_1$ is substantially equal to a non-zero desired amount, the method comprising: determining an order for a first shelving filter of a first predetermined type, wherein the low-corner frequency of the first shelving filter is $f_1$ and the high-corner frequency of the first shelving filter is $f_2$; determining, for a second shelving filter of a second predetermined type and of a predetermined order m, a frequency $f_3$ for the low-corner frequency of the second shelving filter and a frequency $f_4$ for the high-corner frequency of the second shelving filter, where $f_3$ is at least $f_1$, $f_4$ is greater than $f_3$, and $f_4$ is at most $f_2$; and forming the desired shelving filter as a filter combination of the first shelving filter and the second shelving filter; wherein $f_3$, $f_4$ and the order of the first shelving filter are determined such that difference between the gain of the frequency response of the filter combination at $f_2$ and the gain of the frequency response of the filter combination at $f_1$ is substantially equal to the desired amount.

This method allows a shelving filter with an arbitrary low-corner frequency and an arbitrary high-corner frequency, with an arbitrary difference in frequency response gain between the low- and high-corner frequencies to be specified and generated. This, in turn, will be a useful filter for generating an arbitrary desired frequency response, for example by combining several such shelving filters.

Some embodiments of the invention set m to be 1. This allows for a simpler implementation and a more straight-lined frequency response curve between the low- and high-corner frequencies.

In an embodiment of the invention, determining the order of the first shelving filter comprises determining the greatest order for the first shelving filter for which the magnitude of the desired amount is greater than the magnitude of the difference between the gain of the frequency response of the first shelving filter at $f_2$ and the gain of the frequency response of the first shelving filter at $f_1$. In an alternative embodiment of the invention, determining the order of the first shelving filter comprises determining the least order for the first shelving filter for which the magnitude of the desired amount is less than the magnitude of the difference between the gain of the frequency response of the first shelving filter at $f_2$ and the gain of the frequency response of the first shelving filter at $f_1$. These embodiments help ensure that a suitable second shelving filter can be determined.

In embodiments of the invention, if the desired amount is positive, then the first shelving filter is arranged such that the gain of the frequency response of the first shelving filter at $f_2$ is greater than the gain of the frequency response of the first shelving filter at $f_1$; and if the desired amount is negative, then the first shelving filter is arranged such that the gain of the frequency response of the first shelving filter at $f_2$ is less than the gain of the frequency response of the first shelving filter at $f_1$.

In an embodiment of the invention, determining $f_3$ and $f_4$ comprises: setting $f_3$ and $f_4$ relative to each other such that the difference between the gain of the frequency response of the second shelving filter at $f_4$ and the gain of the frequency response of the second shelving filter at $f_3$ is substantially equal to the difference between the desired amount and the difference between the gain of the frequency response of the first shelving filter at $f_2$ and the gain of the frequency response of the first shelving filter at $f_1$. This helps ensure that the desired shelving filter is generated when the first and the second shelving filters are combined to form the desired shelving filter.

To help avoid corner-effects ("wobbles" and unwanted curves) at and around the low- and high-corner frequencies, some embodiments of the invention set $f_3$ and $f_4$ so that the range of frequencies from $f_3$ to $f_4$ is substantially centred in the range of frequencies from $f_1$ to $f_2$. In particular, $f_3$ and $f_4$ may be set so that $f_4+f_3=f_2+f_1$ or $f_4 f_3 = f_2 f_1$.

In an embodiment in which m=1, if the desired amount is positive then: each zero of the transfer function of the first shelving filter is located at a respective location determined by interpolating between (a) the location of a corresponding pole of the transfer function of a first low-pass filter of a type corresponding to the first predetermined type and having a cut-off frequency of $f_1$ and an order of n−1 and (b) the location of a corresponding pole of the transfer function of a second low-pass filter of that corresponding type and having a cut-off frequency of $f_1$ and an order of n; and each pole of the transfer function of the first shelving filter is located at a respective location determined by interpolating between (c) the location of a corresponding pole of the transfer function of a third low-pass filter of that corresponding type and having a cut-off frequency of $f_2$ and an order of n−1 and (d) the location of a corresponding pole of the transfer function for a fourth low-pass filter of that corresponding type and having a cut-off frequency of $f_2$ and an order of n. A shelving filter formed in this manner is particularly useful when it is desired to be able to transition from one shelving filter into another shelving filter.

In an embodiment in which m=1, if the desired amount is negative then: each pole of the transfer function of the first shelving filter is located at a respective location determined by interpolating between (a) the location of a corresponding pole of the transfer function of a first low-pass filter of a type corresponding to the first predetermined type and having a cut-off frequency of $f_1$ and an order of n−1 and (b) the location of a corresponding pole of the transfer function of a second low-pass filter of that corresponding type and having a cut-off frequency of $f_1$ and an order of n; and each zero of the transfer function of the first shelving filter is located at a respective location determined by interpolating between (c) the location of a corresponding pole of the transfer function of a third low-pass filter of that corresponding type and having a cut-off frequency of $f_2$ and an order of n−1 and (d) the location of a corresponding pole of the transfer function for a fourth low-pass filter of that corresponding type and having a cut-off frequency of $f_2$ and an order of n.

In some embodiments of the invention, a user may specify $f_1$, $f_2$ and the desired amount, thereby making the shelving filter fully configurable by the user.

In some embodiments of the invention, the first predetermined type and the second predetermined type are each filter types based on properties of a respective one of: Butterworth low-pass filters; Chebychev low-pass filters; and elliptical low-pass filters. These properties may include the positions of zeros and poles of transfer functions for low-pass filters of the corresponding filter type. The first predetermined type may be the same as the second predetermined type.

According to a second aspect of the invention, there is provided a method of generating a desired filter for audio data, the method comprising: specifying a plurality of frequency response indicators to define a desired frequency response for the desired filter, each frequency response indicator specifying a user-defined frequency and a corresponding user-defined gain for the desired frequency response at that frequency; and determining a set of one or more filters such that, for each of the frequency response indicators, the gain of the frequency response of a combination of the one or more filters in the set of filters at the frequency specified by that frequency response indicator is substantially equal to the gain specified by that frequency response indicator.

With such a method, a very flexible audio equalizer can be generated according to a user's specific requirements. In particular, the user is not limited to predefined frequency bands as in the traditional graphics equalizer, nor is the user limited to the number of such frequency bands as some embodiments allow the number of frequency response indicators to be user-defined.

Some embodiments of the invention comprise the user defining one or more of the plurality of frequency response indicators.

In an embodiment of the invention, determining the set of one or more filters comprises: for each pair of adjacent frequency response indicators, generating a corresponding shelving filter, wherein a frequency response indicator specifying a frequency $f_A$ and another frequency response indicator specifying a frequency $f_B$ greater than $f_A$ are adjacent if none of the plurality of frequency response indicators specifies a frequency between $f_A$ and $f_B$.

In particular, the method may comprise: for each frequency response indicator, maintaining a corresponding target gain; in which, for a pair of adjacent frequency response indicators comprising a first frequency response indicator specifying a frequency $f_A$ and an adjacent second frequency response indicator specifying a frequency $f_B$ greater than $f_A$, the step of generating a shelving filter comprises carrying out a method according to the above first aspect of the invention, in which: $f_1$ is based on $f_A$; $f_2$ is based on $f_B$; and the desired amount is set to be the difference between the target gain corresponding to the second frequency response indicator and the target gain corresponding to the first frequency response indicator. This may involve initialising each target gain to the gain specified by the corresponding frequency response indicator.

In such embodiments, the method may comprise, for a pair of adjacent frequency response indicators comprising a first frequency response indicator and an adjacent second frequency response indicator: before generating the shelving filter corresponding to that pair of adjacent frequency response indicators, determining whether the order of that shelving filter will exceed a predetermined maximum threshold and, if so, adjusting one or both of the target gain corresponding to the first frequency response indicator and the target, gain corresponding to the second frequency response indicator to reduce the order of that shelving filter. This helps ensure that the order of the shelving filters that are generated are not too large, thereby avoiding excessive power consumption, hardware usage, processing time and delay.

In some of these embodiments, for a pair of adjacent frequency response indicators comprising a first frequency response indicator specifying a frequency $f_A$ and an adjacent second frequency response indicator specifying a frequency $f_B$ greater than $f_A$, the step of carrying out a method according to the first aspect of the invention to generate the shelving filter corresponding to that pair of adjacent frequency response indicators comprises setting $f_1$ equal to $f_A$ and setting $f_2$ equal to $f_B$.

Alternatively, in some of these embodiments, the method comprises: for each pair of adjacent frequency response indicators, maintaining a corresponding frequency-proportion value; and, for a pair of adjacent frequency response indicators comprising a first frequency response indicator specifying a frequency $f_A$ and an adjacent second frequency response indicator specifying a frequency $f_B$ greater than $f_A$, the step of carrying out a method according to the above first aspect of the invention to generate the shelving filter corresponding to that pair of adjacent frequency response indicators comprises determining $f_1$ and $f_2$ based on $f_A$, $f_B$ and the corresponding frequency-proportion value. In particular, $f_1$ and $f_2$ may be determined so that $f_2-f_1=h(f_B-f_A)$ or $f_2/f_1=(f_B/f_A)^h$, where h is the frequency-proportion value corresponding to that pair of adjacent frequency response indicators.

Then, the range from $f_1$ to $f_2$ may be substantially centred relative to the range from $f_A$ to $f_B$, for example, $f_1$ and $f_2$ may be determined so that $f_2+f_1=f_B+f_A$ or $f_2f_1=f_Af_B$.

Some embodiments of the invention may comprise, for a pair of adjacent frequency response indicators comprising a first frequency response indicator and an adjacent second frequency response indicator: before generating the shelving filter corresponding to that pair of adjacent frequency response indicators, determining whether the order of that shelving filter will exceed a predetermined maximum threshold and, if so, increasing the frequency-proportion value corresponding to that pair of adjacent frequency response indicators to reduce the order of that shelving filter. Some of these embodiments may be arranged such that the frequency-proportion value may not be increased above a predetermined maximum frequency-proportion value.

Each frequency proportion value may be initialised to a corresponding initialisation value, which is preferably in the range from about ⅓ to about ½.

Some embodiments of the invention may then comprise: after generating the set of one or more filters, performing one or more iterations, wherein an iteration comprises: adjusting one or more of the target gains; and repeating the step of generating using the adjusted target gains to update the set of one or more filters; wherein the step of adjusting comprises adjusting one or more of the target gains so that an error between the desired frequency response and the frequency response of a combination of the one or more filters in the updated set of filters is less than an error between the desired frequency response and the frequency response of a combination of the one or more filters in the set of filters prior being updated.

Such an embodiment may involve performing at most a predetermined maximum number of iterations. This ensures that the desired filter is generated within a limited period of time, which is particularly useful for real-time audio processing applications.

Each of these iterations may comprise determining an error between the desired frequency response and the frequency response of a combination of the one or more filters in the set of filters, wherein the step of performing one or more iterations is terminated if the determined error is less than a predetermined error threshold. Again, this ensures that the desired filter is generated within a limited period of time (in this case, when the generated set of filters has a frequency response sufficiently close to the desired frequency response) which is particularly useful for real-time audio processing applications. Determining an error may comprise: for each of the frequency response indicators, determining the difference between the gain of the desired frequency response and the gain of the frequency response of the combination of the one or more filters in the set of filters at the frequency specified by that frequency response indicator; and determining the error based on the determined differences.

In some embodiments of the invention, adjusting a target gain corresponding to a frequency response indicator comprises subtracting, from that target gain, the difference between the gain of the frequency response of the combination of the filters in the set of filters at the frequency specified by that frequency response indicator and the gain specified by that frequency response indicator.

Some embodiments of the invention comprise: a user specifying a gain scale factor; and for each of the frequency response indicators, scaling the gain specified by that frequency response indicator by the specified gain scale factor. This provides the user with a mechanism for easily controlling the overall intensity of the desired frequency response that the user has specified via the frequency response indicators.

According to a third aspect of the invention, there is provided a method of implementing an audio filter, in which the transfer function of the audio filter comprises 2s complex-valued zeros and 2s complex-valued poles, the method comprising: forming s second-order-filter-sections, such that, for each integer i in the range $1 \le i \le s$, the i-th second-order-filter-section is based on: (a) the complex-valued zero of the transfer function of the audio filter that, together with the associated complex conjugate zero, is the i-th closest pair of complex-valued zero and associated complex conjugate zero of the transfer function of the audio filter to the unit circle; and (b) the complex-valued pole of the transfer function of the audio filter that, together with the associated complex conjugate pole, is the i-th closest pair of complex-valued pole and associated complex conjugate pole of the transfer function of the audio filter to the unit circle.

According to a fourth aspect of the invention, there is provided a method of changing from filtering audio data with a first audio filter to filtering the audio data with a second audio filter, in which the transfer function of the first audio filter comprises 2s complex-valued zeros and 2s complex-valued poles, and in which the transfer function of the second audio filter comprises 2t complex-valued zeros and 2t complex-valued poles, the method comprising: forming the first filter using second-order-filter-sections, in which, for each integer i in the range $1 \le i \le s$, the i-th second-order-filter-section is based on (a) the complex-valued zero of the transfer function of the first audio filter that, together with the associated complex conjugate zero, is the i-th closest pair of complex-valued zero and associated complex conjugate zero of the transfer function of the first audio filter to the unit circle; and (b) the complex-valued pole of the transfer function of the first audio filter that, together with the associated complex conjugate pole, is the i-th closest pair of complex-valued pole and associated complex conjugate pole of the transfer function of the first audio filter to the unit circle; forming the second filter using t second-order-filter-sections, in which, for each integer j in the range 1≤j≤t, the j-th second-order-filter-section is based on (c) the complex-valued zero of the transfer function of the second audio filter that, together with the associated complex conjugate zero, is the j-th closest pair of complex-valued zero and associated complex conjugate zero of the transfer function of the second audio filter to the unit circle; and (d) the complex-valued pole of the transfer function of the second audio filter that, together with the associated complex conjugate pole, is the j-th closest pair of complex-valued pole and associated complex conjugate pole of the transfer function of the second audio filter to the unit circle; and for each integer k in the range 1≤k≤minimum(s,t), setting the value of a state variable for the k-th second-order-filter-section of the second audio filter to be the value of a corresponding state-variable for the k-th second-order-filter-section of the first audio filter.

The use of audio filters formed according to the third aspect of the invention allows the method of the fourth aspect of the invention to be used. Such an arrangement for transitioning from one filter to another helps minimize the amount of audio noise that may be introduced during the transitional phase between the filters.

In one embodiment of the invention, if t is greater than s, then the method comprises, for each integer r in the range s+1≤r≤t: initialising the state variables for the r-th second-order-filter section of the second audio filter to the value 0; providing audio input to the r-th second-order-filter section of the second audio filter for a predetermined period of time after beginning to change from filtering the audio data with the first audio filter to filtering the audio data with the second audio filter; and after the predetermined period of time, starting to use the r-th second-order-filter section of the second audio filter to filter the audio data.

According to a fifth aspect of the invention, there is provided a method of processing audio data, the method comprising: filtering the audio data by applying a first desired filter to the audio data, the first desired filter being a filter generated by a method according to the above-mentioned methods for generating a desired filter. This may comprise changing the filtering of the audio data from applying the first desired filter to the audio data to applying a second desired filter to the audio data, the second desired filter being a filter generated by a method according to the above-mentioned methods for generating a filter.

When the first and second desired filters are generated by a method based on specifying frequency response indicators, the method may comprise: specifying a plurality of frequency response indicators to generate the first desired filter; updating the plurality of frequency response indicators; and generating the second desired filter based on the updated plurality of frequency response indicators.

In some embodiments of the invention, the step of changing comprises carrying out a method according the above-mentioned fourth aspect of the invention for changing from filtering audio data with a first audio filter to filtering the audio data with a second audio filter.

According to a sixth aspect of the invention, there is provided a method of configuring a processor for processing audio data, the method comprising: generating a desired filter for the audio data by carrying out a method according to any one of the above-mentioned methods of generating a filter; and configuring the processor to process the audio data using the generated filter.

According to a seventh aspect of the invention, there is provided an apparatus for generating a desired audio filter, the apparatus comprising a processor arranged to generate a desired filter for audio data by carrying out a method according to any one of the above-mentioned methods of generating a filter.

According to an eighth aspect of the invention, there is provided an apparatus for processing audio data, the apparatus comprising: a processor arranged to process audio data by carrying out one of the above-mentioned methods for processing audio data; and means for supplying audio data to the processor for processing. This processor may be arranged to generate a desired filter for processing the audio data by carrying out any of the above-mentioned methods for generating a desired filter.

According to a ninth aspect of the invention, there is provided an audio filter generated by any one of the above-mentioned methods for generating a desired audio filter.

According to a tenth aspect of the invention, there is provided a computer program which, when executed by a computer, carries out a method according to any one of the above-mentioned methods. The computer program may be carried on a data carrying medium, which may be a storage medium or a transmission medium.

BRIEF DESCRIPTION OF THE DRAWINGS

Embodiments of the invention will now be described, by way of example only, with reference to the accompanying drawings, in which:

FIGS. 6a-6i are z-plane pole-zero diagrams for example shelving filters generated according to an embodiment of the invention;

FIG. 12 schematically illustrates a method of generating a desired shelving filter for audio data.

DETAILED DESCRIPTION OF EMBODIMENTS OF THE INVENTION

In the description that follows and in the figures, certain embodiments of the invention are described. However, it will be appreciated that the invention is not limited to the embodiments that are described and that some embodiments may not include all of the features that are described below. It will be evident, however, that various modifications and changes may be made herein without departing from the broader scope of the invention as set forth in the appended claims.

FIG. 12 schematically illustrates a method of generating a desired shelving filter 2010 for audio data. The desired shelving filter 2010 has a low-corner frequency $f_1$ and a high-corner frequency $f_2$. The difference between the gain of the frequency response of the desired shelving filter at $f_2$ and the gain of the frequency response of the desired shelving filter at $f_1$ is substantially equal to a non-zero desired amount.

An order for a first shelving filter 2015 of a first predetermined type is determined 2035. The low-corner frequency of the first shelving filter is $f_1$ and the high-corner frequency of the first shelving filter is $f_2$.

A frequency $f_3$ for the low-corner frequency of a second shelving filter 2020 of a second predetermined type and of a predetermined order m is determined 2035. A frequency $f_4$ for the high-corner frequency of the second shelving filter is determined 2035 where $f_3$ is at least $f_1$, $f_4$ is greater than $f_3$ and $f_4$ is at most $f_2$.

The desired shelving filter 2010 is formed 2025 as a filter combination 2030 of the first shelving filter 2015 and the second shelving filter 2020. Here, $f_3$, $f_4$ and the order of the first shelving filter 2015 are determined 2035 such that difference between the gain of the frequency response of the filter combination 2030 at $f_2$ and the gain of the frequency response of the filter combination 2030 at $f_1$ is substantiall egual to the desired amount.

(1) System Overview

Figure 1:
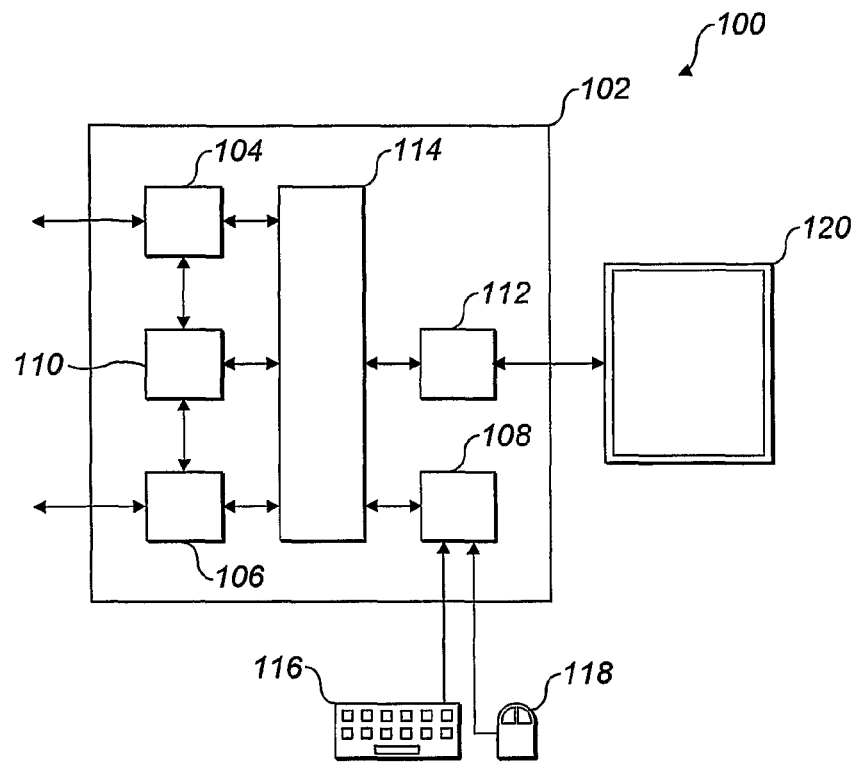
FIG. 1 schematically illustrates a system according to an embodiment of the invention.

FIG. 1 schematically illustrates a system 100 according to an embodiment of the invention. The system 100 comprises a device 102 that itself comprises an audio interface 104, a data interface 106, a user input interface 108, a memory 110, a graphical interface 112 and a processor 114. The device 102 may be any type of device for carrying out audio processing. For example, the device 102 may be a standard personal computer. Alternatively, the device 102 may be a dedicated audio processing apparatus.

The processor 114 is arranged to carry out a method according to an embodiment of the invention (such methods being described in more detail later). To achieve this, the processor 114 may comprise a hardware device, such as one or more field-programmable-gate-arrays (FPGAs) and/or application-specific-integrated-circuits (ASICs) that have been produced and configured specifically for carrying out such a method. The processor 114 may be a digital-signal-processor (DSP) chip that has been configured specifically for carrying out a method according to an embodiment of the invention.

Alternatively, to carry out a method according to an embodiment of the invention, the processor 114 may be a more general purpose processor that is capable of executing a computer program that itself comprises program instructions for performing such a method. The computer program may be a specific self-contained executable application for carrying out an embodiment of the invention. Alternatively, the computer program may be configured as a plug-in (such as a dynamic-link-library, or DLL) for a more general purpose audio processing software application, with the plug-in adding functionality according to an embodiment of the invention to that general purpose audio processing software application. Methods for generating and using plug-ins are well-known.

The memory 110 may be any type of memory for storing data used by the processor 114 when carrying out an embodiment of the invention. In some embodiments, the memory 110 forms part of the processor 114 itself. The memory 110 may be a read-only-memory, with the processor 114 then being configured to be able to read data from the memory 110 but not to write data to the memory 110. Alternatively, the memory 110 may be a random-access-memory, with the processor 114 being configured to be able to both read data from and write data to the memory 110.

The memory 110 may store the whole or part of a computer program that comprises program instructions for carrying out a method according to an embodiment of the invention, with the processor 114 then being arranged to read and execute this computer program to carry out an embodiment of the invention. The memory 110 may store configuration data (for example information regarding a desired frequency response for an audio filter, as described later). The memory 110 may store audio data to be processed (filtered or equalized) by the processor 114. The processor 114 may also use the memory 110 to store the output of its processing (such as filter coefficients for filters that it has generated or audio data that it has processed) and/or intermediate data and results from its processing.

The data interface 106 may be any interface through which the processor 114 may receive and/or output/transmit data. For example, the data interface 106 may comprise one or more of: a magnetic medium reader and/or writer for reading data from and/or writing data to a magnetic storage medium (such as a hard disk drive); an optical medium reader and/or writer for reading data from and/or writing data to an optical storage medium, such as a CD-ROM, a DVD-ROM or a BluRay disk; a solid-state memory device interface for reading data from and/or writing data to a solid-state memory device (such as a flash-memory device); and a network interface for receiving data from and/or transmitting data to a computer over a network (such as the Internet, a local area network, a wide area network, a metropolitan area network, etc.). In this way, the processor 114 may receive digital data from one or more sources and can output digital data to one or more destinations. Data received via the data interface 106 may be stored directly in the memory 110, or may be passed first to the processor 114 for processing and/or subsequent storage in the memory 110. Additionally, the data interface 106 may receive data for outputting or for storage on a storage medium either directly from the memory 110 or from the processor 114.

If the processor 114 uses a computer program that comprises program instructions for carrying out a method according to an embodiment of the invention, then the processor 114 may receive the computer program from a source via the data interface 106. Configuration data (for example information regarding a desired frequency response for an audio filter, as described later) or commands to perform processing may also be received via the data interface 106. Furthermore, audio data to be processed (filtered or equalized) by the processor 114 may be received via the data interface 106 (for example as one or more audio data files or data streams). The processor 114 may also output the results of its processing (such as filter coefficients that it has generated or audio data files or audio data streams that it has produced) for storage or transmission via the data interface 106.

The processor 114 is also arranged to receive audio data from the audio interface 104. The audio interface 104 may be any interface arranged to receive audio signals (such as live or pre-recorded audio signals, for example: audio signals from one or more microphones and/or one or more audio reproduction devices—not shown in FIG. 1). Some of these audio signals may be received in digital form. Alternatively, some of these audio signals may be received in analog form, in which case, if the processor 114 is arranged to perform digital processing then the audio interface 104 may be arranged to perform analog-to-digital conversion to generate corresponding digital audio data. The audio interface 104 may be arranged to simply pass the input audio signals to the processor 114 for processing, or it may be arranged to write audio data to the memory 110 for storage so that the processor 114 can subsequently process the stored audio data. Additionally, processed audio data may be output via the audio interface 104 (for example output to a speaker or to an audio recording device—not shown in FIG. 1) either from the memory 110 or from the processor 114 itself. In this case, the audio interface 104 may be arranged to perform digital-to-analog conversion in order to output digital audio data as an analog audio signal, for example to a speaker.

The processor 114 may perform its processing in accordance with input received from a user via the user interface 108. The user interface 108 receives input signals from one or more user input devices, such as a keyboard 116 and a mouse 118, although it will be appreciated that other forms of input device may be used as are well-known in this field of technology. The user interface 108 then informs the processor 114 of these input signals so that the processor 114 may then respond to the input from the user accordingly.

The processor 114 also communicates with the graphical interface 112, which controls a display 120 (such as a screen or a monitor). The processor 114 is arranged to instruct the graphical interface 112 to output a visual display via the display 120. This will be described in more detail with reference to FIG. 3 below. The graphical interface 112 then outputs the visual display accordingly. Additionally, the display 120 may be touch-sensitive or may provide other means through which the user can provide input to the processor 114, so that the processor 114 can then receive commands and/or configuration data via the display 120 as well as, or as an alternative to, via the user interface 108.

It will be appreciated that the system 100 need not comprise all of the elements mentioned above, and that various elements of the system 100 may be provided or omitted according to a specific desired configuration of the system. For example, if audio data is to be received via only the data interface 106, then the system 100 may omit the audio interface 104, and vice versa. As a further example, if configuration data (such as a desired frequency response for the processing) is to be received via a user input via the user interface 108, then the system 100 may be configured to not receive such data via the data interface 106 or via the display 120.

Additionally, it will be appreciated that the system 100 may be formed by a single device 102, or the system 100 may be formed from multiple separate devices linked together, each contributing to one or more of the features of the system 100. For example:

(i) A first system 100*a* may be formed from a dedicated audio processing device. This device may comprise the audio interface 104*a*, the memory 110*a* and a processor 114*a* (for example, in the form of a DSP chip). The processor 114*a* may be configured to process audio data received via the audio interface 104*a* and output processed audio via the audio interface 104*a*. The processing of the audio data may involve filtering the data in accordance with an embodiment of the invention (as described later). The first system 100*a* could be a system installed, for example, in a stadium, a concert hall, etc. for processing sound at such a venue. The system 100*a* may be lacking means or functionality to allow a user to vary the configuration of the audio processing that it performs.

(ii) A second system 100*b* may be formed from a general purpose computer. The computer may be arranged to carry out an embodiment of the invention for determining a filter and determining filter coefficients in accordance with a user's requirements (as explained in more detail later). However, the second system 100*b* may, or may not, be configured to perform processing of audio data in accordance with the filters and filter coefficients that it has generated.

(iii) A third system 100*c* may be formed by coupling the above first system 100*a* and the above second system 100*b*. In this way, the second system 100*b* may be used to generate filter coefficients and then configure the first system 100*a* with those generated filter coefficients. Thus, for example, an audio engineer may visit a venue at which the first system 100*a* is installed for processing audio at that venue. The audio engineer may bring along the second system 100*b* (for example a laptop computer) and, using the second system 100*b*, configure the first system 100*a* accordingly. Once this has been done, the second system 100*b* can be decoupled from the first system 100*a*, leaving the first system 100*a* to process audio according to the configuration it has been provided with. Thus, in this third system 100*c*, various components (such as the memory 110 and the processor 114) may be formed from multiple separate components (such as the respective memories and processors of the first and second systems).

(2) Overview of the Processing of the System of FIG. 1

Figure 2:
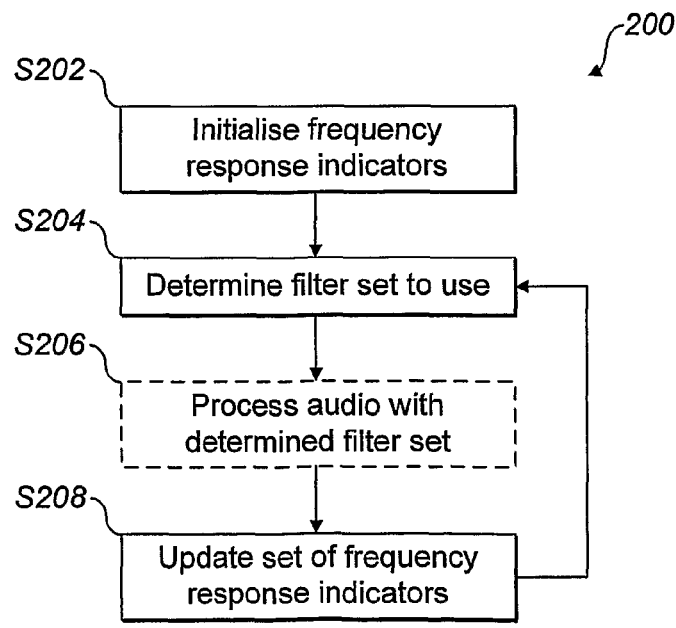
FIG. 2 is a flowchart schematically illustrating an overview of the processing performed in accordance with an embodiment of the invention.

FIG. 2 is a flowchart schematically illustrating an overview of the processing 200 performed by the processor 114 in accordance with an embodiment of the invention.

The processing 200 makes use of a set of one or more frequency response indicators. A frequency response indicator is data specifying (i) a user-defined frequency and (ii) a corresponding used-defined desired gain (positive, negative or zero) for a desired frequency response at that frequency. In this way, a desired frequency response may be indicated (or defined or specified), i.e. the frequency response indicators define a desired frequency response for subsequent audio processing.

At a step S202, the set of frequency response indicators is initialised. This could be, for example, setting there to be no frequency response indicators so that the set of frequency response indicators is initially empty. Alternatively, the processor may have been provided with configuration data (in a manner as discussed above, for example from a storage medium or from a remote computer over a network) that specifies one or more initial frequency response indicators. A graphical user interface to allow a user to specify frequency response indicators will be discussed later with respect to FIG. 3.

Then, at a step S204, a set of one or more filters is determined with the aim that, for each of the frequency response indicators in the set of frequency response indicators, the gain of the frequency response resulting from the combination of the filters in the determined set of filters at the frequency specified by that frequency response indicator is substantially the same as the corresponding desired gain specified by that frequency response indicator. Methods for determining the set of filters will be described later.

The processor 114 may then determine the filter coefficients corresponding to the filters in the determined set of filters. The processor 114 may store these coefficients in the memory 110 (for example, for use in a step S206 described below) and/or may output these coefficients via the data interface 106 for storage on a storage medium and/or transmission to another computer.

The combination of the set of filters generated at the step S204 is then an infinite-impulse-response filter suitable for applying to audio data.

The processor 114 may be arranged to process audio data using the set of filters generated at the step S204 during the processing 200 of FIG. 2, so that a user can set and update the set of frequency response indicators to listen to the effect on audio data. This may be used, for example, when experimenting with the frequency response indicators to generate a desired effect, or when processing a live audio feed. Thus, at an optional step S206, the processor 114 applies the set of filters generated at the step S204 to audio data. Methods for applying filters to audio data are well-known and shall not be described in more detail herein. As mentioned, the audio data to which the filters are applied may already be stored in the memory 110 or may be received via the audio interface 104 or via the data interface 106. The processed audio data may then be stored in the memory 110. The processed audio data may be output and/or stored via the audio interface 104 and/or via the data interface 106.

At a step S208, the set of frequency response indicators is updated so as to specify a new set of frequency response indicators. This may be performed, for example, by a user. The update may involve: (i) changing the number of frequency response indicators (for example by adding one or more new frequency response indicators and/or deleting one or more existing frequency response indicators); and/or (ii) changing the frequency value corresponding to one or more of the frequency response indicators; and/or (iii) changing the gain value corresponding to one or more of the frequency response indicators. Again, methods for doing this will be described in more detail later.

Processing then returns to the step S204 at which a set of filters is generated based on the updated set of frequency response indicators. Then, at the step S206, the processor 114 transitions from applying the previous set of filters to applying the newly generated set of filters to the audio data. Methods for carrying out this transition will be described in more detail later.

(3) Graphical User Interface

Figure 3:
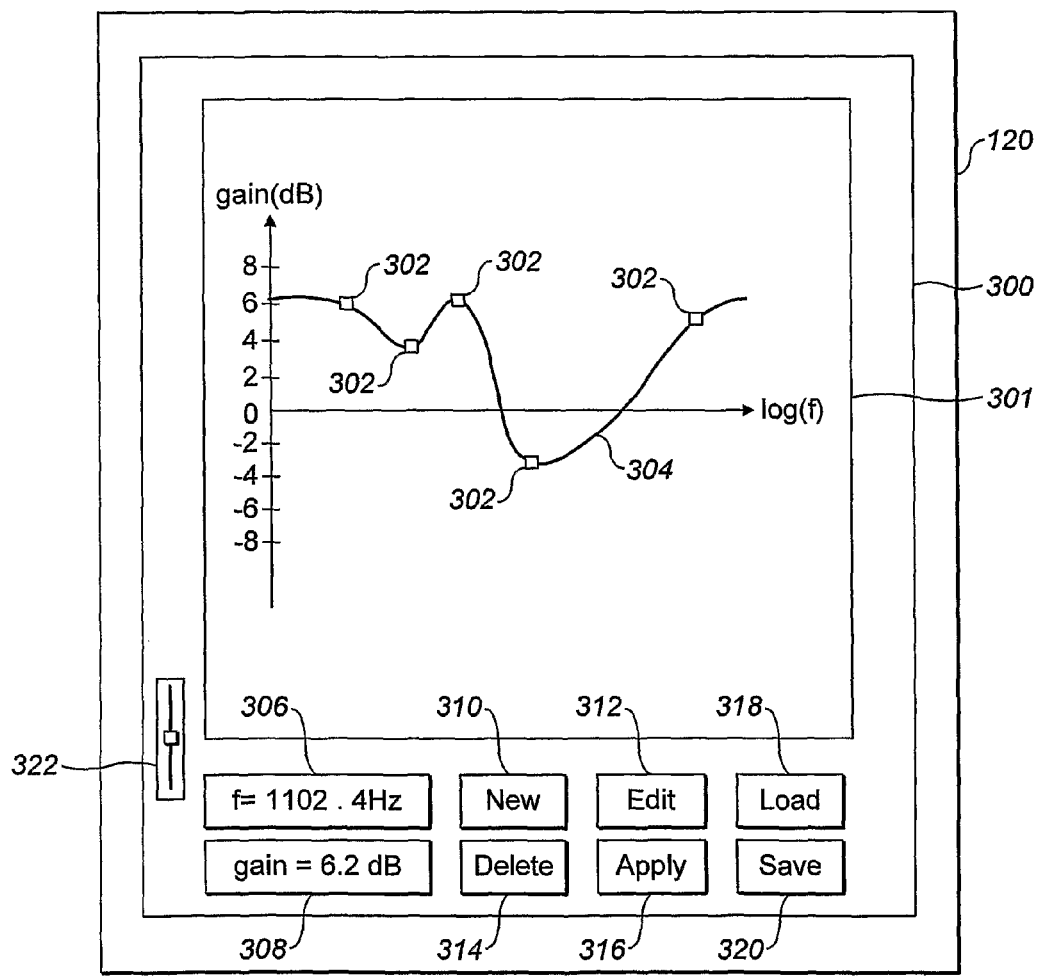
FIG. 3 schematically illustrates an example graphical user interface according to an embodiment of the invention.

FIG. 3 schematically illustrates an example graphical user interface (GUI) 300 provided by the processor 114 to a user on the display 120 according to an embodiment of the invention. This GUI 300 may be used to specify frequency response indicators at the step S202 of FIG. 2 and to update the frequency response indicators at the step S208 of FIG. 2.

It will be appreciated that other embodiments of the invention may omit some of the features displayed on the GUI 300 shown in FIG. 3 and/or may include additional features on the GUI 300.

The GUI 300 displays a graph 301, or a plot, of the frequency response of the set of filters generated at the step S204 of FIG. 2. The horizontal axis of the graph 301 represents log-frequency and the vertical axis of the graph 301 represents the gain (or size or magnitude of the change in the power of an audio signal due to the application of the generated set of filters), measured in decibels. It will be appreciated, though, that other units of measurement could be used instead.

The GUI 300 allows the user to define, or specify, a set of frequency response indicators 302. Each frequency response indicator 302 specifies a user-defined frequency and a corresponding used-defined desired gain for a desired frequency response at that frequency. In other words, each frequency response indicator 302 identifies a point on the graph 301 through which the user wishes a desired frequency response to pass. The frequency response indicators 302 are displayed as handles, or pointers, on the GUI 300.

The GUI 300 allows the user to add or remove frequency response indicators 302. Thus, the number of frequency response indicators 302 to be used may be determined by the user. Additionally, the GUI 300 allows the user to move an existing frequency response indicator 302 along both the horizontal (log-frequency) axis and the vertical (gain) axis. Thus, both the frequency and the gain associated with a frequency response indicator 302 can be set by a user. In particular, the frequency for a frequency response indicator 302 is not limited to frequencies from a predetermined finite set of frequencies.

The user may add, adjust or delete a frequency response indicator 302 in a number of ways. For example, the user may use the keyboard 116 and/or the mouse 118 and/or a touch sensitive display 120 to select a location on the graph 301 so that a new frequency response indicator 302 is generated that specifies the corresponding frequency and gain of the selected location on the graph 301. The user may use the keyboard 116 and/or the mouse 118 and/or a touch sensitive display 120 to select an existing frequency response indicator 302 and then move/drag that frequency response indicator 302 to a new location on the graph 301 to adjust that selected frequency response indicator 302 accordingly.

Alternatively, the user may use a frequency input box 306 and a gain input box 308 to specify (by inputting numerical values) a frequency and a desired gain respectively. Thus, the resolution of the display 120 does not limit the accuracy with which the frequency response indicators 302 may be set by the user. A button 310 may then be provided on the GUI 300 which, when selected by the user, generates a new frequency response indicator 302 based on the frequency and gain entered at the frequency input box 306 and the gain input box 308. When the user selects a frequency response indicator 302, the GUI 300 may cause the frequency input box 306 and the gain input box 308 to display the corresponding frequency and gain for that selected frequency response indicator 302. The user may then change the displayed frequency and/or gain and then use a button 312 provided on the GUI 300 which sets (or adjusts) that selected frequency response indicator 302 so that its frequency and gain are those entered at the frequency input box 306 and the gain input box 308.

A frequency response indicator 302 may be deleted by the user selecting that frequency response indicator 302 using the keyboard 116 and/or the mouse 118 and/or a touch sensitive display 120, and then pressing a delete key on the keyboard 116 or selecting a delete button 314 provided on the GUI 300.

The GUI 300 may allow the user to select multiple frequency response indicators 302 so as to group those frequency response indicators 302 together. In this way, this selected group of frequency response indicators 302 may then be deleted together or adjusted together (for example, by moving them all as a group, either horizontally to change their frequencies and/or vertically to change their associated gains). This allows for easier manipulation of the frequency response indicators 302 by an operator of the system 100.

The user sets the frequency response indicators 302 (and the number of frequency response indicators 302) to define the desired frequency response for audio processing (filtering or equalisation). As mentioned, the processor 114 is arranged to generate (at the step S204) a set of filters based on the set of frequency response indicators 302. This will be described in more detail below. The processor 114 may then determine the frequency response resulting from this generated set of filters and plot this on the graph 301 as a curve 304. Ideally, this curve 304 will match the frequency response desired by the user and will thus pass through the points representing the frequency response indicators 302. However, as described in more detail later, the calculated frequency response curve 304 may miss one or more of the points representing the frequency response indicators 302.

In some embodiments of the invention, the set of filters is generated at the step S204 each time the user adjusts, adds or deletes a frequency response indicator 302. In this way, the user is continuously provided with the most up-to-date curve 304 showing the frequency response corresponding to the generated set of filters for the currently specified frequency response indicators 302. Additionally, if the processor 114 is processing audio data based on the generated set of filters, then this approach allows the set of filters used for the audio processing to be varied in accordance with each modification that the user makes to the set of frequency response indicators 302. In an alternative embodiment, though, the processor 114 may display an updated frequency response curve 304 to the user 104, but may only start to use the updated set of filters at the step S206 once the user has selected an apply button 316 provided on the GUI 300. In this way, the user can visually see the frequency response curve 304 and modify the frequency response indicators 302 until a desired curve 304 is achieved, and then apply the corresponding set of filters to the audio data without having to have applied intermediate sets of filters (which may have been audibly undesirable) to the audio data.

Alternatively, the processor 114 may be arranged to only generate a new set of filters at the step S204 (i.e. move from the step S202 to the step S204) once the user is content with the set of frequency response indicators that he has specified and/or updated and has then selected the apply button 316. In this embodiment, selecting the apply button 316 then causes the processor 114 to determine, or generate, a corresponding set of filters at the step S204 and then display the corresponding frequency response curve 304.

It will be appreciated that embodiments of the invention may make use of other methods for specifying and receiving the frequency response indicators. Thus, some embodiment may use the GUI 300 as an additional method for specifying and updating the frequency response indicators, whilst other embodiments may not use the GUI 300 at all. For example, frequency response indicators may be saved as configuration data in the memory 110, on a storage medium accessible by the processor 114 via the data interface 106, or at a remote computer accessible via the data interface 106. This configuration data may specify just one set of frequency response indicators. Alternatively, the configuration data may specify an ordered plurality of sets of frequency response indicators, with corresponding timing information specifying when one set of frequency response indicators is to be updated, to a subsequent (or next) set of frequency response indicators. In this way, the set of frequency response indicators may be automatically updated by the processor 114 whilst processing audio data. The GUI 300 therefore may provide a load button 318 to allow the user to locate and access a source of such frequency response indicator configuration data.

Additionally, the GUI 300 may provide a save button 320 to allow a user to save, or output, the current set of frequency response indicators either to the memory 110, or to a storage medium or a remote computer via the data interface 106. Additionally, or alternatively, the save button 320 may allow the user to save, or output, the coefficients of the filters that have been generated at the step S204 for the current set of frequency response indicators 302 either to the memory 110, or to a storage medium or a remote computer via the data interface 106.

(4) Shelving Filters

A shelving filter (or shelf filter) is a filter whose frequency response has a gain that: (i) is substantially equal to a first gain value $g_1$ for frequencies below a first frequency $f_1$; (ii) is substantially equal to a second gain value $g_2$ (different from the first gain value $g_1$) for frequencies above a second frequency $f_2$ (where $f_1 < f_2$); and (iii) changes continuously (and usually monotonically and, even more usually, strictly monotonically) from $g_1$ to $g_2$ as the frequency changes from $f_1$ to $f_2$.

In this description, $f_1$ shall be referred to as the "low-corner frequency" and $f_2$ shall be referred to as the "high-corner frequency" (the words "low" and "high" here indicating that $f_1$ is less than $f_2$, and not implying that $g_1$ is less than $g_2$). Frequency $f_1$ may also be referred to as the "lower-corner frequency" and frequency $f_2$ may also be referred to as the "upper-corner frequency".

If $g_1 > g_2$, then the shelving filter is a so-called "sinking shelving filter" or a "falling shelving filter". If $g_1 < g_2$, then the shelving filter is a so-called "rising shelving filter". Of course, $g_1$ may be positive, negative or zero-valued. Similarly, $g_2$ may be positive, negative or zero-valued, independently of $g_1$.

Figure 4A:
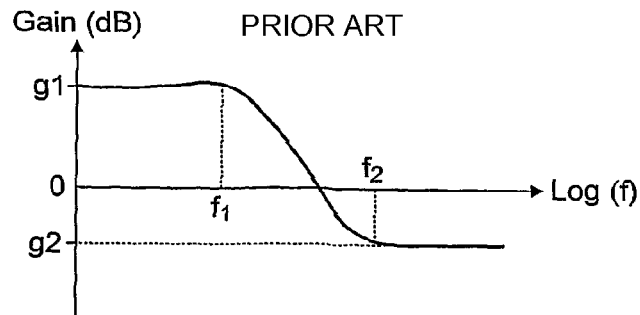
FIGS. 4a and 4c illustrate the frequency response for example falling shelving filters.
Figure 4B:
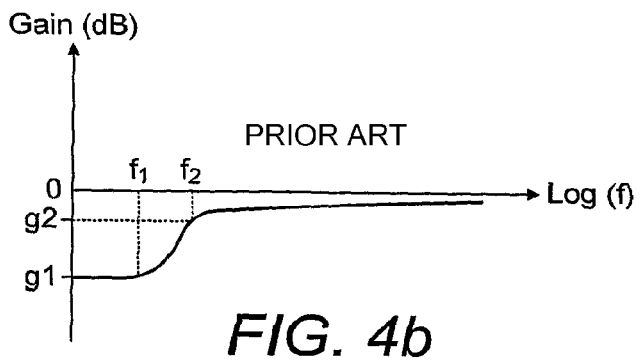
FIGS. 4b and 4d illustrates the frequency response for example rising shelving filters.

FIG. 4a illustrates the frequency response graph for an example falling shelving filter; FIG. 4b illustrates the frequency response graph for an example rising shelving filter. In this application, all frequency response graphs (including those of FIGS. 4a and 4b) have a horizontal axis representing log-frequency and a vertical axis representing gain measured in decibels (dB).

Figure 4C:
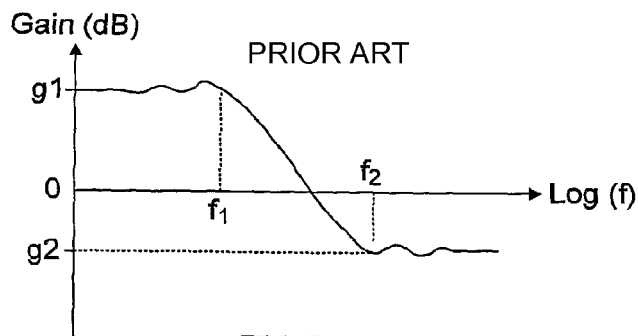
Figure 4D:
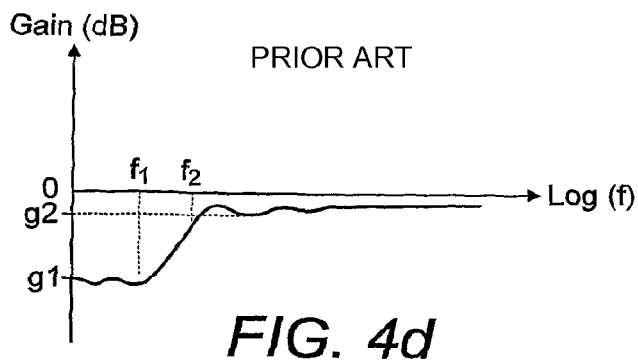

As mentioned, the frequency response of the shelving filter has a gain that is substantially equal to $g_1$ for frequencies below the low-corner frequency $f_1$. However, it will be appreciated that the frequency response gain need not be exactly equal to $g_1$ for all frequencies below $f_1$, but may instead simply be different from $g_1$ by an amount that is small in comparison to the difference between $g_1$ and $g_2$. Similarly, whilst the frequency response of the shelving filter has a gain that is substantially equal to $g_2$ for frequencies above the high-corner frequency $f_2$, it will be appreciated that the frequency response need not be exactly equal to $g_2$ for all frequencies above $f_2$, but may instead simply be different from $g_2$ by an amount that is small in comparison to the difference between $g_1$ and $g_2$. Thus, the frequency response below $f_1$ and above $f_2$ need not be perfectly flat. In general, though, the gain of the frequency response tends asymptotically to $g_1$ as the frequency decreases below $f_1$, and the gain of the frequency response tends asymptotically to $g_2$ as the frequency increases above $f_2$. FIG. 4c therefore illustrates the frequency response graph for an example falling shelving filter based on FIG. 4a, but showing how the frequency response may vary for frequencies below the low-corner frequency $f_1$ and for frequencies above the high-corner frequency $f_2$. Similarly, FIG. 4d illustrates the frequency response graph for an example rising shelving filter based on FIG. 4b, but showing how the frequency response may vary for frequencies below the low-corner frequency $f_1$ and for frequencies above the high-corner frequency $f_2$.

As is known in this field of technology, the order, n, of a filter is the term used in this field of technology to indicate the polynomial order of the numerator and of the denominator of the transfer function for that filter. Thus, the transfer function for an n-th order filter has n zeros and n poles. The order n is, naturally, a non-negative integer.

Described below are a number of methods for generating a shelving filter. Except where stated otherwise, these methods are based on properties of low-pass filters of a predetermined type. The predetermined type may be, for example, Butterworth low-pass filters, elliptical low-pass filters, Chebychev low-pass filters, etc. As these types of low-pass filter are well-known in this field of technology, they shall not be described in more detail herein. The predetermined type of low-pass filter whose properties are used will be referred to as the "basis-type" of low-pass filter (as such low-pass filters form the basis for the shelving filters that are formed). Thus, the basis-type may be, for example: "Butterworth", "elliptical", "Chebychev", etc. Low-pass filters of the basis-type will be referred to as "low-pass basis-filters". The methods described below apply equally to these various different basis-types. Hence, the rest of the description will use Butterworth filters as the basis-type of filter, but it will be appreciated that the methods described can be applied equally using other basis-types too.

As is also known, for an n-th order low-pass basis-filter of basis-type B, the frequency response has a rate-of-change of gain that is substantially $-r_B \times n$ dB per octave at frequencies above the filter's cut-off frequency, where $r_B$ is a positive value dependent upon the basis-type B. Thus, for a frequency f above the cut-off frequency, the frequency response of the n-th order low-pass basis-filter at the frequency 2f has a gain that is substantially $r_B \times n$ dB less than at frequency f, i.e. the gradient of the frequency response curve plotted on a log-frequency vs gain graph is substantially $-r_B \times n$ for frequencies above the cut-off frequency. For Butterworth filters, $r_{Butterworth} = 20 \log_{10}(2) \approx 6.0$ dB per octave.

(4.1) Method A

An example method for designing an n-th order shelving filter is given in "*Parametric Recursive Higher-Order Shelving Filters*", Martin Holters and Udo Zölzer, Audio Engineering Society, May 2006. This paper describes that an n-th order shelving filter may be based on n-th order low-pass Butterworth filters as discussed below. It also mentions that Chebychev filters or elliptical filters could be used instead of the Butterworth low-pass filters.

Figure 5A:
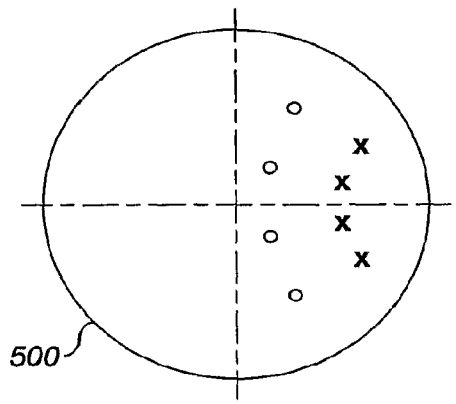
FIG. 5a is a z-plane pole-zero diagram of an example 4th order falling shelving filter.
Figure 5B:
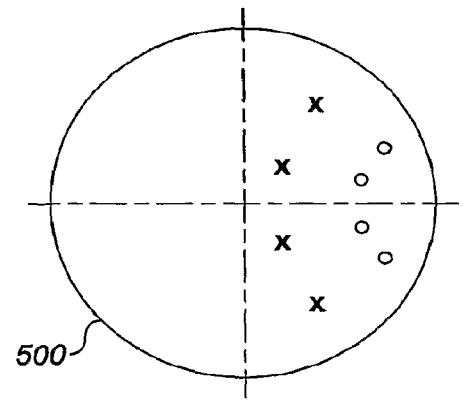
FIG. 5b is a z-plane pole-zero diagram of an example 4th order rising shelving filter.
Figure 5C:
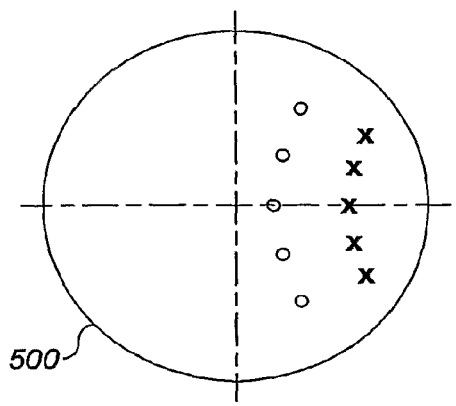
FIG. 5c is a z-plane pole-zero diagram of an example 5th order falling shelving filter.
Figure 5D:
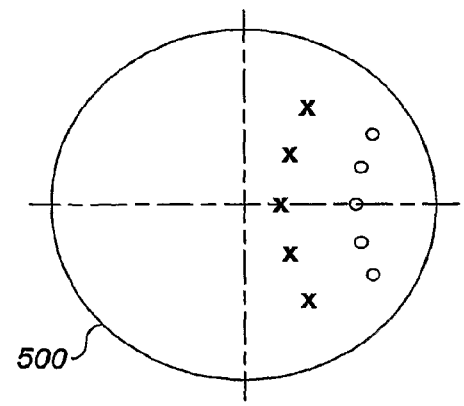
FIG. 5d is a z-plane pole-zero diagram of an example 5th order rising shelving filter.

FIG. 5a is a z-plane pole-zero diagram of an example 4th order falling shelving filter formed according to this method, whilst FIG. 5b is a z-plane pole-zero diagram of an example 4th order rising shelving filter formed according to this method (which is the same as the pole-zero diagram of FIG. 5a, with the poles of FIG. 5a changed into zeros and the zeros of FIG. 5a changed into poles). FIG. 5c is a z-plane pole-zero diagram of an example 5th order falling shelving filter formed according to this method, whilst FIG. 5d is a z-plane pole-zero diagram of an example 5th order rising shelving filter formed according to this method (which is the same as the pole-zero diagram of FIG. 5c, with the poles of FIG. 5c changed into zeros and the zeros of FIG. 5c changed into poles). As is normal, poles are shown as crosses and zeros are shown as circles, and the unit circle 500 is illustrated. The pole-zero diagrams for other integer-order falling shelving filters and rising shelving filters are analogous to those shown in FIGS. 5a-d.

For a shelving filter generated according to this method, the positions of the zeros and poles for its transfer function are determined according to the positions that would be used for poles for the transfer function of low-pass basis-filters.

In particular, for an n-th order falling shelving filter with low-corner frequency $f_1$ and high-corner frequency $f_2$: (i) the n poles for its transfer function are located at the positions that would be used for poles for an n-th order low-pass basis-filter with a cut-off frequency $f_1$; and (ii) the n zeros for its transfer function are located at the positions that would be used for poles for an n-th order low-pass basis filter with cut-off frequency $f_2$.

On the other hand, for an n-th order rising shelving filter with low-corner frequency $f_1$ and high-corner frequency $f_2$: (i) the n poles for its transfer function are located at the positions that would be used for poles for an n-th order low-pass basis-filter with a cut-off frequency $f_2$; and (ii) the n zeros for its transfer function are located at the positions that would be used for poles for an n-th order low-pass basis filter with cut-off frequency $f_1$.

The rate of change of frequency response between the low-corner frequency $f_1$ and the high-corner frequency $f_2$ (i.e. the gradient of the frequency response curve between $f_1$ and $f_2$ shown in FIGS. 4a and 4b) is determined by the order of the shelving filter and the value of $r_B$ for the basis-type. In general, for an n-th order falling shelving filter, this rate of change of frequency response gain is substantially equal to $-r_B \times n$ dB per octave, and for an n-th order rising shelving filter, this rate of change of frequency response gain is substantially equal to $r_B \times n$ dB per octave. Thus, when using such an n-th order shelving filter, the gain value $g_2$ is determined by (i) $g_2 = g_1 - nr_B \log_2(f_2/f_1)$ for a falling shelving filter and (ii) $g_2 = g_1 + nr_B \log_2(f_2/f_1)$ for a rising shelving filter.

Thus, the gains $g_1$ and $g_2$ are interdependent. They can be adjusted together (for example to obtain a desired gain $g_1$ or a desired gain $g_2$) by appropriate scaling of the transfer function, as is well-known.

However, if a shelving filter is required that has an arbitrary low-corner frequency $f_1$ and an arbitrary high-corner frequency $f_2$, with arbitrary frequency response gains of $g_1$ and $g_2$ at $f_1$ and $f_2$ respectively, then it will not always be possible to use a shelving filter generated by Method A as described above, since $g_2$ is inherently determined by $f_1$, $f_2$, $g_1$, $r_B$ and the order n as described above.

Embodiments of the invention described below therefore overcome this problem and provide a shelving filter having an arbitrary low-corner frequency $f_1$ and an arbitrary high-corner frequency $f_2$, with arbitrary frequency response gains of $g_1$ and $g_2$ at $f_1$ and $f_2$ respectively. The values of $g_1$, $g_2$, $f_1$ and $f_2$ may be specified by a user, for example. Using the above equations, the "effective order" $n_e$ for such a shelving filter will thus be defined as $$n_e = \frac{|g_2 - g_1|}{r_B \log_2(f_2/f_1)},$$

where $n_e$ may be a non-integer number. For a shelving filter with effective order $n_e$, the rate of change of frequency response gain between the low-corner frequency and the high-corner frequency is (i) substantially $n_e r_B$ dB per octave for a rising shelving filter or (ii) substantially $-n_e r_B$ dB per octave for a falling shelving filter.

(4.2) Method B

A first method, according to an embodiment of the invention, for generating a shelving filter having an arbitrary low-corner frequency $f_1$ and an arbitrary high-corner frequency $f_2$, with arbitrary frequency response gains of $g_1$ and $g_2$ at $f_1$ and $f_2$ respectively (so that the difference between $g_2$ and $g_1$ can be a desired amount), is described below.

The desired shelving filter is generated by combining two separate shelving filters:
  the first of these two shelving filters (i) has a low-corner frequency at $f_1$ and a high-corner frequency at $f_2$; and (ii) has an order n that is determined as described below;
  the second of these two shelving filters (i) has a low-corner frequency at a frequency $f_3$ and a high-corner frequency at a frequency $f_4$, where $f_1 \le f_3 < f_4 \le f_2$ (i.e. the range from $f_3$ to $f_4$ is a sub-range of the range from $f_1$ to $f_2$); and (ii) is a 1st order shelving filter;
  if $g_1 > g_2$, then the first and second shelving filters are both falling shelving filters; if $g_1 < g_2$, then the first and second shelving filters are both rising shelving filters.

The first shelving filter may be a shelving filter formed according to method A above, based on a basis-type B. However, it will be appreciated that the first shelving filter may be any type (or class) of shelving filter.

The order n for the first shelving filter is determined to be the largest integer n for it so that the difference, d, between the gain of the frequency response of the first shelving filter at $f_2$ and the gain of the frequency response of the first shelving filter at $f_1$ has a magnitude at most $|g_2-g_1|$.

Using the above equations for method A shelving filters of basis-type B, the difference d is $d = -nr_B \log_2(f_2/f_1)$ for a falling shelving filter and $d = nr_B \log_2(f_2/f_1)$ for a rising shelving filter. Thus, the order for the first shelving filter may be determined according to $$n = \left\lfloor \frac{|g_2 - g_1|}{r_B \log_2(f_2/f_1)} \right\rfloor = \lfloor n_e \rfloor,$$

where, as usual $\lfloor x \rfloor$ represents the highest integer no greater than x.

The low-corner frequency $f_3$ and high-corner frequency $f_4$ for the second shelving filter are determined so that the difference between the frequency response gain of the second shelving filter at $f_4$ and the frequency response gain of the second shelving filter at $f_3$ is $g_2-g_1-d$. It is possible to obtain such values for $f_3$ and $f_4$ for the 1st-order second shelving filter because the order n for the first shelving filter was chosen to be the largest integer order for the first shelving filter so that the $|d| \le |g_2 - g_1|$.

Using the above equations for method A shelving filters of basis-type B, $f_3$ and $f_4$ are determined relative to each other such that $$\log_2(f_4/f_3) = \frac{|g_2 - g_1 - d|}{r_B}.$$

The range defined from $f_3$ to $f_4$ may be chosen to be anywhere in the range from $f_1$ to $f_2$. However, in preferred embodiments, $f_3$ and $f_4$ are chosen such that range from $f_3$ to $f_4$ is substantially centred in the range from $f_1$ to $f_2$. This may be centred in terms of log-frequency, so that $f_1 f_2 = f_3 f_4$, or in terms of actual frequency, so that $f_4 + f_3 = f_2 + f_1$. Such centring of the range from $f_3$ to $f_4$ within the range from $f_1$ to $f_2$ provides improved audio quality as the frequency response resulting from the combination of the first shelving filter and the second shelving filter will retain as sharp a corner as possible at the corner frequencies $f_1$ and $f_2$ by such a choice of $f_3$ and $f_4$. If instead, for example, $f_3$ were chosen to be closer to $f_1$, then the second shelving filter is more likely to have a more significant impact on the frequency response of the resultant shelving filter at frequencies below the low-corner frequency $f_1$, which is undesirable for the intended resultant shelving filter. Similarly, if $f_4$ were chosen to be closer to $f_2$, then the second shelving filter is more likely to have a more significant impact on the frequency response of the resultant shelving filter at frequencies above the high-corner frequency $f_2$, which is undesirable for the intended resultant shelving filter.

The combination of the first shelving filter and the second shelving filter is a shelving filter with low-corner frequency $f_1$ and high-corner frequency $f_2$, and for which the change in frequency response gain between the frequencies $f_1$ and $f_2$ is substantially equal to $g_2-g_1$.

The actual gain for the resulting shelving filter is determined by the gains selected for the first and second shelving filters. For example, the gain for the first shelving filter could be set to be $g_1$ at frequency $f_1$ and the gain for the second shelving filter could be set to be 0 at the frequency $f_3$, so that the gain for the combination of the first and the second shelving filters is the desired gain $g_1$ at frequency $f_1$. However, it will be appreciated that other gain values could be used for the first and the second shelving filters so that the combination of the these two shelving filters results in the desired gain $g_1$ at frequency $f_1$, which then inherently results in the desired gain $g_2$ at frequency $f_2$.

For example, suppose that (i) the basis-type is Butterworth filters (so that $r_B \approx 6.0$); (ii) $f_1 = 100$ Hz; (iii) $f_2 = 140$ Hz; (iv) $g_1 = 6$ dB; and (v) $g_2 = -3$ dB. Then:
  the first and second shelving filters will be falling shelving filters (as $g_1 > g_2$);

$$n = \left\lfloor \frac{|g_2 - g_1|}{r_B \log_2(f_2/f_1)} \right\rfloor = 3,$$

meaning that the first shelving filter is a 3rd order filter and the second shelving filter is a 1st order filter;
  the frequency response change between $f_1$ and $f_2$ resulting from the first shelving filter is $d = -nr_B \log_2(f_2/f_1) \approx -8.7$ dB, leaving a change of frequency response of $g_2 - g_1 - d \approx -0.3$ dB to be attained from the second shelving filter; and hence $$\log_2(f_4/f_3) = \frac{|g_1 - g_2 - d|}{r_B} \approx 0.05$$

so that $f_4 \approx 1.04 f_3$. In the preferred embodiment in which $f_1 f_2 = f_3 f_4$, the values for $f_3$ and $f_4$ are about 116 Hz and 121 Hz respectively.

As another example, suppose that (i) the basis-type is Butterworth filters (so that $r_B \approx 6.0$); (ii) $f_1 = 1000$ Hz; (iii) $f_2 = 2100$ Hz; (iv) $g_1 = -4$ dB; and (v) $g_2 = 7$ dB. Then:
  the first and second shelving filters will be rising shelving filters (as $g_1 < g_2$);

$$n = \left\lfloor \frac{|g_2 - g_1|}{r_B \log_2(f_2/f_1)} \right\rfloor = 1,$$

meaning that the first shelving filter is a 1st order filter and the second shelving filter is a 1st order filter;

the frequency response change between $f_1$ and $f_2$ resulting from the first shelving filter is $d=nr_B \log_2(f_2/f_1) \approx 6.4$ dB, leaving a change of frequency response of $g_2-g_1-d \approx 4.6$ dB to be attained from the second shelving filter; and hence $$\log_2(f_4/f_3) = \frac{|g_1 - g_2 - d|}{r_B} \approx 0.76$$

so that $f_4 \approx 1.70 f_3$. In the preferred embodiment in which $f_1 f_2 = f_3 f_4$, the values for $f_3$ and $f_4$ are about 1111 Hz and 1889 Hz respectively.

(4.3) Method C

A second method, according to an embodiment of the invention, for generating a shelving filter having an arbitrary low-corner frequency $f_1$ and an arbitrary high-corner frequency $f_2$, with arbitrary frequency response gains of $g_1$ and $g_2$ at $f_1$ and $f_2$ respectively (so that the difference between $g_2$ and $g_1$ can be a desired amount), is described below.

The desired shelving filter is generated by combining two separate shelving filters:

the first of these two shelving filters (i) has a low-corner frequency at $f_1$ and a high-corner frequency at $f_2$; and (ii) has an order n that is determined as described below;

the second of these two shelving filters (i) has a low-corner frequency at a frequency $f_3$ and a high-corner frequency at a frequency $f_4$, where $f_1 \le f_3 < f_4 \le f_2$ (i.e. the range from $f_3$ to $f_4$ is a sub-range of the range from $f_1$ to $f_2$); and (ii) is a 1st order shelving filter;

if $g_1 > g_2$, then the first shelving filter is a falling shelving filter and the second shelving filter is a rising shelving filter; if $g_1 < g_2$, then the first shelving filter is a rising shelving filter and the second shelving filter is a falling shelving filter.

The first shelving filter may be a shelving filter formed according to method A above, based on a basis-type B. However, it will be appreciated that the first shelving filter may be any type (or class) of shelving filter.

The order n for the first shelving filter is determined to be the smallest integer n for it so that the difference, d, between the gain of the frequency response of the first shelving filter at $f_2$ and the gain of the frequency response of the first shelving filter at $f_1$ has a magnitude at least $|g_2-g_1|$.

Using the above equations for method A shelving filters of basis-type B, the difference d is $d=-nr_B \log_2(f_2/f_1)$ for a falling shelving filter and $d=nr_B \log_2(f_2/f_1)$ for a rising shelving filter. Thus, the order for the first shelving filter may be determined according to $$n = \left\lceil \frac{|g_2 - g_1|}{r_B \log_2(f_2/f_1)} \right\rceil = \lceil n_e \rceil,$$

where, as usual $\lceil x \rceil$ represents the highest integer no greater than x.

The low-corner frequency $f_3$ and high-corner frequency $f_4$ for the second shelving filter are determined so that the difference between the frequency response gain of the second shelving filter at $f_4$ and the frequency response gain of the second shelving filter at $f_3$ is $g_2-g_1-d$. It is possible to obtain such values for $f_3$ and $f_4$ for the 1st-order second shelving filter because the order n for the first shelving filter was chosen to be the smallest integer order for the first shelving filter so that the $|d| \ge |g_2-g_1|$.

The range defined from $f_3$ to $f_4$ may be chosen to be anywhere in the range from $f_1$ to $f_2$. However, in preferred embodiments, $f_3$ and $f_4$ are chosen such that range from $f_3$ to $f_4$ is substantially centred in the range from $f_1$ to $f_2$. This may be centred in terms of log-frequency, so that $f_1 f_2 = f_3 f_4$, or in terms of actual frequency, so that $f_4+f_3=f_2+f_1$. Such centring of the range from $f_3$ to $f_4$ within the range from $f_1$ to $f_2$ provides improved audio quality as the frequency response resulting from the combination of the first shelving filter and the second shelving filter will retain as sharp a corner as then possible at the corner frequencies $f_1$ and $f_2$ by such a choice of $f_3$ and $f_4$. If instead, for example, $f_3$ were chosen to be closer to $f_1$, then the second shelving filter is more likely to have a more significant impact on the frequency response of the resultant shelving filter at frequencies below the low-corner frequency $f_1$, which is undesirable for the intended resultant shelving filter. Similarly, if $f_4$ were chosen to be closer to $f_2$, then the second shelving filter is more likely to have a more significant impact on the frequency response of the resultant shelving filter at frequencies above the high-corner frequency $f_2$, which is undesirable for the intended resultant shelving filter.

The combination of the first shelving filter and the second shelving filter is a shelving filter with low-corner frequency $f_1$ and high-corner frequency $f_2$, and for which the change in frequency response gain between the frequencies $f_1$ and $f_2$ is substantially equal to $g_2-g_1$.

The actual gain for the resulting shelving filter is determined by the gains selected for the first and second shelving filters. For example, the gain for the first shelving filter could be set to be $g_1$ at frequency $f_1$ and the gain for the second shelving filter could be set to be 0 at the frequency $f_3$, so that the gain for the combination of the first and the second shelving filters is the desired gain $g_1$ at frequency $f_1$. However, it will be appreciated that other gain values could be used for the first and the second shelving filters so that the combination of the these two shelving filters results in the desired gain $g_1$ at frequency $f_1$, which then inherently results in the desired gain $g_2$ at frequency $f_2$.

For example, suppose that (i) the basis-type is Butterworth filters (so that $r_B \approx 6.0$); (ii) $f_1=100$ Hz; (iii) $f_2=140$ Hz; (iv) $g_1=6$ dB; and (v) $g_2=-3$ dB. Then:

the first shelving filter will be a falling shelving filter and the second shelving filter will be a rising shelving filter (as $g_1 > g_2$);

$$n = \left\lceil \frac{|g_2 - g_1|}{r_B \log_2(f_2/f_1)} \right\rceil = 4,$$

meaning that the first shelving filter is a 4th order filter and the second shelving filter is a 1st order filter;

the frequency response change between $f_1$ and $f_2$ resulting from the first shelving filter is $d=-nr_B \log_2(f_2/f_1) \approx -11.7$ dB, leaving a change of frequency response of $g_2-g_1-d \approx 2.7$ dB to be attained from the second shelving filter; and hence $$\log_2(f_4/f_3) = \frac{|g_1 - g_2 - d|}{r_B} \approx 0.45$$

so that $f_4 \approx 1.37 f_3$. In the preferred embodiment in which $f_1 f_2 = f_3 f_4$, the values for $f_3$ and $f_4$ are about 101 Hz and 138 Hz respectively.

As another example, suppose that (i) the basis-type is Butterworth filters (so that $r_B \approx 6.0$); (ii) $f_1 = 1000$ Hz; (iii) $f_2 = 2100$ Hz; (iv) $g_1 = -4$ dB; and (v) $g_2 = 7$ dB. Then:

the first shelving filter will be a rising shelving filter and the second shelving filter will be a falling shelving filter (as $g_1 < g_2$);

$$n = \left\lceil \frac{|g_2 - g_1|}{r_B \log_2(f_2/f_1)} \right\rceil = 2,$$

meaning that the first shelving filter is a 2nd order filter and the second shelving filter is a 1st order filter;

the frequency response change between $f_1$ and $f_2$ resulting from the first shelving filter is $d = n r_B \log_2(f_2/f_1) \approx 12.8$ dB, leaving a change of frequency response of $g_2 - g_1 - d \approx -1.8$ dB to be attained from the second shelving filter; and hence $$\log_2(f_4/f_3) = \frac{|g_1 - g_2 - d|}{r_B} \approx 0.3$$

so that $f_4 \approx 1.24 f_3$. In the preferred embodiment in which $f_1 f_2 = f_3 f_4$, the values for $f_3$ and $f_4$ are about 1307 Hz and 1607 Hz respectively.

(4.4) Method D

In alternative embodiments of the invention, the Method B or C is used, except that the order of the second shelving filter may be a different predetermined order m. In this case, the relationship between $f_3$ and $f_4$ is determined according to $$\log_2(f_4/f_3) = \frac{|g_2 - g_1 - d|}{m r_B}.$$

In this case, the second shelving filter may a shelving filter formed according to method A above, based on the same basis-type B as for the first shelving filter. However, it will be appreciated that the second shelving filter may be any type (or class) of shelving filter.

Additionally, then, when Method D is based on Method B, the order n for the first shelving filter may be less than that calculated using Method B. For example, the order n for the first shelving filter may be determined to be any integer n so that the difference, d, between the gain of the frequency response of the first shelving filter at $f_1$ and the gain of the frequency response of the first shelving filter at $f_2$ has a magnitude at most $|G_2 - g_1|$.

Additionally, then, when Method D is based on Method C, the order n for the first shelving filter may be greater than that calculated using Method B. For example, the order n for the first shelving filter may be determined to be any integer n so that the difference, d, between the gain of the frequency response of the first shelving filter at $f_1$ and the gain of the frequency response of the first shelving filter at $f_2$ has a magnitude at least $|g_2 - g_1|$.

(4.5) Method E

In alternative embodiments of the invention, the Method D is used, except that the second shelving filter may be based on basis-type B', different from the basis-type B for the first shelving filter. The above equations to calculate the relationship between $f_3$ and $f_4$ (i.e. to calculate $\log_2(f_4/f_3)$) would use $r_{B'}$ as opposed to $r_B$.

(4.6) Method F

FIGS. 6a-6i are z-plane pole-zero diagrams for example shelving filters according to a further embodiment of the invention for generating a shelving filter having an arbitrary low-corner frequency $f_1$ and an arbitrary high-corner frequency $f_2$, with arbitrary frequency response gains of $g_1$ and $g_2$ at $f_1$ and $f_2$ respectively (so that the difference between $g_2$ and $g_1$ can be a desired amount).

For a given cut-off frequency f, an order n low-pass basis-filters with that cut-off frequency f has n poles. The set of poles for all such low-pass basis-filters with cut-off frequency f as n ranges from 1 to infinity defines a curve in the z-plane corresponding to that basis-type and that frequency f. In each of FIGS. 6a-6i, the right-hand dashed curve 652 is the curve corresponding to the chosen basis-type and with a cut-off frequency equal to the low-corner frequency $f_1$, whilst the left-hand dashed curve 650 is the curve corresponding to the chosen basis-type and with a cut-off frequency equal to the high-corner frequency $f_2$. The unit circle 500 is not shown in FIGS. 6a-6i for clarity purposes.

The shelving filters illustrated in FIGS. 6a-6i are falling shelving filters. Analogous rising shelving filters can be obtained by interchanging the poles and zeros.

FIG. 6a is a z-plane pole-zero diagram for a shelving filter with an effective order $n_e$ of 0.

This shelving filter is formed from a 1st order filter section giving a zero and a pole both located at a position 600 on the real axis 654 halfway between the curve 650 and the curve 652.

FIG. 6c is a z-plane pole-zero diagram for a shelving filter with an effective order $n_e$ of 1.

This shelving filter is formed from a 1st order filter section giving a zero and a pole at the positions of the zero and the pole for a 1st order shelving filter formed according to the above-described Method A with low-corner frequency $f_1$ and high-corner frequency $f_2$. Thus the zero is located at a position 602 on the real axis 654 at which the curve 650 intersects the real axis 654, and the pole is located at a position 604 on the real axis 654 at which the curve 652 intersects the real axis 654.

FIG. 6b is a z-plane pole-zero diagram for a shelving filter with an effective order $n_e = \alpha$, where $0 < \alpha < 1$, so that the rate of change of gain between the low-corner frequency $f_1$ and the high-corner frequency $f_2$ is $-n_e r_B$ dB per octave.

This shelving filter is formed from a 1st order filter section giving a zero and a pole located on the real-axis 654. If the distance between the position 600 and the position 602 is $D_1$ (which also equals the distance between the position 600 and the position 604), then the zero is a distance $\alpha D_1$ from the position 600 along the real axis 654 towards the position 602, and the pole is a distance $\alpha D_1$ from the position 600 along the real axis 654 towards the position 604.

Thus, as $\alpha$ increases from 0 (the configuration in FIG. 6a) to 1 (the configuration in FIG. 6c), the zero moves along the real axis 654 from the position 600 to the position 602 and the pole moves along the real axis 654 from the position 600 to the position 604.

FIG. 6e is a z-plane pole-zero diagram for a shelving filter with an effective order $n_e$ of 2.

This shelving filter is formed from:

(i) A 2nd order filter section giving two complex-valued zeros and two complex-valued poles at the positions of the zeros and the poles for a 2nd order shelving filter formed according to the above-described Method A with low-corner frequency $f_1$ and high-corner frequency $f_2$. The zeros are located at positions 606a and 606b on the curve 650 and the poles are located at positions 608a and 608b on the curve 652.

(ii) A 1st order filter section giving a zero and a pole both located at the position 600 on the real axis 654 halfway between the curve 650 and the curve 652. This 1st order filter section thus has no actual effect on the resulting shelving filter (and so could be omitted). This 1st order filter section is the same as the 1st order filter section in FIG. 6a.

FIG. 6d is a z-plane pole-zero diagram for a shelving filter with an effective order $n_e=1+\alpha$, where $0<\alpha<1$, so that the rate of change of gain between the low-corner frequency $f_1$ and the high-corner frequency $f_2$ is $-n_e r_B$ dB per octave.

This shelving filter is formed from:

(i) A 2nd order filter section giving two complex-valued zeros and two complex-valued poles. If the distance along the curve 650 between the position 602 and the position 606a is $D_2$, then one of the complex zeros is positioned a distance $\alpha D_2$ from the position 602 along the curve 650 towards the position 606a. The other complex-valued zero is positioned a distance $\alpha D_2$ from the position 602 along the curve 650 towards the position 606b. Similarly, if the distance along the curve 652 between the position 604 and the position 608a is $D_3$, then one of the complex poles is positioned a distance $\alpha D_3$ from the position 604 along the curve 652 towards the position 608a. The other complex-valued pole is positioned a distance $\alpha D_3$ from the position 604 along the curve 652 towards the position 608b.

(ii) A 1st order filter section giving a real-valued zero and a real-valued pole, with the real-valued zero being a distance $\alpha D_1$ from the position 604 along the real axis 654 towards the position 600, and the real-valued pole being a distance $\alpha D_1$ from the position 602 along the real axis 654 towards the position 600.

The configuration of FIG. 6c can be viewed as having an additional pole and zero at the position 602 (which therefore cancel each other out) and an additional pole and zero at the position 604 (which therefore cancel each other out). Thus, as $\alpha$ increases from 0 (the configuration in FIG. 6c) to 1 (the configuration in FIG. 6e), a real-valued zero moves from the position 604 to the position 600 and a real-valued pole moves from the position 602 to the position 600. Similarly, the complex-valued zeros move along the curve 650 from the positions 602 and 602 to the positions 606a and 606b, and the complex-valued poles move along the curve 652 from the positions 604 and 604 to the positions 608a and 608b.

FIG. 6g is a z-plane pole-zero diagram for a shelving filter with an effective order $n_e$ of 3.

This shelving filter is formed from:

(i) A 2nd order filter section giving two complex-valued zeros and two complex-valued poles at the positions of the complex zeros and the complex poles for a 3rd order shelving filter formed according to the above-described Method A with low-corner frequency $f_1$ and high-corner frequency $f_2$. The complex zeros are located at positions 610a and 610b on the curve 650 and the complex poles are located at positions 612a and 612b on the curve 652.

(ii) A 1st order filter section giving a real-valued zero located at the position 602 on the real axis 654 and a real-valued pole located at the position 604 on the real axis 654. This is the same as the 1st order filter section in FIG. 6c.

FIG. 6f is a z-plane pole-zero diagram for a shelving filter with an effective order $n_e=2+\alpha$, where $0<\alpha<1$, so that the rate of change of gain between the low-corner frequency $f_1$ and the high-corner frequency $f_2$ is $-n_e r_B$ dB per octave.

This shelving filter is formed from:

(i) A 2nd order filter section having two complex-valued zeros and two complex-valued poles. If the distance along the curve 650 between the position 606a and the position 610a is $D_4$, then one of the complex zeros is positioned a distance $\alpha D_4$ from the position 606a along the curve 650 towards the position 610a. The other complex-valued zero is positioned a distance $\alpha D_4$ from the position 606b along the curve 650 towards the position 610b. Similarly, if the distance along the curve 652 between the position 608a and the position 612a is $D_5$, then one of the complex poles is positioned a distance $\alpha D_5$ from the position 608a along the curve 652 towards the position 612a. The other complex-valued pole is positioned a distance $\alpha D_5$ from the position 608b along the curve 652 towards the position 612b.

(ii) A 1st order filter section giving a real-valued zero and a real-valued pole, with the real-valued zero being a distance $\alpha D_1$ from the position 600 along the real axis 654 towards the position 602, and the real-valued pole being a distance $\alpha D_1$ from the position 600 along the real axis 654 towards the position 604. This is the same as the 1st order filter section for FIG. 6b.

Thus, as $\alpha$ increases from 0 (the configuration in FIG. 6e) to 1 (the configuration in FIG. 6g), the real-valued zero moves from the position 600 to the position 602 along the real axis 654 and the real-valued pole moves from the position 600 to the position 604 along the real axis 654. Similarly, the complex-valued zeros move along the curve 650 from the positions 606a and 606b to the positions 610a and 610b respectively, and the complex-valued poles move along the curve 652 from the positions 608a and 608b to the positions 612a and 612b respectively.

FIG. 6i is a z-plane pole-zero diagram for a shelving filter with an effective order $n_e$ of 4.

This shelving filter is formed from:

(i) A 2nd order filter section giving two complex-valued zeros and two complex-valued poles at the positions of the two zeros and the two poles closest to the unit circle 500 for a 4th order shelving filter formed according to the above-Method A with low-corner frequency $f_1$ and high-corner frequency $f_2$. The zeros are located at positions 613a and 613b on the curve 650 and the poles are located at positions 616a and 616b on the curve 652.

(ii) A 2nd order filter section giving two complex-valued zeros and two complex-valued poles at the positions of the other two zeros and the other two poles for the 4th order shelving filter formed according to the above-described Method A. The zeros are located at positions 614a and 614b on the curve 650 and the poles are located at positions 618a and 618b on the curve 652.

(iii) A 1st order filter section giving a zero and a pole both located at the position 600 on the real axis halfway between curve 650 and the curve 652. This 1st order filter section thus has no actual effect on the resulting shelving filter (and so could be omitted). This 1st order filter section is the same as the 1st order filter section in FIGS. 6a and 6e.

FIG. 6h is a z-plane pole-zero diagram for a shelving filter with an effective order $n_e=3+\alpha$, where $0<\alpha<1$, so that the rate of change of gain between the low-corner frequency $f_1$ and the high-corner frequency $f_2$ is $-n_e r_B$ dB per octave.

This shelving filter is formed from:

(i) A 2nd order filter section giving two complex-valued zeros and two complex-valued poles. If the distance along the curve 650 between the position 610a and the position 613a is $D_6$, then one of the complex zeros is positioned a distance $\alpha D_6$ from the position 610a along the curve 650 towards the position 613a. The other complex-valued zero is positioned a distance $\alpha D_6$ from the position 610b along the curve 650 towards the position 613b. Similarly, if the distance along the curve 652 between the position 612a and the position 616a is $D_7$, then one of the complex poles is positioned a distance $\alpha D_7$ from the position 612a along the curve 652 towards the position 616*a*. The other complex-valued pole is positioned a distance $\alpha D_7$ from the position 612*b* along the curve 652 towards the position 616*b*.

(i) A 2nd order filter section giving two complex-valued zeros and two complex-valued poles. If the distance along the curve 650 between the position 602 and the position 614*a* is $D_8$, then one of the complex zeros is positioned a distance $\alpha D_8$ from the position 602 along the curve 650 towards the position 614*a*. The other complex-valued zero is positioned a distance $\alpha D_8$ from the position 602 along the curve 650 towards the position 614*b*. Similarly, if the distance along the curve 652 between the position 604 and the position 618*a* is $D_9$, then one of the complex poles is positioned, a distance $\alpha D_8$ from the position 604 along the curve 652 towards the position 618*a*. The other complex-valued pole is positioned a distance $\alpha D_8$ from the position 604 along the curve 652 towards the position 618*b*.

(ii) A 1st order filter section giving a real-valued zero and a real-valued pole, with the real-valued zero being a distance $\alpha D_1$ from the position 604 along the real axis 654 towards the position 600, and the real-valued pole being a distance $\alpha D_1$ from the position 602 along the real axis 654 towards the position 600. This 1st order filter section is the same as the 1st order filter section in FIG. 6*d*.

The configuration of FIG. 6*g* can be viewed as having an additional pole and zero at the position 602 (which therefore cancel each other out) and an additional pole and zero at the position 604 (which therefore cancel each other out). Thus, as $\alpha$ increases from 0 (the configuration in FIG. 6*g*) to 1 (the configuration in FIG. 6*i*), a real-valued zero moves from the position 604 to the position 600 along the real axis 654 and a real-valued pole moves from the position 602 to the position 600 along the real axis 654. Similarly, the complex-valued zeros move along the curve 650 from the positions 602, 602, 610*a* and 610*b* to the positions 614*a*, 614*b*, 613*a* and 613*b* respectively, and the complex-valued poles move along the curve 652 from the positions 604, 604, 612*a* and 612*b* to the positions 618*a*, 618*b*, 616*a* and 616*b* respectively.

The skilled person will appreciate that this method may be extended analogously to higher effective filter orders $n_e$.

In each of FIG. 6*d* onwards:

The 2nd-order filter section(s) together provide a first shelving filter, each 2nd-order filter corresponding to a complex-valued zero (and its complex conjugate) and a complex-valued pole (and its complex conjugate).

The 1st-order filter section that is used provides a second shelving filter, of order 1, the 1st-order filter corresponding to the real-valued zero and the real-valued pole.

The low-corner frequency for the first shelving filter is $f_1$ and the high-corner frequency for the first shelving filter is $f_2$.

The order of the first shelving filter is determined as being twice the number of 2nd-order filter sections used. In particular, the order n for the first shelving filter is $$n = 2\left\lceil \frac{n_e - 1}{2} \right\rceil.$$

The positions of the real-valued pole and zero from the 1st-order filter section determine the low-corner frequency $f_3$ and the high-corner frequency $f_4$ for the second shelving filter. As the real-values pole and zero are always between the curves 650 and 652, this results in $f_1 \le f_3 \le f_4 \le f_2$.

When the effective order $n_e = w + \alpha$, where $0 < \alpha < 1$ and w is an even positive integer, (i) if a falling shelving filter is to be produced, then the first and second shelving filters are both falling shelving filters (ii) if a rising shelving filter is to be produced, then the first and second shelving filters are both rising shelving filters.

When the effective order $n_e = w + \alpha$, where $0 < \alpha < 1$ and w is an odd positive integer, (i) if a falling shelving filter is to be produced, then the first shelving filter is a falling shelving filter and the second shelving filter is a rising shelving filter (ii) if a rising shelving filter is to be produced, then the first shelving filter is a rising shelving filter and the second shelving filter is a falling shelving filter.

In general, to generate a Method F shelving filter with effective order $n_e = w + \alpha$, where $0 < \alpha < 1$ and w is an integer, with low-corner frequency $f_1$ and high-corner frequency $f_2$:

(i) the complex-valued zeros for the shelving filter are at positions interpolated between zeros for a Method A shelving filter of order w with low-corner frequency $f_1$ and high-corner frequency $f_2$ and zeros for a Method A shelving filter of order w+1 with low-corner frequency $f_1$ and high-corner frequency $f_2$;

(ii) the complex-valued poles for the shelving filter are at positions interpolated between poles for a Method A shelving filter of order w with low-corner frequency $f_1$ and high-corner frequency $f_2$ and the poles for a Method A shelving filter of order w+1 with low-corner frequency $f_1$ and high-corner frequency $f_2$; and (iii) the real-valued zero and pole are at interpolated positions on the real-axis between the curves 650 and 652. This is interpolation along the real-axis in the log-frequency domain.

Thus, for a rising shelving filter with low-corner frequency $f_1$ and high-corner frequency $f_2$:

(i) each zero of the transfer function of the first shelving filter is located at a respective location determined by interpolating between (a) the location of a corresponding pole of the transfer function of a first low-pass basis-filter having a cut-off frequency of $f_1$ and an order of n−1 and (b) the location of a corresponding pole of the transfer function of a second low-pass basis-filter having a cut-off frequency of $f_1$ and an order of n; and (ii) each pole of the transfer function of the first shelving filter is located at a respective location determined by interpolating between (c) the location of a corresponding pole of the transfer function of a third low-pass basis-filter having a cut-off frequency of $f_2$ and an order of n−1 and (d) the location of a corresponding pole of the transfer function for a fourth low-pass basis-filter having a cut-off frequency of $f_2$ and an order of n.

Furthermore, for a falling shelving filter with low-corner frequency $f_1$ and high-corner frequency $f_2$:

(i) each pole of the transfer function of the first shelving filter is located at a respective location determined by interpolating between (a) the location of a corresponding pole of the transfer function of a first low-pass basis-filter having a cut-off frequency of $f_1$ and an order of n−1 and (b) the location of a corresponding pole of the transfer function of a second low-pass basis-filter having a cut-off frequency of $f_1$ and an order of n; and (ii) each zero of the transfer function of the first shelving filter is located at a respective location determined by interpolating between (c) the location of a corresponding pole of the transfer function of a third low-pass basis-filter having a cut-off frequency of $f_2$ and an order of n−1 and (d) the location of a corresponding pole of the transfer function for a fourth low-pass basis-filter having a cut-off frequency of $f_2$ and an order of n.

The interpolation described above with reference to FIGS. 6a-i for the positions of the complex-valued poles and zeros is interpolation along the curve 650 or 652. However, in another embodiment, this interpolation is performed along a straight line between zeros (or poles respectively) for a Method A shelving filter of order w with low-corner frequency $f_1$ and high-corner frequency $f_2$ and zeros (or poles respectively) for a Method A shelving filter of order w+1 with low-corner frequency $f_1$ and high-corner frequency $f_2$.

In a preferred embodiment, when multiple 2nd-order filter sections are used (for example in FIGS. 6h and 6i), then a first 2nd-order filter section is based on the two poles and the two zeros that are nearest to the unit circle 500, a second 2nd-order filter section is based on the two poles and the two zeros next nearest to the unit circle 500, and so on. Thus, if s 2nd-order filter sections are used (for s>1), then the t-th 2nd order filter section (1≤t≤s) is based on the pole (and its complex conjugate) that is the t-th closest complex pole to the unit circle 500 and on the zero (and its complex conjugate) that is the t-th closest complex zero to the unit circle 500.

Figure 9:
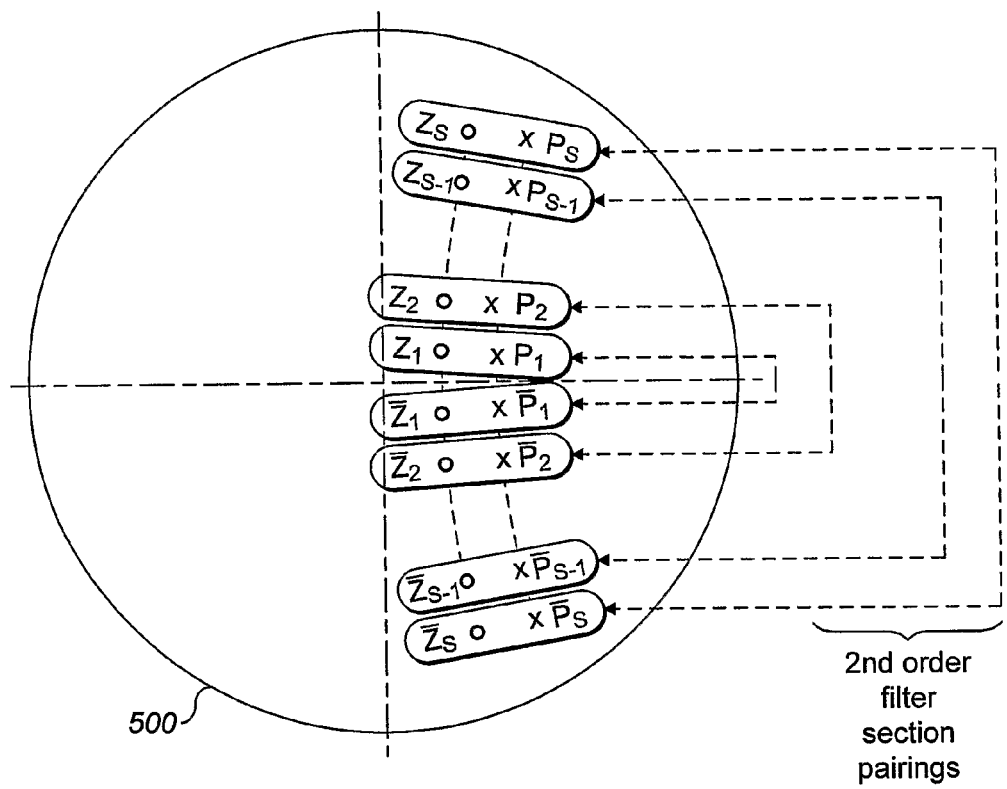
FIG. 9 schematically illustrates zeros $z_1 \ldots z_s$ and their complex conjugate zeros $\bar{z}_1 \ldots \bar{z}_s$ and poles $p_1 \ldots p_s$ and their complex conjugate poles $\bar{p}_1 \ldots \bar{p}_s$ for a shelving filter.

This is schematically illustrated in FIG. 9, which schematically illustrates zeros $z_1 \ldots z_s$ and their complex conjugate zeros $\bar{z}_1 \ldots \bar{z}_s$ and poles $p_1 \ldots p_s$ and their complex conjugate poles $\bar{p}_1 \ldots \bar{p}$ for a shelving filter, in which zero $z_1$ is closer to the unit circle 500 than zero $z_j$ if i>j, and in which pole $p_i$ is closer to the unit circle 500 than pole $p_j$ if i>j. The 2nd-order filter sections in this preferred embodiment are essentially individual filters that are formed by the pairings $(z_i, \bar{z}_i, p_i, \bar{p}_i)$, with respective individual transfer functions of $$\frac{(z-z_i)(z-\bar{z}_i)}{(z-p_i)(z-\bar{p}_i)}.$$

Such a formation of 2nd-order filter sections assists in the transition from one set of generated filters to another set of generated filters at the step S206 after the step S208 has been used. This will be described in more detail later.

However, it will be appreciated that the 2nd-order filter sections need not be generated in this particular manner.

(5) Determining a Set of Filters

Figure 7:
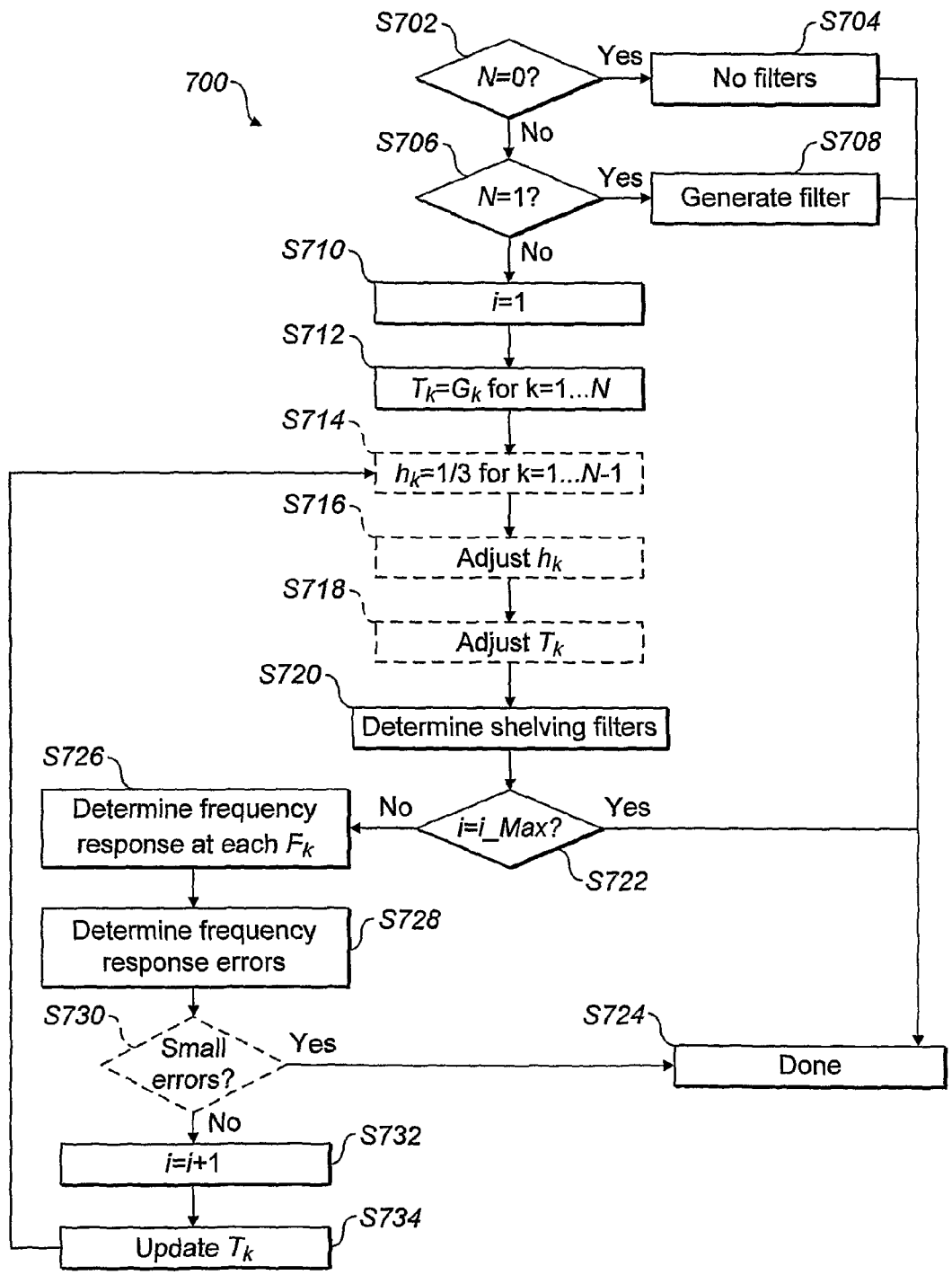
FIG. 7 is a flowchart schematically illustrating the processing according to an embodiment of the invention for determining a set of filters.

FIG. 7 is a flowchart schematically illustrating the processing 700 according to an embodiment of the invention for determining a set of filters at the step S204. The plurality of filters is determined based upon the currently specified set of frequency response indicators, which may be either the set of frequency response indicators as initialised at the step S202 or may be the set of frequency response indicators as updated at the step S208.

The plurality of frequency response indicators to use (i.e. the plurality of frequency response indicators initialised at the step S202 or updated at the step S208 as appropriate) shall be referred to below as the set $\{(F_n, G_n): n=1 \ldots N\}$, where: (i) there are N frequency response indicators, with N≥0; (ii) for the n-th frequency response indicator (where the corresponding user-defined frequency is $F_n$ and the user-defined gain is $G_n$; and (iii) for convenience of notation, it is assumed that $F_n < F_{n+1}$ for 1≤n<N. Two frequency response indicators $(F_n, G_n)$ and $(F_m, G_m)$ shall be referred to as adjacent frequency response indicators if m=n+1 or n=m+1 in the above ordering, i.e. there is no frequency response indicator that specifies a frequency between $F_n$ and $F_m$.

At a step S702, it is determined whether N equals 0, i.e. whether the set of frequency response indicators is empty. If N equals 0, then processing continues at a step S704, at which the set of filters to use is set to be empty (so that at the step S206, the audio data would be unaffected by the processor 114) and then processing continues to a step S724, to be described later. Otherwise, if N is not equal to 0, so that there is at least one frequency response indicator, then processing continues at a step S706.

At the step S706, it is determined whether N equals 1, i.e. whether a single frequency response indicator has been specified. If N equals 1, then processing continues at a step S708, at which a filter with a frequency response having a constant gain equal to $G_1$ is generated (methods for doing this being well-known in this field of technology) and then processing continues to the step S724, to be described later. Alternatively, the processing at the step S708 may be the same as at the step S704 (i.e. no filter is generated), in which case filters will only be generated once at least two frequency response indicators have been specified.

If N is not equal to 1, so that there is there is a plurality of frequency response indicators, then processing continues at a step S710. At the step S710, a value i is initialised to the value 1. The processing 700 may make use of one or more iterations in order to determine the set of filters and the value i is an iteration-counter representing the number of the current iteration.

Next, at a step S712, for each frequency response indicator $(F_k, G_k)$, a corresponding target gain $T_k$ is initialised to be the user-specified gain $G_k$. The purpose of the target gains $T_k$ will be described later.

Next, at an optional step S714, for each pair of adjacent frequency response indicators $(F_k, G_k)$ and $(F_{k+1}, G_{k+1})$, a corresponding frequency-proportion $h_k$ is initialised to a predetermined initialisation value. The purpose of the frequency-proportions $h_k$ will be described later. A value of ⅓ has been found to be a suitable predetermined initialisation value for the frequency-proportions $h_k$, as discussed in more detail later.

At an optional step S716, the frequency proportions $h_k$ are adjusted. This will be described in more detail later. However, in some embodiments, the step S716 is omitted.

At an optional step S718, the target gains $T_k$ are adjusted. This will be described in more detail later. However, in some embodiments, the step S718 is omitted.

At a step S720, a shelving filter is determined for each adjacent pair of frequency response indicators $(F_k, G_k)$ and $(F_{k+1}, G_{k+1})$. Some embodiments of the invention generate a shelving filter for an adjacent pair of frequency response indicators $(F_k, G_k)$ and $(F_{k+1}, G_{k+1})$ using one of the Methods A-F described above.

For an adjacent pair of frequency response indicators $(F_k, G_k)$ and $(F_{k+1}, G_{k+1})$, the corresponding shelving filter is determined as follows:

In an embodiment that does not make use of the frequency-proportions $h_k$, the low-corner frequency and the high corner frequency to use for generating the corresponding shelving filter are $F_k$ and $F_{k+1}$ respectively. In particular, if one of the above-described Methods A-F is used, then $f_1 = F_k$ and $f_2 = F_{k+1}$.

In an embodiment that does make use of the frequency-proportions $h_k$, the low-corner frequency $f_1$ and the high corner frequency $f_2$ to use for generating the corresponding shelving filter are the values $F_k$ and $F_{k+1}$ respectively, adjusted according to the value $h_k$. The Methods A-F may then be used to generate the shelving filter using the low-corner frequency $f_1$ and the high corner frequency $f_2$.

In particular, if $h_k$ is less than 1, then the range from $f_1$ to $f_2$ lies within the range from $F_k$ to $F_{k+1}$; whereas if $h_k$ is greater than 1, then the range from $F_k$ to $F_{k+1}$ lies within the range from $f_1$ to $f_2$; and if $h_k=1$ then $f_1=F_k$ and $f_2=F_{k+1}$.

In one embodiment of the invention, $f_1$ and $f_2$ are chosen such that the size of the range from $f_1$ to $f_2$ is $h_k$ times the size of the range from $F_k$ to $F_{k+1}$, so that $f_2-f_1=h_k(F_{k+1}-F_k)$. Preferably then, if $h_k$ is less than 1, then the range from $f_1$ to $f_2$ is substantially centred in the range from $F_k$ to $F_{k+1}$; whereas if $h_k$ is greater than 1, then the range from $F_k$ to $F_{k+1}$ is substantially centred in the range from $f_1$ to $f_2$. Thus, then, preferably $f_2+f_1=F_{k+1}+F_k$. From these two equations, the values of $f_1$ to $f_2$ can be determined.

In another embodiment of the invention, $f_1$ and $f_2$ are chosen such that the size of the range from $\log f_1$ to $\log f_2$ is $h_k$ times the size of the range from $\log F_k$ to $\log F_{k+1}$, so that $\log f_2 - \log f_1 = h_k(\log F_{k+1} - \log F_k)$, i.e. $f_2/f_1 = (F_{k+1}/F_k)^{h_k}$. Preferably then, if $h_k$ is less than 1, then the range from $\log f_1$ to $\log f_2$ is substantially centred in the range from $\log F_k$ to $\log F_{k+1}$; whereas if $h_k$ is greater than 1, then the range from $\log F_k$ to $\log F_{k+1}$ is substantially centred in the range from $\log f_1$ to $\log f_2$. Thus, then, preferably $\log f_2 + \log f_1 = \log F_{k+1} + \log F_k$, i.e. $f_2 f_1 = F_{k+1} F_k$. From these two equations, the values of $f_1$ to $f_2$ can be determined.

The purpose of using the frequency-proportions will be described later.

The shelving filter is generated using the target gain $T_k$ at the above-determined low-corner frequency $f_1$ and the target gain $T_{k+1}$ at the above-determined high-corner frequency $f_2$.

If $k=1$, then the shelving filter is generated with the aim of having a gain of $T_1$ at frequency $F_1$ and a change of gain of $T_2-T_1$ as the frequency changes from $F_1$ to $F_2$. If $k>1$, then the shelving filter is generated with the aim of having a gain of 0 at frequency $F_k$ and a change of gain of $T_{k+1}-T_k$ as the frequency changes from $F_k$ to $F_{k+1}$. Thus, the actual gains achieved at the frequency response indicators will be substantially close to the target values $T_k$. However, it will be appreciated that the individual shelving filters could be generated with different gains, but still have the same effective combined gains.

Once the shelving filters have been generated at the step S720, then at a step S722, it is determined whether the iteration-counter i is now a predetermined maximum number of iterations i_Max. If the iteration-counter i equals the predetermined maximum number of iterations i_Max, then processing terminates at the step S724; otherwise, processing continues at a step S726. In this way, the number of iterations performed for the processing 700 for determining the set of filters for the step S204 is at most this predetermined maximum number of iterations. The predetermined maximum number of iterations may be chosen to be a value such that the processing 700 of FIG. 7 is usually expected to have attained, after that predetermined maximum number of iterations, a set of filters whose frequency response is sufficiently close to the desired frequency response, i.e. the amount by which the frequency response resulting from the generated set of filters differs from the desired frequency response does not normally change significantly after i_Max iterations have been performed. A value for i_Max in the range from 3 to 6 has been found to be normally sufficient for this criterion, although values up to 10 or even higher could be used. Alternatively, or additionally, the predetermined maximum number of iterations may be chosen based on the processing capabilities of the processor 114 and/or the amount of processing time to be allowed for performing the iterations. In particular, the value of i_Max may be reduced if the processing capabilities of the processor 114; or the allowed processing time, are relatively low, whereas the value of i_Max may be increased if the processing capabilities of the processor 114, or the allowed processing time, are relatively high. In this way, real-time processing of audio data at the step S206 can be performed with real-time generation of the set of filters, since the maximum number of iterations for the processing 700 can be set to be a suitable value so as not to cause too significant a delay in the generation of the set of filters to use to process the audio data.

If the current iteration is the last iteration, then processing will have progressed from the step S722 to the step S724. At the step S724, the coefficients for the generated filters may be calculated (methods for doing this being well-known in this field of technology). Additionally, if a visual display of the frequency response of the combination of the set of filters is to be displayed (for example, the curve 304 on the GUI 301), then that frequency response may also be calculated and then displayed (methods for doing this being well-known in this field of technology).

If the current iteration is not the last iteration, then processing will have progressed from the step S722 to the step S726. At the step S726, for each frequency $F_k$ associated with a frequency response indicator, the processor 114 determines the corresponding frequency response at that frequency $F_k$ resulting from the combination of the determined set of filters. Methods for doing this are well known and shall therefore not be described in detail herein. In the following description, the gain of the frequency response resulting from the combination of the set of filters at frequency $F_k$ will be denoted by $A_k$.

Then, at a step S728, an error value $e_k$ for each of the frequency response indicators is determined, where $e_k = A_k - G_k$ for $k=1 \ldots N$.

At an optional step S730, it is determined whether the error (or difference) between the desired frequency response and the frequency response resulting from the combination of the determined set of filters is sufficiently small. This may be achieved in a variety of ways. For example, one or more of the following methods may be used:

The error (or difference) between the desired frequency response and the frequency response resulting from the combination of the determined set of filters is considered to be sufficiently small if the magnitude of each error value $e_k$ is less than a predetermined error threshold E, and is not sufficiently small otherwise.

The error (or difference) between the desired frequency response and the frequency response resulting from the combination of the determined set of filters is considered to be sufficiently small if $$\left(\frac{1}{N}\sum_{k=1}^{N} e_k^p\right)^{\frac{1}{p}} < E$$

(for a positive value of p, such as p=2, and a predetermined error threshold E), and is not sufficiently small otherwise.

This example above involves calculating a particular average of the error values $e_k$. For example, when p=1, then the arithmetic mean of the error values $e_k$ is used, whilst if p=2, then the RMS of the error values $e_k$ is used. However, it will be appreciated that other averages (such as mode, median, etc.) could be used.

It will be appreciated that embodiments of the invention may use any other measure of the difference between the frequency response resulting from the combination of the generated set of filters and the desired frequency response.

If it is determined that the error (or difference) between the desired frequency response and the frequency response resulting from the combination of the determined set of filters is sufficiently small, then processing terminates at the step S724; otherwise, processing continues to a step S732. Thus, for embodiments that use the optional step S730, the processing 700 may terminate without having to perform the maximum number i_Max of iterations, thereby saving on processing time, when the combination of the determined set of filters has a frequency response sufficiently close to the desired frequency response (i.e. when further iterations would be deemed unnecessary).

A relatively high predetermined error threshold E may be used in the above examples in order to reduce the number of iterations that may be required to generate the set of filters, but in doing so potentially producing a frequency response that is more different from the desired frequency response than may otherwise have been attainable with additional iterations. In contrast, a relatively lower predetermined error threshold E may be used in order to try to attain a frequency response that is closer to the desired frequency response, but potentially at the expense of increasing the number of iterations that are then required to generate the set of filters. A predetermined error threshold E of around 0.1 dB may be used for these purposes, as differences in frequency response gain below this level are usually not discernable by a listener.

At the step S732, the iteration-counter i is incremented to reflect the fact that another iteration is about to be performed.

Then, at a step S734, one or more target gains $T_k$ is updated. The processor 114 may adjust one or more of the target gains $T_k$ so that the frequency response gain of the combination of the set of filters generated at the step S720 during the next iteration of the processing 700 at the corresponding frequency $F_k$ is closer to the desired gain $G_k$ than for the currently generated set of filters. In other words, the processor attempts to adjust one or more of the target gains $T_k$ so as to try to produce a smaller value of $|e_k|$ during the next iteration of the processing 700.

In one embodiment, each target gain $T_k$ (for k=1 ... N) is adjusted so that it assumes the value $T_k - \alpha e_k$ for a positive value $\alpha$. The value of $\alpha$ may be a predetermined value. However, in other embodiments of the invention, the value of $\alpha$ may vary depending on the current iteration number, for example, the value of $\alpha$ for the i-th iteration could be proportional, or inversely-proportional, to the value i. In other embodiments of the invention, the value of $\alpha$ may vary depending on the value of one or more of the values $|e_k|$, for example, the value of $\alpha$ for target gain $T_k$ could be a function of the value $|e_k|$.

In preferred embodiments, though, the value of $\alpha$ is the constant 1. Thus, for example, if the k-th user-specified gain $G_k$ is 6.0 dB and the gain achieved at the corresponding frequency $F_k$ by the combination of the set of generated filters is $A_k$=7.2 dB, then the k-th error value is $e_k$=1.2 dB. Thus, at the end of the first iteration, the target gain value $T_k$ may be adjusted from 6.0B down to 4.8 dB, in the attempt to reduce $A_k$ down to 6.0 dB (i.e. the user-specified gain $G_k$) in the second iteration. If, at the end of the second iteration, $A_k$=5.7 dB, then the target gain value $T_k$ may be adjusted from 4.8 dB up to 5.1 dB. This process continues in this fashion for each of the target gains $T_k$.

After the target gains $T_k$ have been updated at the step S734, processing returns to the step S714 so that the next iteration for the processing 700 can be carried out.

Figure 10A:
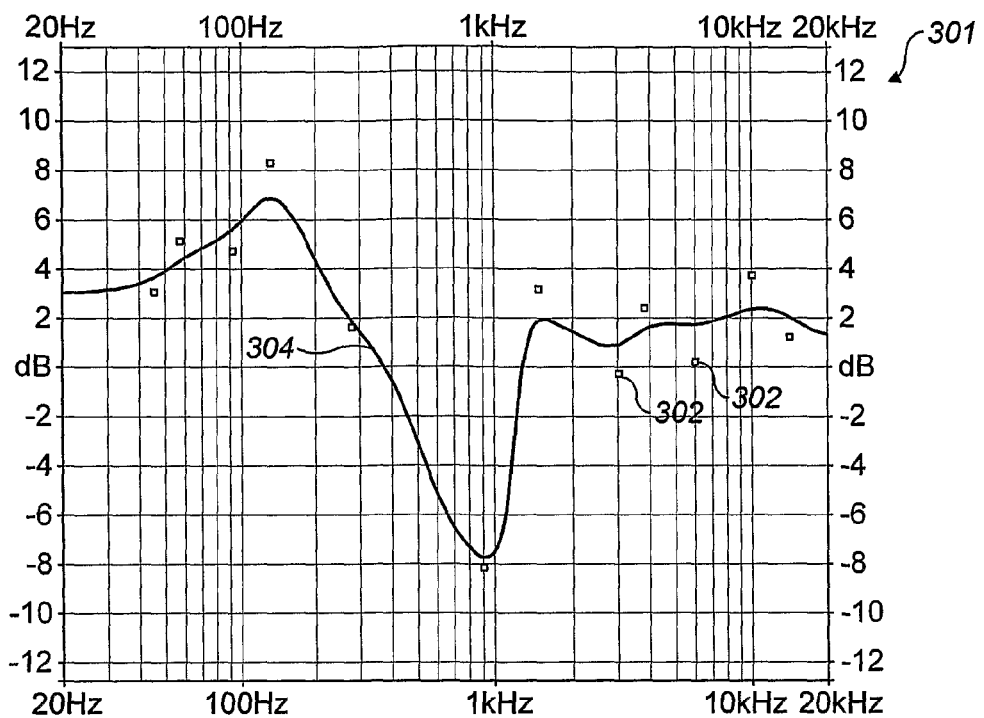
FIGS. 10a-g are example frequency response curves for the set filters generated at seven successive iterations during the processing of FIG. 7 for a given set of frequency response indicators.
Figure 10B:
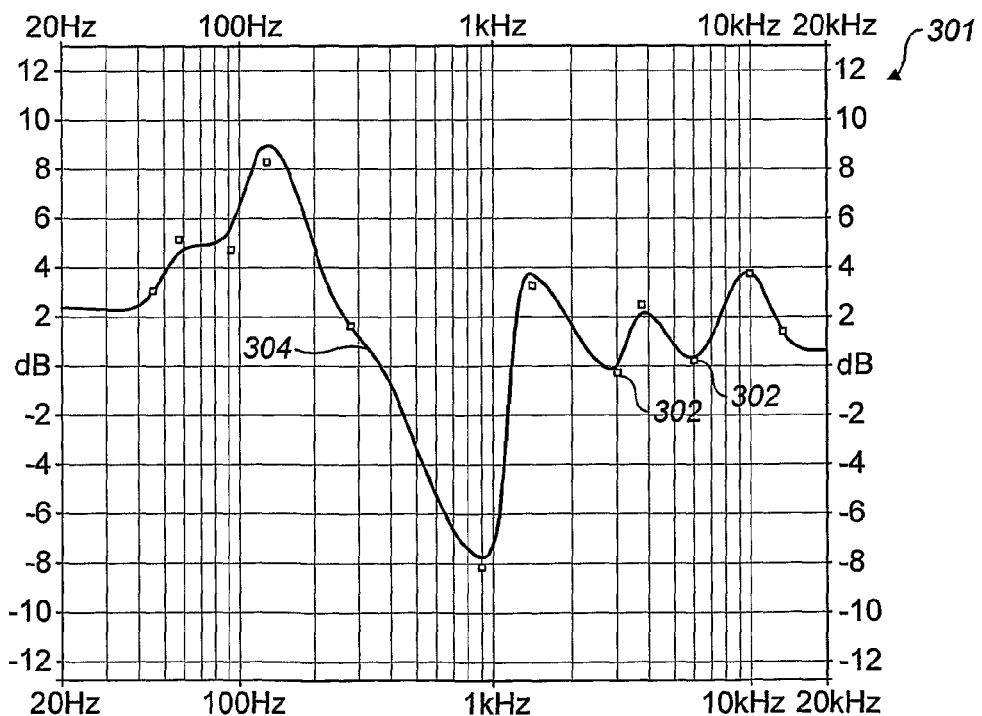
Figure 10C:
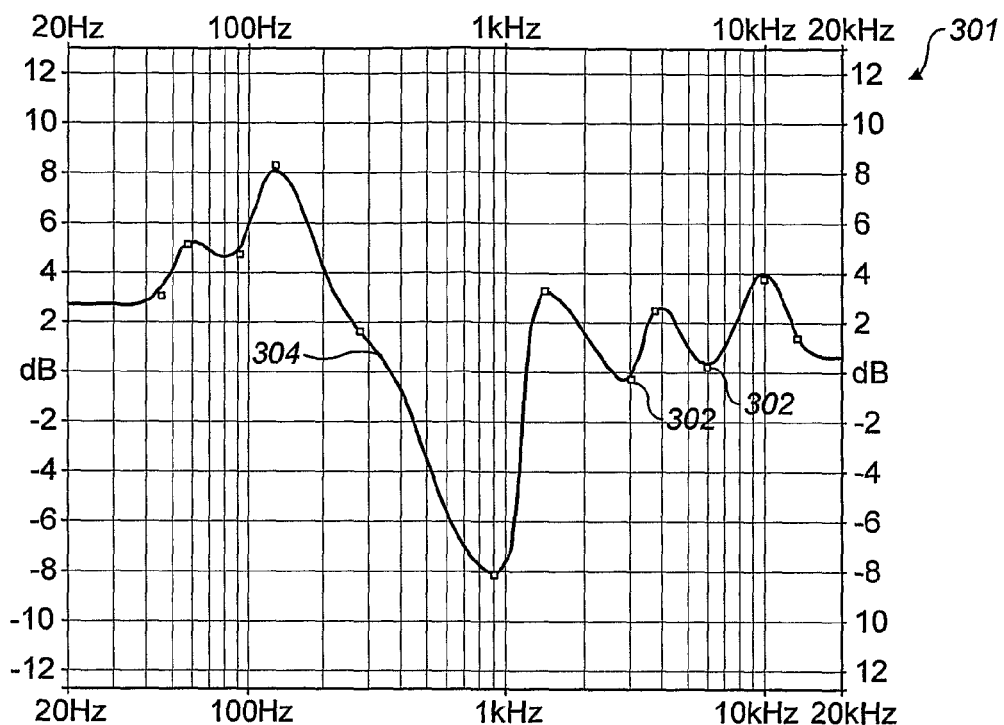
Figure 10D:
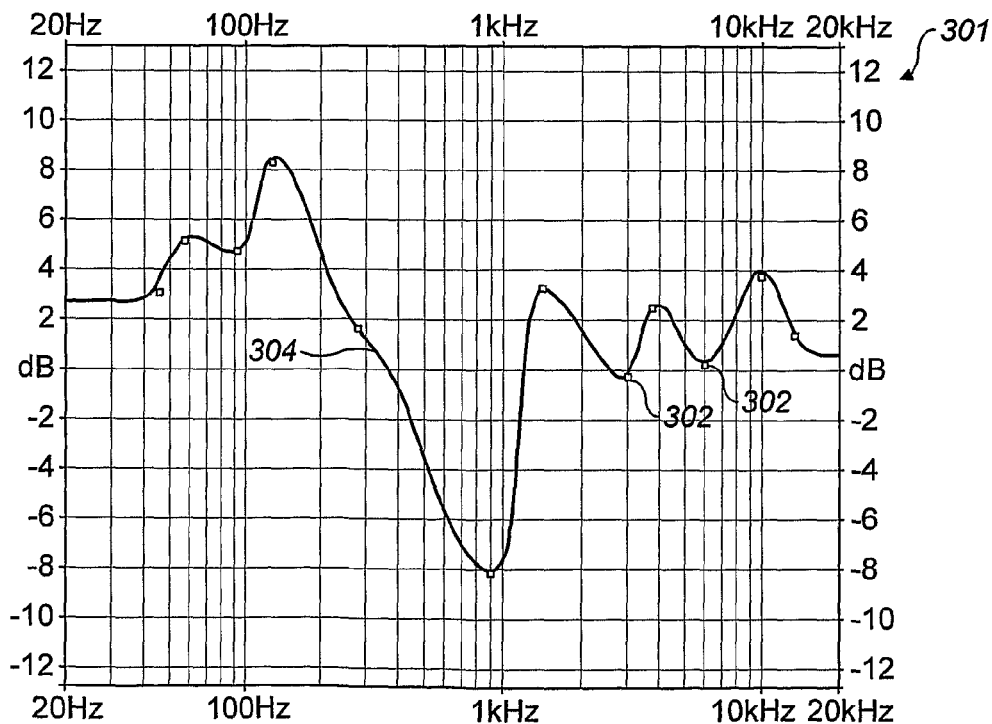
Figure 10E:
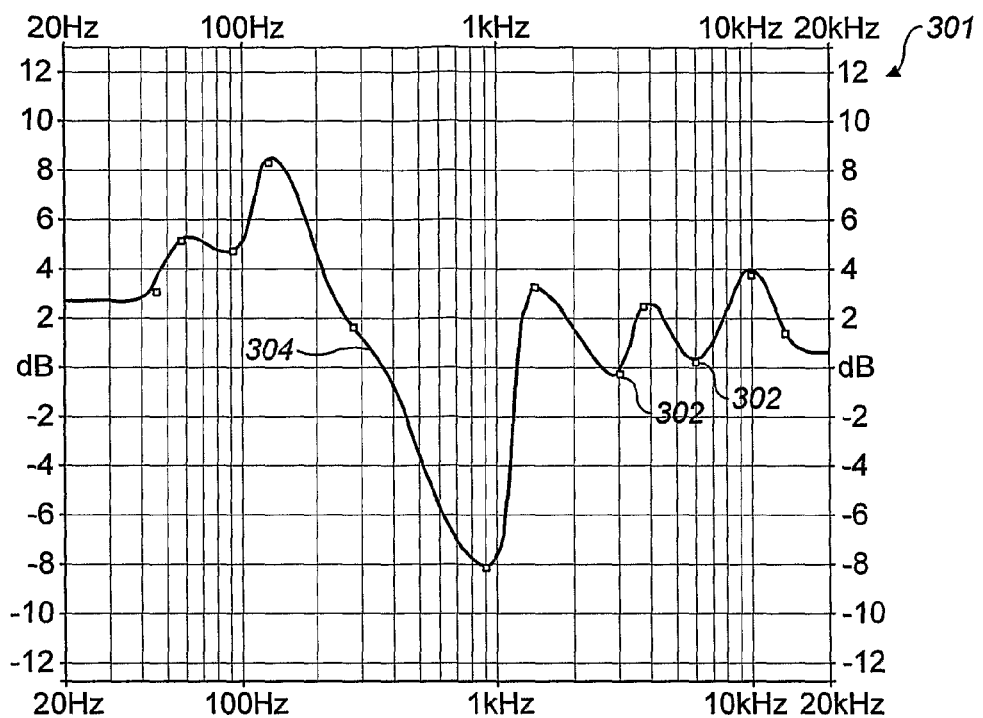
Figure 10F:
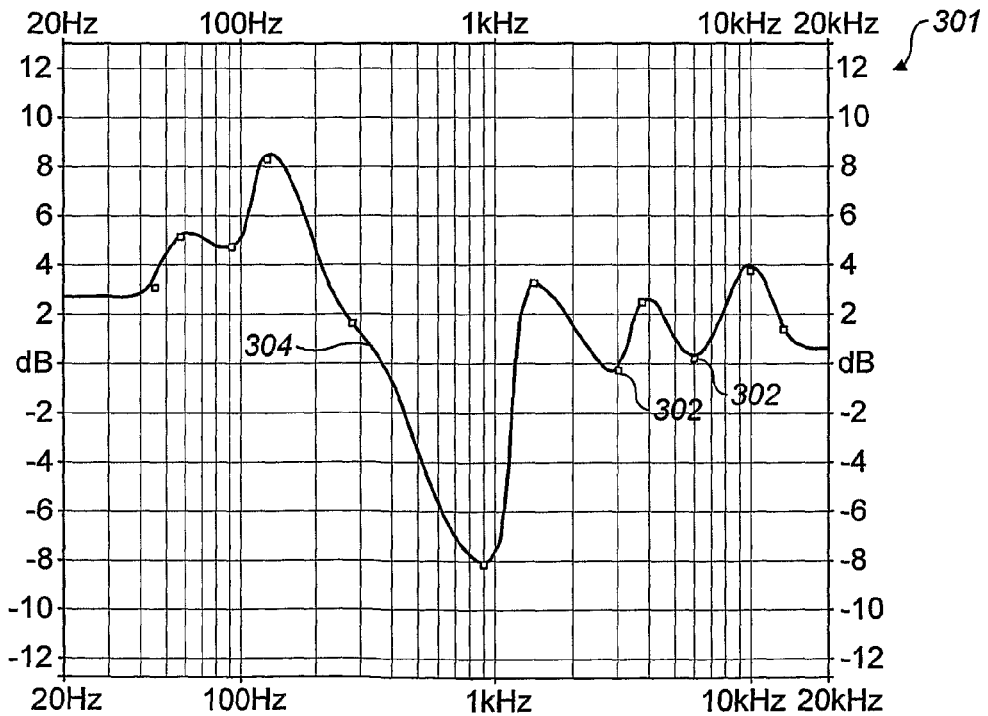
Figure 10G:
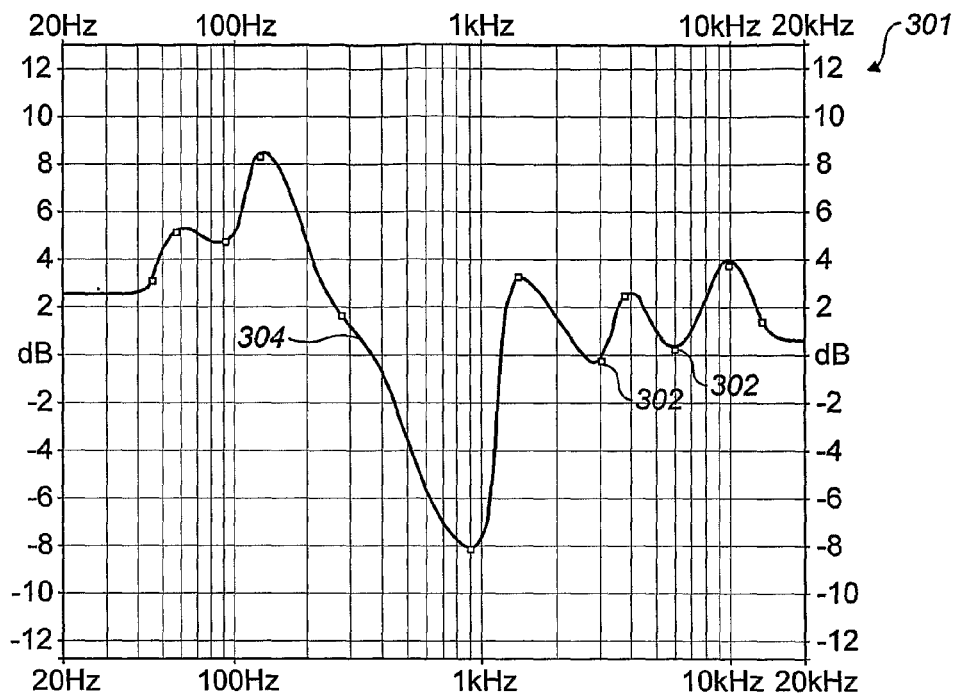

FIGS. 10a-g are example graphs 301 of the frequency response curve 304 for the set filters generated at seven successive iterations during the processing 700 for a given set of frequency response indicators 302. FIG. 10a is the frequency response after the 1st iteration; FIG. 10b is the frequency response after the 2nd iteration; FIG. 10c is the frequency response after the 3rd iteration; FIG. 10d is the frequency response after the 4th iteration; FIG. 10e is the frequency response after the 5th iteration; FIG. 10f is the frequency response after the 6th iteration; and FIG. 10g is the frequency response after the 7th iteration.

As can be seen, after the 1st iteration, the frequency response curve 304 misses most of the frequency response indicators 302. However, from the 3rd iteration onwards, the frequency response curve 304 passes through all of the frequency response indicators 302 virtually exactly.

It will be appreciated that some embodiments of the invention may impose an upper bound on the order of each shelving filter generated at the step S716. This may be due to limitations on the amount of hardware available for implementing such a shelving filter (for example in a DSP), or may be due to wanting to limit the delay involved in audio processing, since a larger order filter inherently results in a longer processing delay, or may be due to limitations on the amount of processing (and therefore power) that is required (the larger the order of a filter, the greater the amount of processing required to apply that filter). Alternatively, or additionally, and for the same reasons, some embodiments of the invention may impose an upper bound on the sum of all of the orders of the shelving filters that are generated at the step S720. As the orders of the filters generated at the step S720 are dependent on the target gains $T_k$ and the low- and high-corner frequencies used for the shelving, filters, the target gains and the low- and high-corner frequencies may be adjusted in an attempt to ensure that the shelving filters that are generated have appropriately sized orders given the above-mentioned constraint(s). This is the purpose of the optional steps S716 and S718, which may be applied in isolation of, in or combination with, each other. Naturally, the step S716 cannot be applied if the frequency-proportions $h_k$ are not being used.

Figure 8A:
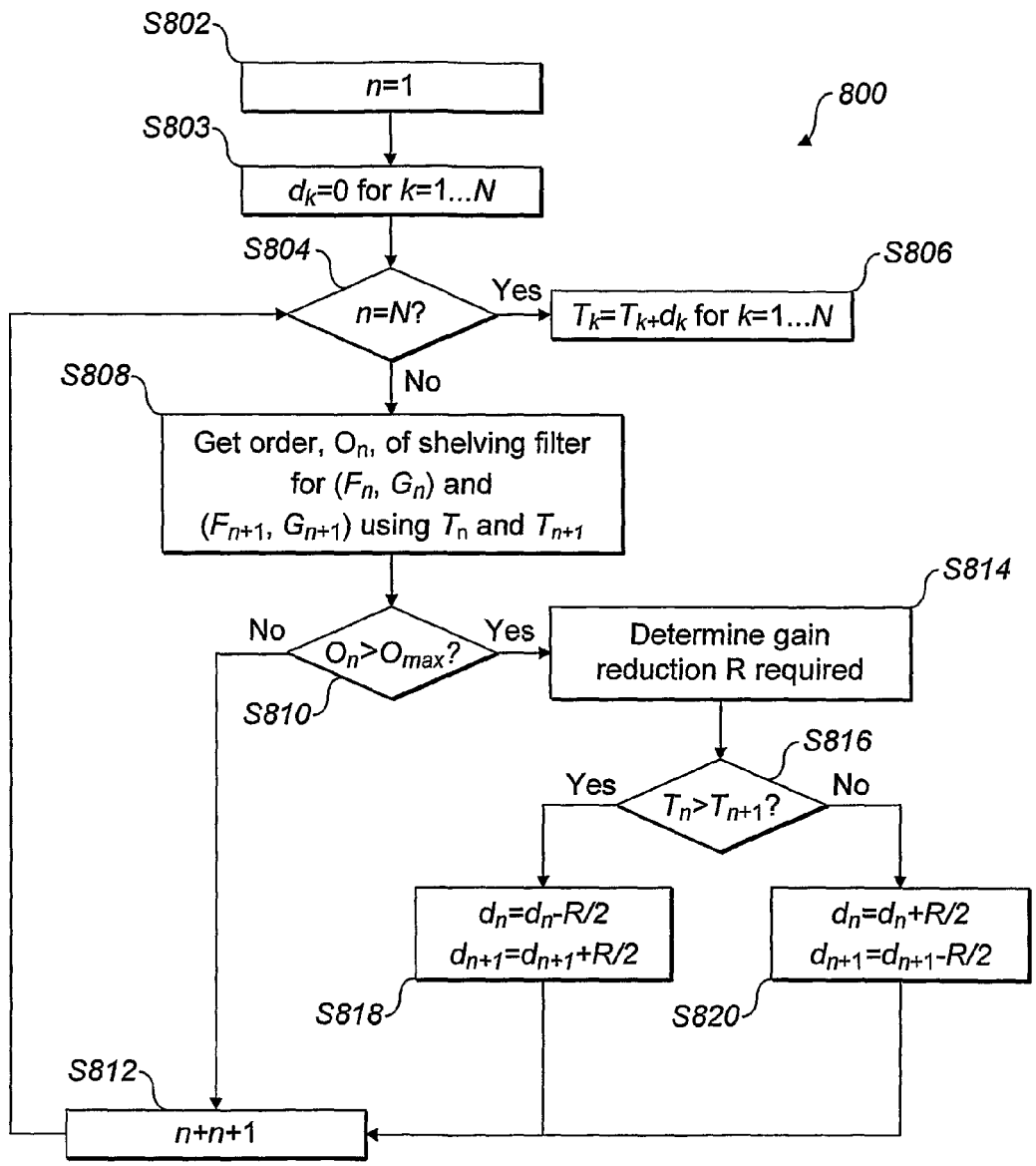
FIGS. 8a and 8b are schematic flow-charts illustrating processing for the processing of FIG. 7 when an upper bound is imposed on the order of each shelving filter to be generated.

FIG. 8a is a schematic flow-chart illustrating processing 800 for the step S718 when an upper bound $O_{max}$ is imposed on the order of each shelving filter generated at the step S720.

At a step S802, a counter n is initialised to a value of 1.

At a step S803, a set of adjustments values $d_k$ (k=1 ... N) is initialised to zero (i.e. $d_k$=0 for k=1 ... N). Each target gain $T_k$ has a corresponding adjustment value $d_k$ that will be calculated during the processing 800 and applied to the target gain $T_k$ at the end of the processing 800.

At a step S804, it is determined whether n is the value N (i.e. the number of frequency response indicators). If so, then each shelving filter to be generated at the step S720 will have been considered by the processing 800 and so processing terminates at the step S806, at which the target gains $T_k$ are adjusted by their corresponding adjustment values $d_k$, i.e. $T_k=T_k+d_k$ for k=1 ... N. Otherwise, processing continues at a step S808.

At the step S808, the order $O_n$ of the shelving filter that would be generated at the step S720 for the pair of adjacent frequency response indicators $(F_n, G_n)$ and $(F_{n+1}, G_{n+1})$ is determined. The order $O_n$ may be determined, for example, using the above-described equations with reference to Methods A-F as appropriate. This determination is based on using the current corresponding target gains $T_n$ and $T_{n+1}$ for these adjacent frequency response indicators, i.e. the target gains $T_n$ and $T_{n+1}$ have not been updated yet during this processing 800.

At a step S810, the required order $O_n$ is compared with the upper bound $O_{max}$. If the required order $O_n$ is not greater than the upper bound $O_{max}$, then no adjustment of the target gains $T_n$ and $T_{n+1}$ is required based on this shelving filter, and so processing continues at a step S812; otherwise processing continues at a step S814.

At the step S812, the counter n is incremented by 1, and then processing returns to the step S804.

Alternatively, the step S814 is reached when the required order $O_n$ would be greater than the imposed upper bound $O_{max}$ on the order for the shelving filters. As such, the target gains $T_n$ and $T_{n+1}$ should be adjusted (at the end of the processing 800 at the step S806) accordingly. Thus, at the step S814, the amount R by which the target gains $T_n$ and $T_{n+1}$ should be brought together (so that that the order of the required shelving filter is reduced) is determined. Here, $R=|T_n-T_{n+1}|-\hat{G}$, where $\hat{G}$ is the magnitude of the change in gain achievable if the order of this shelving filter were set to be $O_{max}$. Bringing the target gains $T_n$ and $T_{n+1}$ closer together reduces the magnitude of the gradient of the frequency response curve between the low- and high-corner frequencies, and hence reduces the order of the shelving filter.

Then, at a step S816, it is determined whether $T_n$ is greater than $T_{n+1}$. If $T_n$ is greater than $T_{n+1}$, then processing continues at a step S818, at which $d_n$ is decreased by R/2 and $d_{n+1}$ is increased by R/2. If $T_n$ is, not greater than $T_{n+1}$, then processing continues at a step S820, at which $d_n$ is increased by R/2 and $d_{n+1}$ is decreased by R/2. However, it will be appreciated that $d_n$ and $d_{n+1}$ may be adjusted by other amounts to attempt to bring $T_n$ and $T_{n+1}$ sufficiently close together. For example: at the step S818, $d_n$ may be decreased by vR and $d_{n+1}$ may be increased by (1−v)R, and at the step S818, $d_n$ may be increased by vR and $d_{n+1}$ may be decreased by (1−v)R, where $0 \leq v \leq 1$. Processing then continues at the step S812.

Figure 8B:
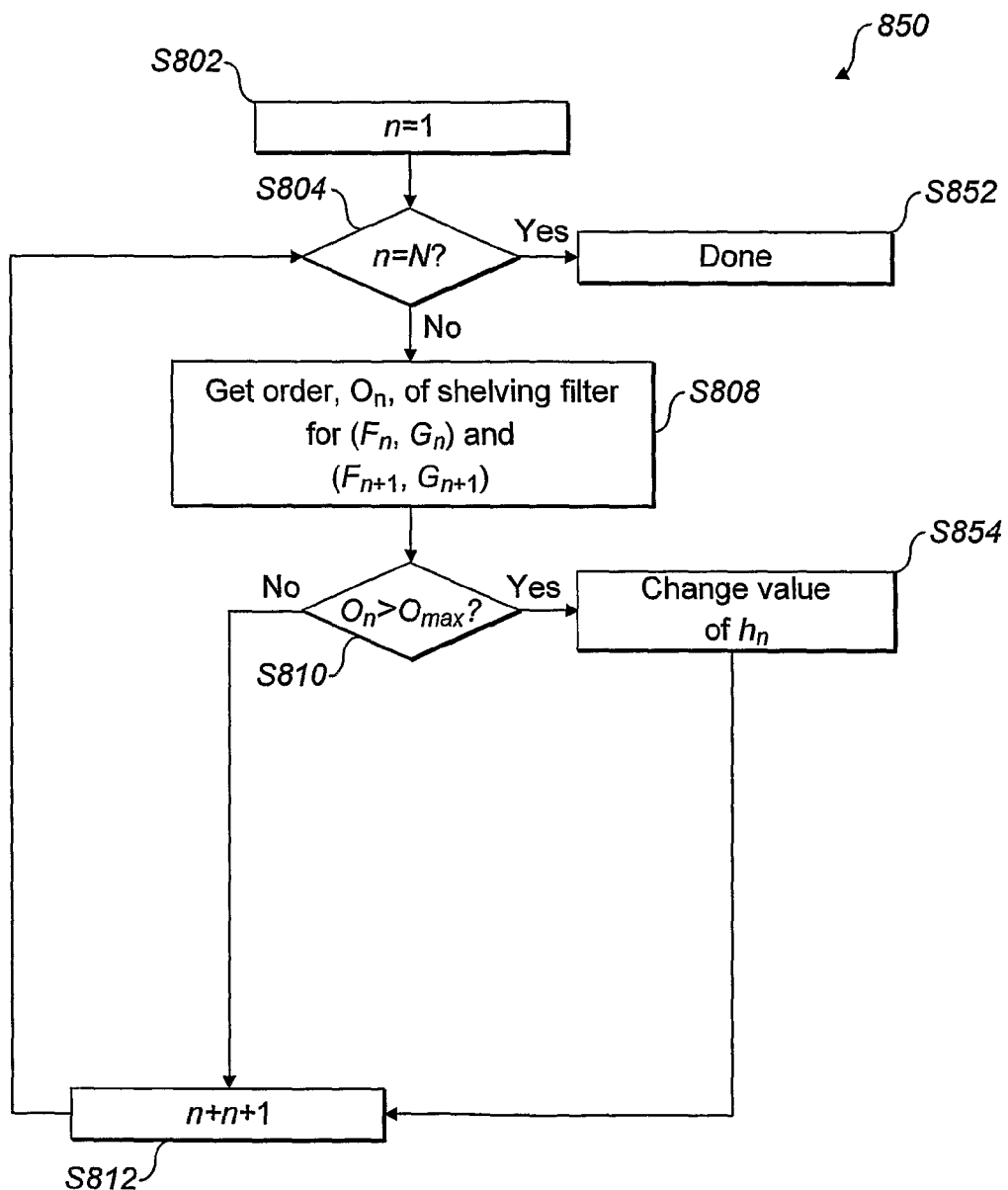

FIG. 8b is a schematic flow-chart illustrating processing 850 for the step S716 when an upper bound $O_{max}$ is imposed on the order of each shelving filter generated at the step S720. The processing 850 is similar to the processing 800 and steps that they share in common are given the same reference numeral and will therefore not be described again.

The processing 850 of FIG. 8b begins at the step S802 of FIG. 8a and proceeds to the step S804 of FIG. 8a (without using the step S803). If, at the step S804, n=N, then processing terminates at a step S852; otherwise, processing continues at the step S808 of FIG. 8a and then on to the step S810 of FIG. 8a.

At the step S810, the required order $O_n$ is compared with the upper bound $O_{max}$. If the required order $O_n$ is not greater than the upper bound $O_{max}$, then no adjustment of the frequency-proportion $h_n$ is required for the current shelving filter, and so processing continues at the step S812; otherwise processing continues at a step S854.

At the step S854, the processor 114 increases the value of $h_n$. This effectively widens the frequency gap between the low-corner frequency and the high-corner frequency for the shelving filter for this pair of frequency response indicators $(F_n, G_n)$ and $(F_{n+1}, G_{n+1})$. This in turn may reduce the order of that shelving filter. Some embodiments of the invention may impose a predetermined upper bound on the frequency-proportion $h_n$, so that the step S854 cannot increase $h_n$ beyond that upper bound. In some embodiments, this upper bound may be approximately the value 1.

The step S854 may reduce the order of the shelving filter for the pair of frequency response indicators $(F_n, G_n)$ and $(F_{n+1}, G_{n+1})$ sufficiently to bring it down to the predetermined maximum order $O_{max}$. However, for embodiments that impose an upper bound on the frequency-proportion $h_n$, the step S854 may not reduce the order of the shelving filter sufficiently. Hence, the step S718 of the processing 700 in FIG. 7 may then be used to further reduce the order of the shelving filter.

As mentioned above, the frequency-proportions $h_k$ are initialised to a predetermined value at the step S714. If a frequency-proportion $h_k$ for a pair of frequency response indicators $(F_k, G_k)$ and $(F_{k+1}, G_{k+1})$ is small (i.e. much less than 1), then the shelving filter produced will have a correspondingly high order but with very little "corner-effect" (i.e. wobbles and curves in the frequency response) at and below the frequency $F_k$ and at and above the frequency $F_{k+1}$, since the corner frequencies $f_1$ and $f_2$ are moved significantly away from the frequencies $F_k$ and $F_{k+1}$. The frequency response of the shelving filter is thus very likely to have a gain of $G_k$ at and below frequency $F_k$ and a gain of $G_{k+1}$ at and above frequency $F_{k+1}$.

On the other hand, if a frequency-proportion $h_k$ for a pair of frequency response indicators $(F_k, G_k)$ and $(F_{k+1}, G_{k+1})$ is large (e.g. greater than 1), then the shelving filter produced will have a correspondingly lower order but with increased "corner-effect" (i.e. wobbles and curves in the frequency response) at and below the frequency $F_k$ and at and above the frequency $F_{k+1}$, since the corner frequencies $f_1$ and $f_2$ are moved towards, and then beyond, the frequencies $F_k$ and $F_{k+1}$. The frequency response of the shelving filter is thus less likely to have a gain of $G_k$ at and below frequency $F_k$ and a gain of $G_{k+1}$ at and above frequency $F_{k+1}$.

Thus, the choice of the predetermined value at which to initialise the frequency-proportions $h_k$ is a trade-off between the order of the shelving filter (and hence the amount of power, processing, hardware and delay involved) versus the degree of "corner-effect" around the frequencies $F_k$ and $F_{k+1}$ and the amount by which the frequency response of the shelving filter deviates from the desired gain of $G_k$ at and below frequency $F_k$ and the desired gain of $G_{k+1}$ at and above frequency $F_{k+1}$.

A value of $h_k$ in the range from about ⅓ to about ½ has been found to provide a good compromise, which provides a frequency response for the shelving filter with a relatively constant change of gain per octave between the frequency $F_k$ and the frequency $F_{k+1}$ (i.e. a straight line on the log-frequency vs gain frequency response plots), and with a relatively small amount of "corner effect" around the frequency $F_k$ and the frequency $F_{k+1}$. Thus, when several frequency response indicators are specified in a straight line on the log-frequency vs gain graph 301, the use of frequency-proportions in this range generate a frequency response curve 304 that is also substantially a straight line through these frequency response indicators.

Figure 11A:
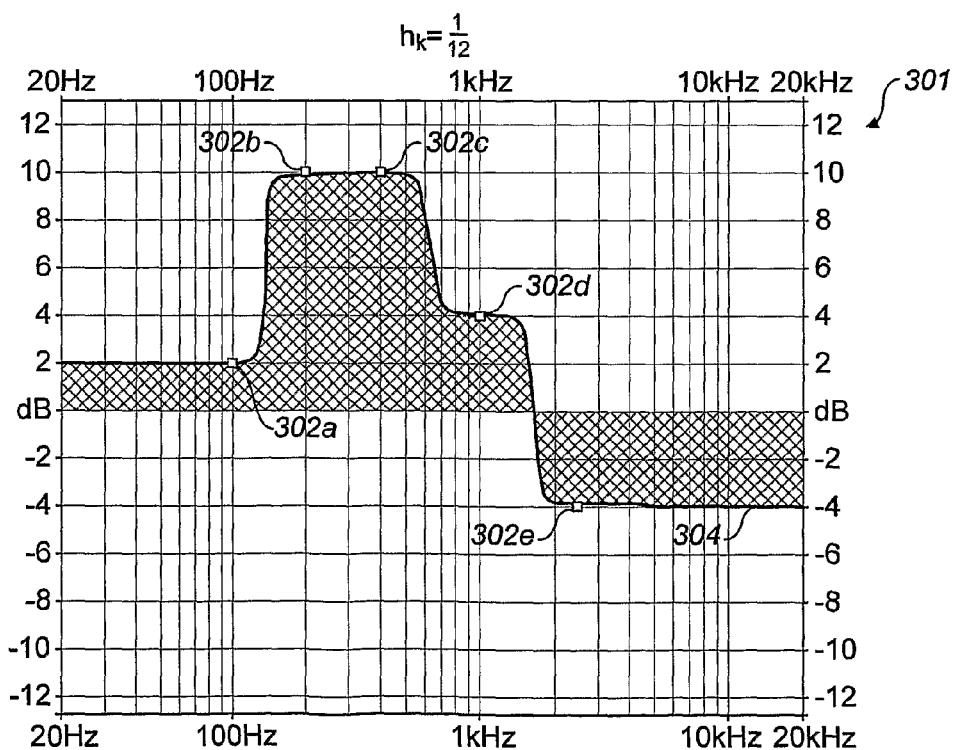
FIGS. 11a-i are example frequency response curves for the set filters generated during the processing of FIG. 7.

This is illustrated in FIGS. 11a-i, which are example graphs 301 of the frequency response curve 304 for a set filters generated during the processing 700 for a given set of frequency response indicators 302a-e. For FIGS. 11a-i, the values of $h_k$ are fixed (i.e. they are not adjusted at the step S716 of FIG. 7) and the target gains $T_k$ are adjusted at the step S718 of FIG. 7. In FIG. 11a, $h_k$ is fixed at ¹⁄₁₂; in FIG. 11b, $h_k$ is fixed at ⅙; in FIG. 11c, $h_k$ is fixed at ¼; in FIG. 11d, $h_k$ is fixed at ⅓; in FIG. 11e, $h_k$ is fixed at ½; in FIG. 11f, $h_k$ is fixed at ⅔; in FIG. 11g, $h_k$ is fixed at 1; in FIG. 11h, $h_k$ is fixed at 3/2; and in FIG. 11i, $h_k$ is fixed at 2.

The frequency response indicators 302b and 302c have the same associated gain, whilst the frequency response indicators 302c, 302d and 302e form a straight line on the graph 301.

Figure 11B:
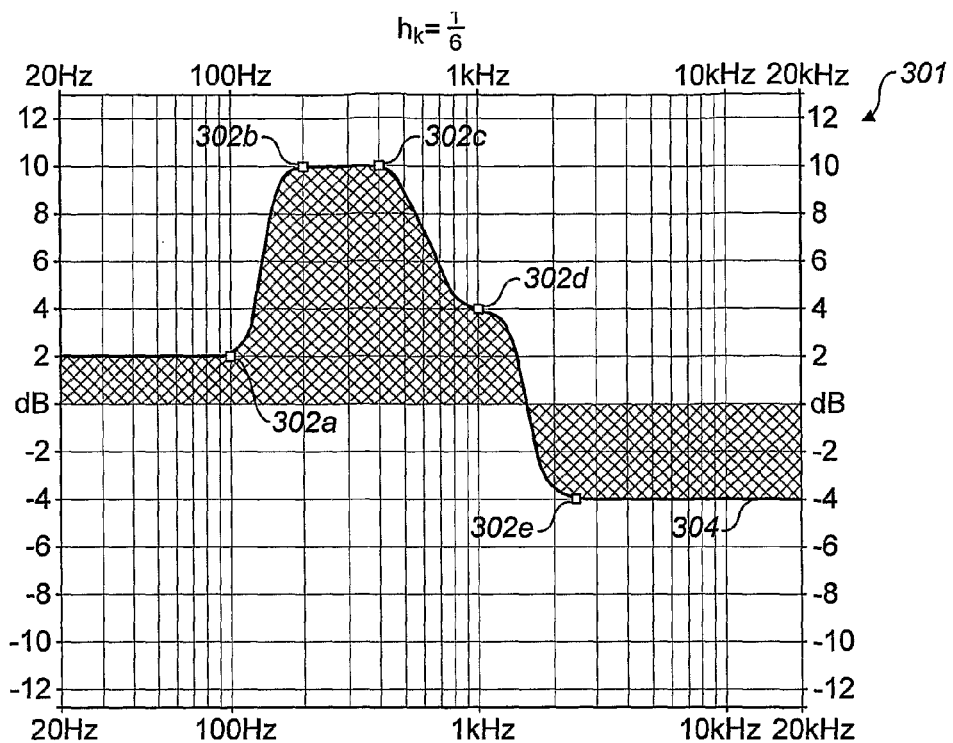
Figure 11C:
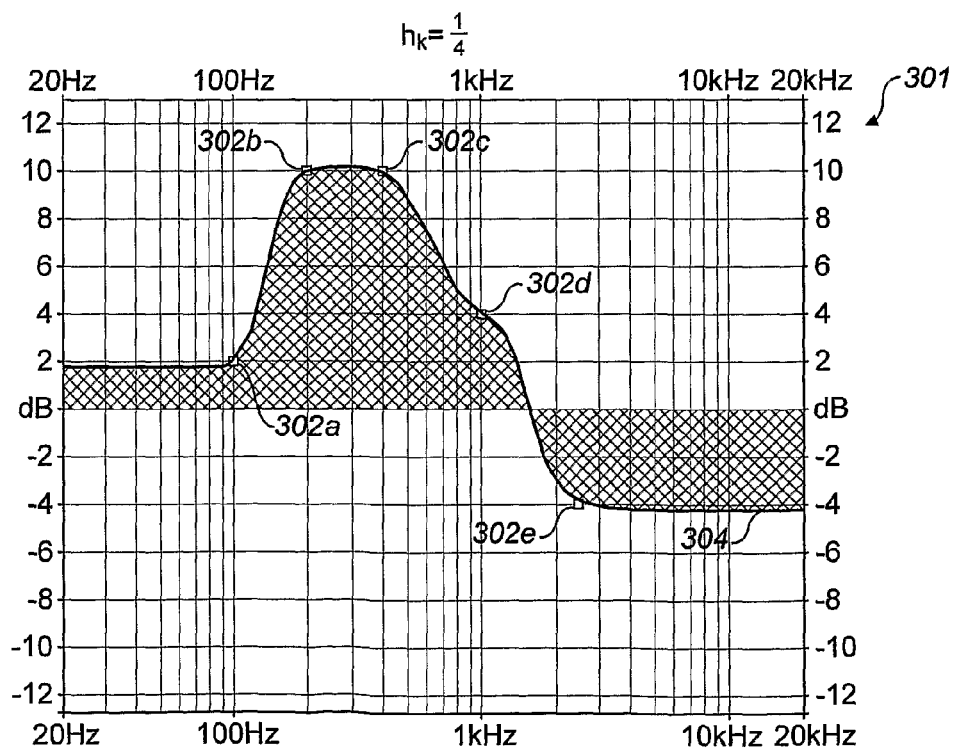
Figure 11D:
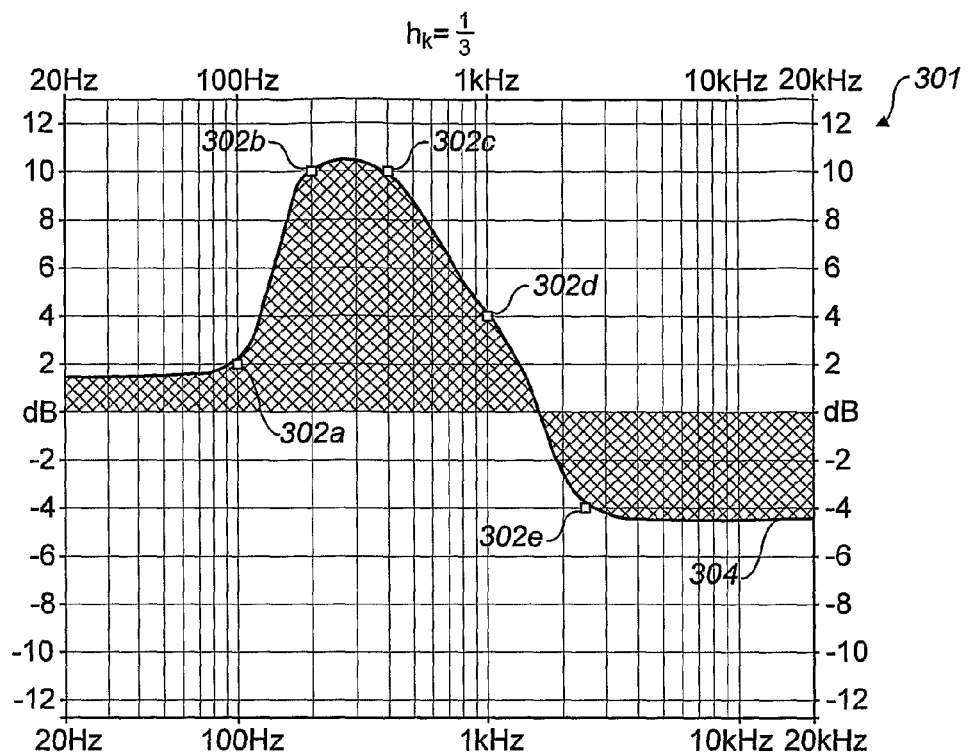
Figure 11E:
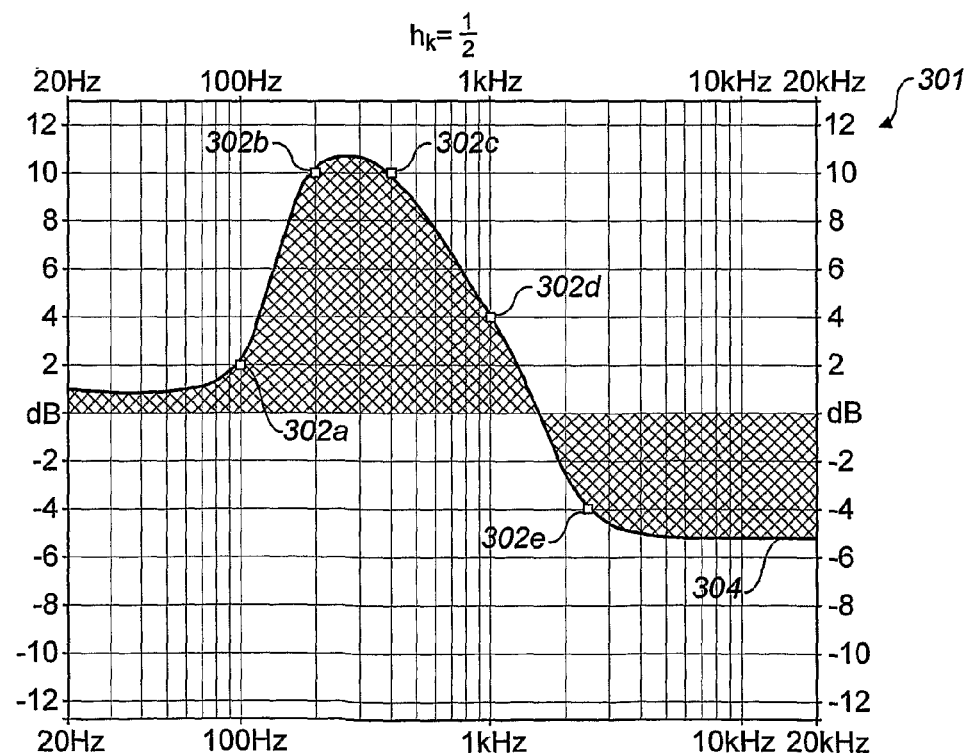
Figure 11F:
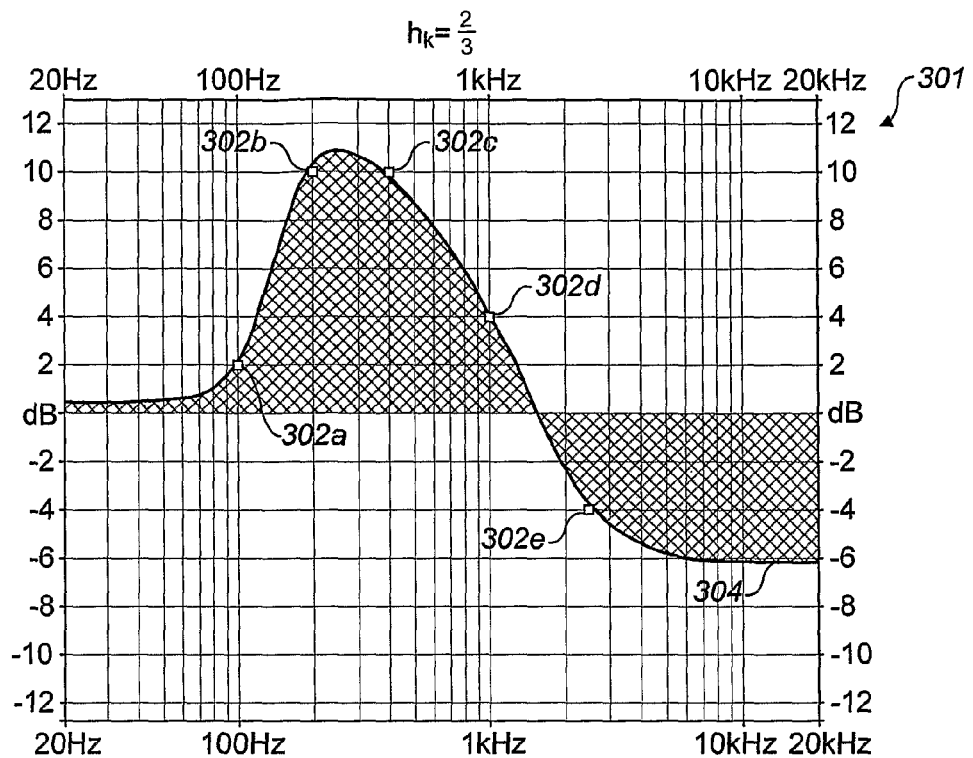
Figure 11G:
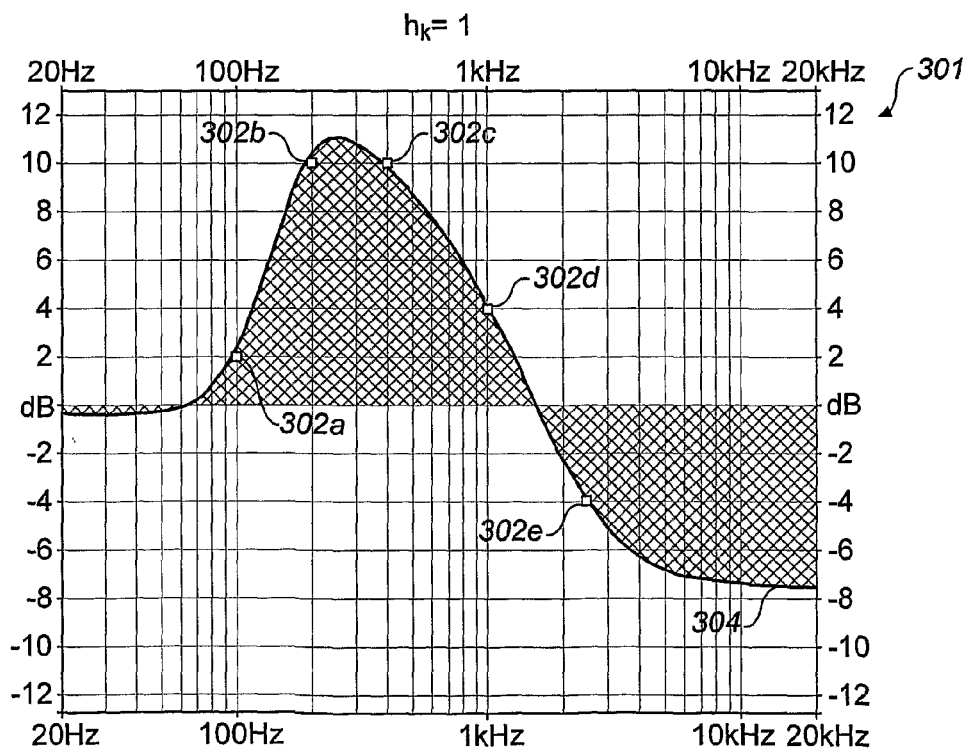
Figure 11H:
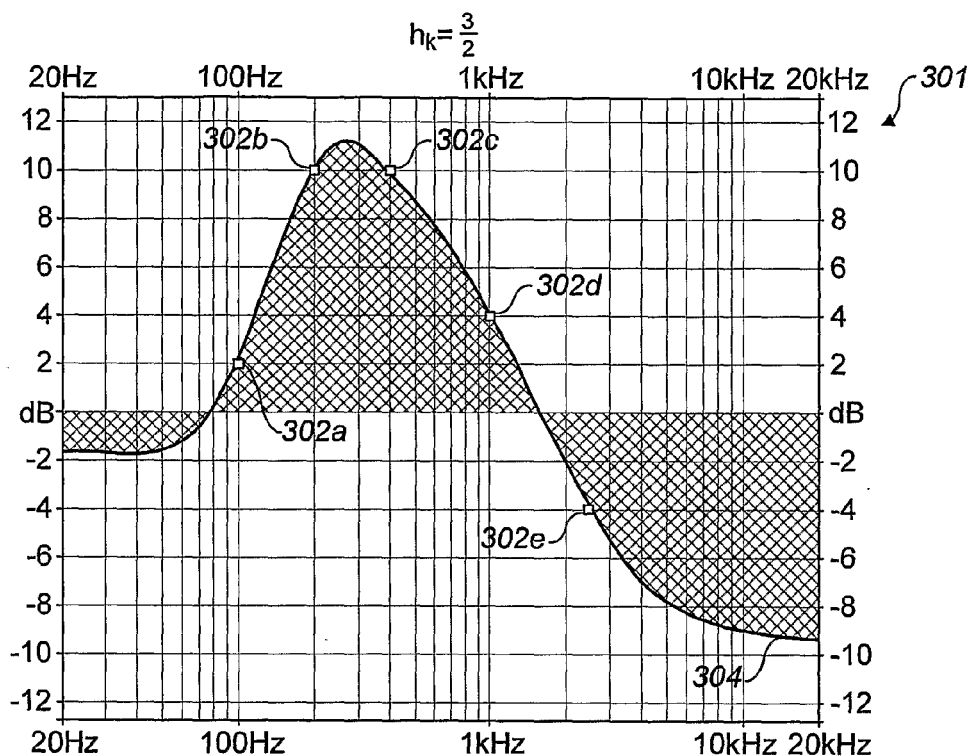
Figure 11I:
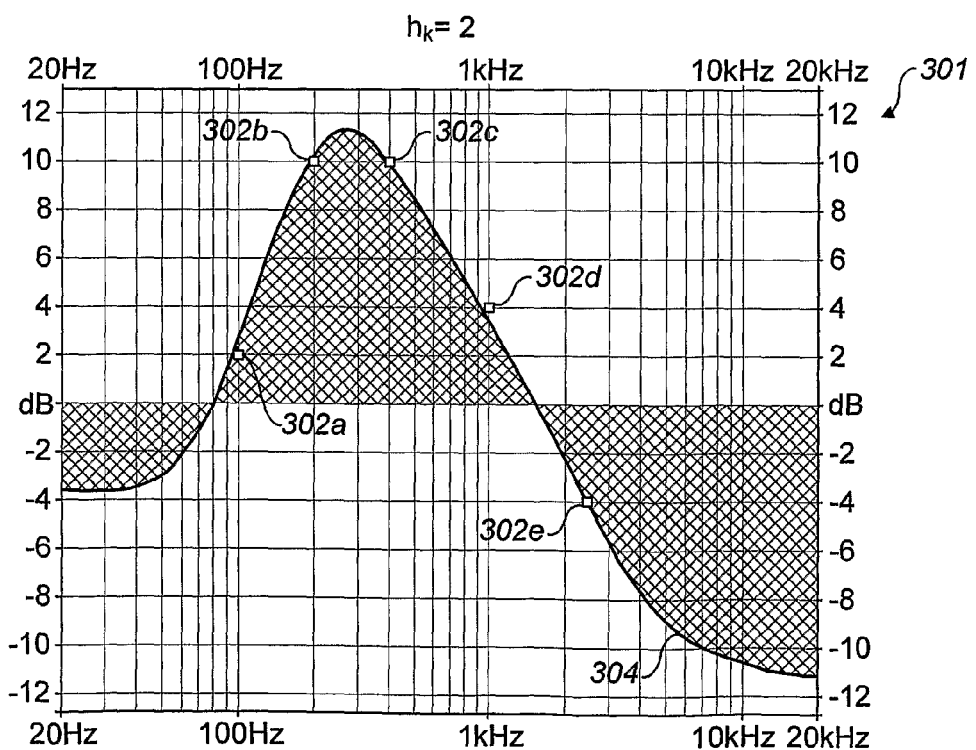

As can be seen:

for values of $h_k$ of 1/12, 1/6 and 1/4 in FIGS. 11a-c:
- the frequency response curve 304 between the lined-up frequency response indicators 302c, 302d and 302e is a stepped curve, rather than being the desired substantially straight line; and
- the frequency response curve 304 between the level frequency response indicators 302b and 302c is relatively flat.

for values of $h_k$ of ⅔, 1, 3/2 and 2 in FIGS. 11f-i:
- the frequency response curve 304 between the lined-up frequency response indicators 302c, 302d and 302e is a relatively straight line, as opposed to the stepped curve of FIGS. 11a-c;
- the frequency response curve 304 between the level frequency response indicators 302b and 302c is quite exaggerated;
- the frequency response at frequencies below the frequency of the left-most frequency response indicator 302a has a gain substantially different from the gain associated with that frequency response indicator 302a; and
- the frequency response at frequencies above the frequency of the right-most frequency response indicator 302e has a gain substantially different from the gain associated with that frequency response indicator 302e.

for values of $h_k$ of ⅓ and ½ in FIGS. 11d-e:
- the frequency response curve 304 between the lined-up frequency response indicators 302c, 302d and 302e is a relatively straight line, as opposed to the stepped curve of FIGS. 11a-c;
- the frequency response curve 304 between the level frequency response indicators 302b and 302c is relatively flat;
- the frequency response at frequencies below the frequency of the left-most frequency response indicator 302a has a gain substantially equal to the gain associated with that frequency response indicator 302a; and
- the frequency response at frequencies above the frequency of the right-most frequency response indicator 302e has a gain substantially equal to the gain associated with that frequency response indicator 302e.

For these reasons, the preferred value for initialising each frequency proportion $h_k$ at the step S714 lies in the range from about ⅓ to about ½.

The frequency-proportions $h_k$, the predetermined value at which to initialise the frequency-proportions $h_k$, and the upper-bound for $h_k$ (if used) may be set by a user through the GUI 300.

(6) Transitioning Between Filters

The set of filters that have been generated may be implemented in many ways, as is well-known in this field of technology. This implementation may involve implementing one or more of the filters in software or in hardware. For example, each shelving filter could be implemented by determining the coefficients for the linear difference equation for that filter (based on its zeros and poles and the desired gains) and then implementing that linear difference equation. Additionally, the whole set of shelving filters could be implemented by determining the coefficients for the linear difference equation for the combination of the shelving filters (based on all the zeros and poles and desired gains for all of the shelving filters) and then implementing that linear difference equation. However, preferred embodiments of the invention implement each shelving filter as a chain of 2nd-order filter sections (possibly with a single 1st-order filter section if the order of the shelving filter is odd), where each 2nd-order filter section is, in effect, a separate filter whose transfer function has, as its poles and zeros, a corresponding pair of complex-zeros and a corresponding pair of complex-poles from the transfer function of that shelving filter.

As mentioned above with reference to FIG. 2, once the set of frequency response indicators has been updated at the step S208 and a new set of shelving filters has been generated at the step S204, the processor 114 changes from processing audio data using the previous set of filters to processing the audio data using the updated set of filters.

In embodiments that implement the shelving filters using the corresponding linear difference equation, the transition from a previous shelving filter to a current shelving filter may be achieved over a period of time by interpolating from the coefficients of the linear difference equation for the previous shelving filter to the coefficients of the linear difference equation for the current shelving filter. Similarly, this may be performed in embodiments that implement the combination of the set of shelving filters by using the corresponding linear difference equation.

However, the preferred embodiments that implement a shelving filter using a chain of 2nd-order filter sections (possibly with a single 1st-order filter section if the order of the shelving filter is odd) may use a number of measures (described below) to help reduce the likelihood of introducing adverse audio noise as a result of this transition (i.e. to help maintain a high quality level for the processed audio). These measures described below. These measures are particularly suited to the shelving filters generated according to the above-described Method F.

We note first that the 2nd-order filter sections can be ordered in terms of distance of the zeros and poles from the unit circle 500. In this ordering the i-th 2nd-order filter section is formed from the zero (and its complex conjugate) that is the i-th closest zero to the unit circle 500 and the pole (and its complex conjugate) that is the i-th closest pole to the unit circle 500. Thus, referring to the example shown in FIG. 9, this ordering of the 2nd-order filter sections means that: (a) the 1st 2nd-order filter section is formed from the tuple ($z_s$, $\bar{z}_s$, $p_s$, $\bar{p}_s$); (b) the 2nd 2nd-order filter section is formed from the tuple ($z_{s-1}$, $\bar{z}_{s-1}$, $p_{s-1}$, $\bar{p}_{s-1}$); and (c) in general, the i-th 2nd-order filter section is formed from the tuple ($z_{s-1}$, $\bar{z}_{s-i+1}$, $p_{s-i+1}$, $\bar{p}_{s-i+1}$)

Embodiments of the invention may therefore use one or more of the following measures to help maintain a high quality level for the processed audio when the processing of the audio data transitions from using a previous shelving filter to an updated shelving filter:

(a) When the number of 2nd-order filter sections is the same for the previous shelving filter as the new shelving filter, then the i-th 2nd-order filter section for the new shelving filter inherits, or takes on, the current state-variables for the i-th 2nd-order filter section for the previous shelving filter. The state-variables for a 2nd-order filter section are the input values passed to the 2nd-order filter section and, as the 2nd-order filter section is an infinite impulse response filter, also the output values from the 2nd-order filter section. Thus, if the linear difference equation for the 2nd-order filter section is $y[n]=b_0 x[n]+b_1 x[n-1]+b_2 x[n-2]-a_1 y[n-2]$ for input samples $x[n]$ and output samples $y[n]$ and filter coefficients $b_i$ and $a_i$, then the state variables are the values $x[n]$, $x[n-1]$, $x[n-2]$, $y[n-1]$ and $y[n-2]$. This helps ensure that the most appropriate state-variables are passed between previous and new 2nd-order filter sections for the shelving filter.

(b) The 2nd-order filter sections for the new shelving filter are processed in the same order (based on the mapping in item (a) above) as the 2nd-order filter sections for the previous shelving filter.

Figure 13:
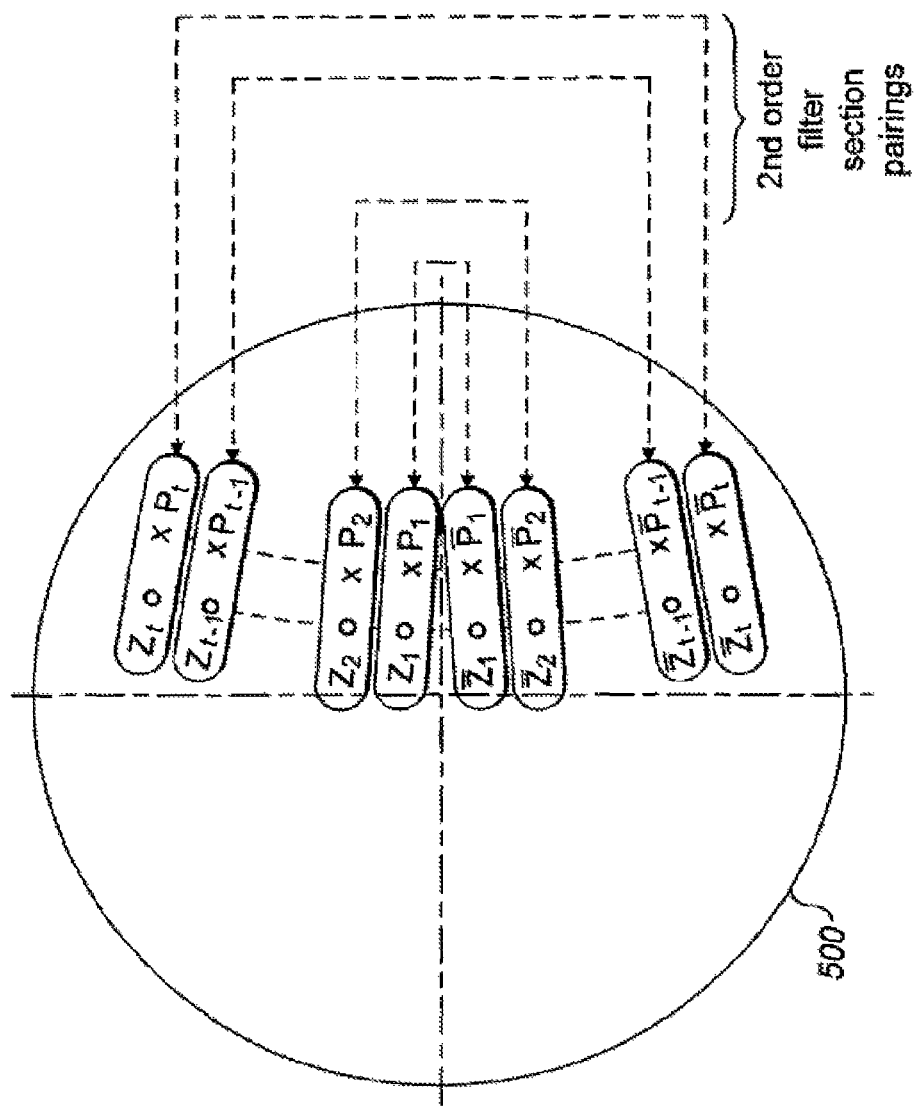
FIG. 13 schematically illustrates zeros $z_1 \ldots z_s$ and their complex conjugate zeros $\bar{z}_1 \ldots \bar{z}_s$ and poles $p_1 \ldots p_s$ and their complex conjugate poles $\bar{p}_1 \ldots \bar{p}_s$ for a shelving filter.

(c) When the number (s) of 2nd-order filter sections for the previous shelving filter is different from the number (t) of 2nd-order filter sections for the new shelving filter, (an example of such a new whelving filter is shown in FIG. 13 in an analogous way to FIG. 9), then the i-th 2nd-order filter section for the new shelving filter inherits the current state-variables for the i-th 2nd-order filter section for the previous shelving filter for i=1 . . . min(s, t). This helps ensure that the most appropriate state-variables are passed between previous and new 2nd-order filter sections. This also helps ensure that any added 2nd-order filter sections (when t>s) and any removed 2nd-order filter sections (when s>t) are formed from zeros and poles that are the furthest from the unit circle 500 and hence have the least audible effect and ability to generate unwanted audio effects/noise.

(d) In item (c) above, when t>s (i.e. when at least one new 2nd-order filter section is added), the state-variables at the new 2nd-order filter sections are initialised to 0 and the coefficients for the new 2nd-order filter sections are set to the required values (based on the poles and zeros associated with the new 2nd-order filter sections). The new shelving filter is then allowed to run for a period of time before the new 2nd-order filter sections are introduced and used, i.e. the new 2nd-order filter sections are initialised to have state-variables of 0, but then receive the audio samples for this period of time in order to establish their state-variables before being introduced (by crossfading) and actually used in the chain of 2nd-order filter sections for the shelving filter. This period of time may be around 0.01 to 0.2 seconds. Preferably, this period of time is 1024 samples for audio data sampled at 44.1 kHz.

Where the coefficients for the i-th 2nd-order filter section of the previous shelving filter are different from the coefficients for the i-th 2nd-order filter section of the current shelving filter, then the processor 114 updates the coefficients for this 2nd-order filter section over a period of time (such as around 0.01 seconds to 0.2 seconds) by interpolating the coefficients from the coefficients for the previous 2nd-order section to the coefficients for the new 2nd-order section. This, of course, does not apply to newly generated 2nd-order sections.

It will be appreciated that the above-mentioned techniques (a)-(e) may be applied to other types of filter too, and not just shelving filters, that are implemented using 2nd-order filter sections.

(7) Global Intensity Control

The GUI 300 may be provided with a global intensity control 322. With this control 322, the user may scale all of the gains $G_k$ for the frequency response indicators $(F_k, G_k)$ by a variable scale value $\beta$. The scale value $\beta$ may vary in a range from 0 to a predetermined maximum value $\beta_{max}$. Using this control 322, all of the gains $G_k$ are changed to become a gain value of $\beta G_k$, so that the gains $G_k$ are multiplied by this scale factor $\beta$. Setting $\beta=1$ sets all of the gains $G_k$ to be original user-specified gain. Setting $\beta<1$ reduces the overall intensity of the filtering, and setting $\beta=0$ sets all of the gains $G_k$ to be zero, so that no equalisation or filtering is performed at all. Setting $\beta>1$ increases the overall intensity of the filtering.

In this way, the user can easily control the amount of equalisation being applied, without having to adjust each of the frequency response indicators 302 individually.

It will be appreciated that, insofar as embodiments of the invention are implemented by a computer program, then a storage medium and a transmission medium carrying the computer program form aspects of the invention.

The invention claimed is:

1. A computer-implemented method of processing audio data using a desired shelving filter, the desired shelving filter having a low-corner frequency $f_1$ and a high-corner frequency $f_2$, wherein a difference between a gain of a frequency response of the desired shelving filter at the high-corner frequency $f_2$ and a gain of a frequency response of the desired shelving filter at the low-corner frequency $f_1$ is substantially equal to a non-zero desired amount, wherein a frequency response of the desired shelving filter between the low-corner frequency $f_1$ and the high-corner frequency $f_2$ is substantially monotonic, wherein the computer-implemented method is performed by a system comprising: one or more processing devices coupled to a memory device, to an audio input interface coupled, and to an audio output interface, wherein the audio input interface is coupled to an audio source and wherein the audio output interface is coupled to one or more speakers, the computer-implemented method comprising:

determining, via at least one of the one or more processing devices, and based on the desired shelving filter, an order p for a first shelving filter of a first predetermined type, wherein a low-corner frequency of the first shelving filter is equal to the low-corner frequency $f_1$ of the desired shelving filter and a high-corner frequency of the first shelving filter is equal to the high-corner frequency $f_2$ of the desired shelving filter, wherein a frequency response of the first shelving filter between the low-corner frequency $f_1$ of the first shelving filter and the high-corner frequency $f_2$ of the first shelving filter is substantially monotonic;

determining, via the at least one of the one or more processing devices, and based on the desired shelving filter, for a second shelving filter of a second predetermined type and of a predetermined order m, a frequency $f_3$ for a low-corner frequency of the second shelving filter and a frequency $f_4$ for a high-corner frequency of the second shelving filter, wherein a frequency response of the second shelving filter between the low-corner frequency $f_3$ of the second shelving filter and the high-corner frequency $f_4$ of the second shelving filter is substantially monotonic, where $f_3$ is at least $f_1$, $f_4$ is greater than $f_3$, and $f_4$ is at most $f_2$;

forming, via the at least one of the one or more processing devices, the desired shelving filter as a filter combination of the first shelving filter and the second shelving filter;

storing data of the formed desired shelving filter on the memory device;

receiving, using the audio input interface, audio data from the audio source;

processing, using the at least one of the one or more processing devices, the received audio data with the stored data of the formed desired shelving filter to form output audio data; and outputting, using the audio output interface, the output audio data to the one or more speakers, wherein $f_3$, $f_4$ and the order p of the first shelving filter are determined such that a difference between a gain of a frequency response of the filter combination at the $f_2$ and a gain of the frequency response of the filter combination at the $f_1$ is substantially equal to the non-zero desired amount.

2. The computer-implemented method according to claim 1, in which m=1.

3. The computer-implemented method according to claim 1, in which determining the order p of the first shelving filter comprises one of:
  determining the greatest order for the first shelving filter for which a magnitude of the non-zero desired amount is greater than a magnitude of the difference between the gain of the frequency response of the first shelving filter at $f_2$ and the gain of the frequency response of the first shelving filter at $f_1$; and
  determining the least order for the first shelving filter for which the magnitude of the non-zero desired amount is less than the magnitude of the difference between the gain of the frequency response of the first shelving filter at $f_2$ and the gain of the frequency response of the first shelving filter at $f_1$.

4. The computer-implemented method according to claim 1, in which determining the low corner frequency $f_3$ of and the high corner frequency $f_4$ of the second shelving filter comprises:
  setting $f_3$ and $f_4$ relative to each other such that the difference between a gain of a frequency response of the second shelving filter at $f_4$ and a gain of a frequency response of the second shelving filter at $f_3$ is substantially equal to a difference between the non-zero desired amount and the difference between the gain of the frequency response of the first shelving filter at $f_2$ and the gain of the frequency response of the first shelving filter at $f_1$.

5. The computer-implemented method according to claim 1 in which m=1; and
  either
  (i) the non-zero desired amount is positive;
    each zero of a transfer function of the first shelving filter is located at a respective location determined by interpolating between (a) a location of a corresponding pole of a transfer function of a first low-pass filter of a type corresponding to the first predetermined type and having a cut-off frequency equal to $f_1$ and an order of n−1 and (b) a location of a corresponding pole of a transfer function of a second low-pass filter of the type corresponding to the first predetermined type and having a cut-off frequency equal to $f_1$ and an order of n; and
    each pole of the transfer function of the first shelving filter is located at a respective location determined by interpolating between (c) a location of a corresponding pole of a transfer function of a third low-pass filter of the type corresponding to the first predetermined type and having a cut-off frequency equal to $f_2$ and an order of n−1 and (d) a location of a corresponding pole of a transfer function for a fourth low-pass filter of the type corresponding to the first predetermined type and having a cut-off frequency equal to $f_2$ and an order of n; or
  (ii) the non-zero desired amount is negative;
    each pole of the transfer function of the first shelving filter is located at a respective location determined by interpolating between (a) the location of the corresponding pole of the transfer function of the first low-pass filter of the type corresponding to the first predetermined type and having the cut-off frequency equal to $f_1$ and an order of n−1 and (b) the location of the corresponding pole of the transfer function of the second low-pass filter of the type corresponding to the first predetermined type and having the cut-off frequency equal to $f_1$ and the order of n; and each zero of the transfer function of the first shelving filter is located at a respective location determined by interpolating between (c) the location of the corresponding pole of the transfer function of the third low-pass filter of the type corresponding to the first predetermined type and having the cut-off frequency equal to $f_2$ and the order of n−1 and (d) the location of corresponding pole of the transfer function for the fourth low-pass filter of the type corresponding to the first predetermined type and having the cut-off frequency equal to $f_2$ and the order of n.

6. A method of changing from filtering audio data with a first audio filter to filtering the audio data with a second audio filter, performed by a processing device coupled to an audio source and to one or more speakers, in which a transfer function of the first audio filter comprises 2s complex-valued zeros and 2s complex-valued poles, and in which a transfer function of the second audio filter comprises 2t complex-valued zeros and 2t complex-valued poles, the method comprising:
  forming, via the processing device, the first audio filter using s second-order-filter-sections, in which, for each integer i in a range 1≤i≤s, an i-th second-order-filter-section is based on (a) a complex-valued zero of the transfer function of the first audio filter, wherein the complex-valued zero of the transfer function of the first audio filter and an associated complex conjugate zero form the i-th closest pair of complex-valued zero and associated complex conjugate zero of the transfer function of the first audio filter to a unit circle; and (b) a complex-valued pole of the transfer function of the first audio filter, wherein the complex-valued pole of the transfer function of the first audio filter and an associated complex conjugate pole form the i-th closest pair of complex-valued pole and associated complex conjugate pole of the transfer function of the first audio filter to the unit circle;
  a first step of processing at least a first part of the audio data via the processing device using the formed first audio filter to produce initial output audio data;
  outputting, using the processing device, the produced initial output audio data to the one or more speakers;
  forming, via the processing device, the second audio filter using t second-order-filter-sections, in which, for each integer j in a range 1≤j≤t, a j-th second-order-filter-section is based on (c) a complex-valued zero of the transfer function of the second audio filter, wherein the complex-valued zero of the transfer function of the second audio filter and an associated complex conjugate zero form the j-th closest pair of complex-valued zero and associated complex conjugate zero of the transfer function of the second audio filter to the unit circle; and (d) a complex-valued pole of the transfer function of the second audio filter, wherein the complex-valued pole of the transfer function of the second audio filter and an associated complex conjugate pole form the j-th closest pair of complex-valued pole and associated complex conjugate pole of the transfer function of the second audio filter to the unit circle;

for each integer k in a range 1≤k≤minimum (s,t), setting a value of a state-variable for a k-th second-order-filter-section of the second audio filter to be a value of a corresponding state-variable for a k-th second-order-filter-section of the first audio filter; and a second step of processing at least a second part of the audio data via the processing device using the formed second audio filter to produce subsequent output audio data, wherein said second processing step occurs after said first processing step has begun; and outputting, using the processing device, the produced subsequent output audio data to the one or more speakers.

7. A method of processing audio data, wherein the method is performed by a system comprising: a processing device coupled to an audio source and to one or more speakers, the method comprising:

receiving, using the processing device, the audio data from the audio source;

filtering the received audio data using the processing device by applying a first desired filter to the received audio data to produce output audio data;

outputting, using the processing device, the produced output audio data to the one or more speakers, wherein the first desired filter comprises a first desired shelving filter having a low-corner frequency $f_1$ and a high-corner frequency $f_2$, wherein a difference between a gain of a frequency response of the first desired shelving filter at the high-corner frequency $f_2$ and a gain of the frequency response of the first desired shelving filter at the low-corner frequency $f_1$ is substantially equal to a first non-zero desired amount, wherein the frequency response of the first desired shelving filter between the low-corner frequency $f_1$ and the high-corner frequency $f_2$ is substantially monotonic, the first desired shelving filter having been generated by:

determining an order for a first shelving filter of a first predetermined type, wherein a low-corner frequency of the first shelving filter is equal to the low-corner frequency $f_1$ of the first desired shelving filter and a high-corner frequency of the first shelving filter is equal to the high-corner frequency $f_2$ of the first desired shelving filter, wherein a frequency response of the first shelving filter between the low-corner frequency of the first shelving filter and the high-corner frequency of the first shelving filter is substantially monotonic;

determining, for a second shelving filter of a second predetermined type and of a predetermined order m, a frequency $f_3$ for a low-corner frequency of the second shelving filter and a frequency $f_4$ for a high-corner frequency of the second shelving filter, where the $f_3$ is at least $f_1$, the $f_4$ is greater than the $f_3$, and the $f_4$ is at most $f_2$, wherein a frequency response of the second shelving filter between the low-corner frequency $f_3$ of the second shelving filter and the high-corner frequency $f_4$ of the second shelving filter is substantially monotonic; and forming the first desired shelving filter as a first filter combination of the first shelving filter and the second shelving filter;

wherein the low-corner frequency $f_3$ of the second shelving filter, the high-corner frequency f4 of the second shelving filter, and the order of the first shelving filter are determined such that a difference between a gain of a frequency response of the first filter combination at the $f_2$ and a gain of the frequency response of the first filter combination at the $f_1$ is substantially equal to the first desired non-zero amount.

8. The method according to claim 7, comprising:

changing the filtering of the received audio data from applying the first desired filter to the received audio data to applying a second desired filter to the received audio data, the second desired filter comprising a second desired shelving filter having a low-corner frequency $f'_1$ and a high-corner frequency $f'_2$, wherein a difference between a gain of a frequency response of the second desired shelving filter at the high-corner frequency $f'_2$ and a gain of the frequency response of the second desired shelving filter at the low-corner frequency $f'_1$ is substantially equal to a second non-zero desired amount, wherein the frequency response of the second desired shelving filter between the low-corner frequency $f'_1$ and the high-corner frequency $f'_2$ is substantially monotonic, the second desired shelving filter having been generated by:

determining an order for a third shelving filter of a third predetermined type, wherein a low-corner frequency of the third shelving filter is $f'_1$ and a high-corner frequency of the third shelving filter is $f'_2$, wherein a frequency response of the third shelving filter between the low-corner frequency $f'_1$ of the third shelving filter and the high-corner frequency $f'_1$ of the third shelving filter is substantially monotonic;

determining, for a fourth shelving filter of a fourth predetermined type and of a predetermined order m', a frequency $f'_3$ for a low-corner frequency of the fourth shelving filter and a frequency $f'_4$ for a high-corner frequency of the fourth shelving filter, where $f'_3$ is at least $f'_1$, $f'_4$ is greater than $f'_3$, and $f'_4$ is at most $f'_2$, wherein a frequency response of the fourth shelving filter between the low-corner frequency $f'_3$ of the fourth shelving filter and the high-corner frequency $f'_4$ of the fourth shelving filter is substantially monotonic; and forming the second desired shelving filter as a second filter combination of the third shelving filter and the fourth shelving filter;

wherein the low-corner frequency $f'_3$ of the fourth shelving filter, the high-corner frequency $f'_4$ of the fourth shelving filter, and the order of the third shelving filter are determined such that a difference between a gain of a frequency response of the second filter combination at the $f'_2$ and a gain of the frequency response of the second filter combination at the $f'_1$ is substantially equal to the second desired non-zero amount.

9. A method of configuring a first processing device to process audio data, wherein the first processing device is coupled to a memory device, to an audio source and to one or more speakers, the method comprising:

generating, via a second processing device, a desired filter for the audio data; and configuring the first processing device to process the audio data using the generated desired filter by storing data defining the generated desired filter on the memory device, the first processing device arranged to receive the audio data from the audio source and to output the processed audio data to the one or more speakers;

wherein the generating of the desired filter for the audio data comprises generating a desired shelving filter for the audio data, the desired shelving filter having a low-corner frequency $f_1$ and a high-corner frequency $f_2$, wherein a difference between a gain of a frequency response of the desired shelving filter at the high-corner frequency $f_2$ and a gain of the frequency response of the desired shelving filter at the low-corner frequency $f_1$ is substantially equal to a non-zero desired amount, wherein the frequency response of the desired shelving filter between the low-corner frequency $f_1$ and the high-corner frequency $f_2$ is substantially monotonic, wherein generating the desired shelving filter comprises:

determining, based on the desired shelving filter, an order for a first shelving filter of a first predetermined type, wherein a low-corner frequency of the first shelving filter is equal to $f_1$ and a high-corner frequency of the first shelving filter is equal to $f_2$, wherein a frequency response of the first shelving filter between the low-corner frequency $f_1$ of the first shelving filter and the high-corner frequency $f_2$ of the first shelving filter is substantially monotonic;

determining, based on the desired shelving filter, for a second shelving filter of a second predetermined type and of a predetermined order m, a frequency $f_3$ for the low-corner frequency of the second shelving filter and a frequency $f_4$ for the high-corner frequency of the second shelving filter, where $f_3$ is at least $f_1$, $f_4$ is greater than $f_3$, and $f_4$ is at most $f_2$, wherein a frequency response of the second shelving filter between the low-corner frequency $f_3$ of the second shelving filter and the high-corner frequency $f_4$ of the second shelving filter is substantially monotonic;

forming the desired shelving filter as a filter combination of the first shelving filter and the second shelving filter;

wherein the low-corner frequency $f_3$ of the second shelving filter, the high-corner frequency $f_4$ of the second shelving filter, and the order of the first shelving filter are determined such that a difference between a gain of the frequency response of the filter combination at the $f_2$ and a gain of the frequency response of the filter combination at $f_1$ is substantially equal to the non-zero desired amount.

10. The method of claim 9, wherein the second processing device is the first processing device.

11. An apparatus comprising;

one or more processing devices coupled to a memory device, at least one of the one or more processing devices arranged to carry out a method of generating a desired shelving filter for audio data; an audio input interface; and an audio output interface; the desired shelving filter having a low-corner frequency $f_1$ and a high-corner frequency $f_2$, wherein a difference between a gain of a frequency response of the desired shelving filter at the high-corner frequency $f_2$ and a gain of the frequency response of the desired shelving filter at the low-corner frequency $f_1$ is substantially equal to a non-zero desired amount, wherein the frequency response of the desired shelving filter between the low-corner frequency $f_1$ and the high-corner frequency $f_2$ is substantially monotonic, the method comprising:

determining, via the at least one of the one or more processing devices, and based on the desired shelving filter, an order for a first shelving filter of a first predetermined type, wherein a low-corner frequency of the first shelving filter is equal to the low-corner frequency $f_1$ of the desired shelving filter and a high-corner frequency of the first shelving filter is equal to the high-corner frequency of the desired shelving filter $f_2$, wherein a frequency response of the first shelving filter between the low-corner frequency $f_1$ of the first shelving filter and the high-corner frequency $f_2$ of the first shelving filter is substantially monotonic;

determining, via the at least one of the one or more processing devices, and based on the desired shelving filter, for a second shelving filter of a second predetermined type and of a predetermined order m, a frequency $f_3$ for a low-corner frequency of the second shelving filter and a frequency $f_4$ for a high-corner frequency of the second shelving filter, where the $f_3$ is at least $f_1$, the $f_4$ is greater than the $f_3$, and the $f_4$ is at most $f_2$, wherein a frequency response of the second shelving filter between the low-corner frequency $f_3$ of the second shelving filter and the high-corner frequency $f_4$ of the second shelving filter is substantially monotonic;

forming, via the at least one of the one or more processing devices, the desired shelving filter as a filter combination of the first shelving filter and the second shelving filter;

wherein the low-corner frequency $f_3$ of the second shelving filter, the high-corner frequency $f_4$ of the second shelving filter, and the order of the first shelving filter are determined such that the difference between a gain of a frequency response of the filter combination at the $f_2$ and a gain of the frequency response of the filter combination at the $f_1$ is substantially equal to the non-zero desired amount; and storing data of the formed desired shelving filter on the memory device, wherein the audio input interface is arranged to receive the audio data from an audio source;

wherein at least one of the one or more processing devices is arranged to process the received audio data with the stored data of the formed desired shelving filter to form output audio data; and wherein the audio output interface is arranged to output the formed output audio data to one or more speakers.

\* \* \* \* \*